United States Patent
Nagaura

(10) Patent No.: US 6,952,074 B2
(45) Date of Patent: Oct. 4, 2005

(54) PIEZOELECTRIC DEVICE AND ACOUSTO-ELECTRIC TRANSDUCER AND METHOD FOR MANUFACTURING THE SAME

(75) Inventor: Yoshiaki Nagaura, 4-32-104, Yumachi 3-chome, Chikushino-shi, Fukuoka 818-0041 (JP)

(73) Assignees: Yoshiaki Nagaura, Fukuoka (JP); Kumiko Nagaura, Fukuoka (JP); Zenichiro Nagaura, Fukuoka (JP)

( * ) Notice: Subject to any disclaimer, the term of this patent is extended or adjusted under 35 U.S.C. 154(b) by 0 days.

(21) Appl. No.: 10/333,130
(22) PCT Filed: Jul. 16, 2001
(86) PCT No.: PCT/JP01/06128
§ 371 (c)(1),
(2), (4) Date: Jan. 16, 2003
(87) PCT Pub. No.: WO02/07234
PCT Pub. Date: Jan. 24, 2002

(65) Prior Publication Data
US 2003/0132811 A1 Jul. 17, 2003

(30) Foreign Application Priority Data

| Jul. 17, 2000 | (JP) | 2000-251675 |
| Feb. 19, 2001 | (JP) | 2001-091394 |
| Jun. 5, 2001 | (JP) | 2001-209997 |

(51) Int. Cl.$^7$ ............................................. H01L 41/08
(52) U.S. Cl. ................................... 310/361; 310/369
(58) Field of Search ................... 310/360, 367, 310/368, 369

(56) References Cited

U.S. PATENT DOCUMENTS

| 2,161,980 A | * | 6/1939 | Runge .................... 310/348 |
| 3,617,780 A | * | 11/1971 | Benjaminson et al. ...... 310/344 |
| 3,694,677 A | * | 9/1972 | Guttwein et al. ............ 310/369 |
| 3,968,680 A | * | 7/1976 | Vopilkin et al. .............. 73/602 |
| 4,870,313 A | * | 9/1989 | Hirama et al. ............... 310/320 |
| 5,218,328 A | * | 6/1993 | Morita et al. ................ 333/187 |
| 6,191,524 B1 | * | 2/2001 | Sasaki et al. ................ 310/367 |

FOREIGN PATENT DOCUMENTS

| JP | 48-34494 | 5/1973 |
| JP | 48-83753 | 11/1973 |
| JP | 53-71595 | 6/1978 |
| JP | 60-170312 | 9/1985 |
| JP | 2000-317782 | 11/2000 |

* cited by examiner

Primary Examiner—Mark Budd
(74) Attorney, Agent, or Firm—Wenderoth, Lind & Ponack, L.L.P.

(57) ABSTRACT

A lens shape piezoelectric device which is thinner than the manufacture limit thickness, which is conventionally difficult to manufacture, and a method for manufacturing the same. The piezoelectric device has a oscillation part having at least two steps where one side thereof is planar and the opposite side is thickest at a peripheral holding portion and thinner toward the central portion. A piezoelectric element of another embodiment has an oscillation part of at least two steps where the peripheral holding portion is thickest on both sides and the thickness decreases toward the central portion. In these piezoelectric devices, at least one side of the thinnest central portion of the oscillation part has a convex lens shape. A pair of electrodes are vacuum deposited in the center of these oscillation parts on both sides, and a gold wire is led as a lead wire from each electrode.

6 Claims, 88 Drawing Sheets

(a)

(b)

(a)

(b)

(a)

(b)

(a)

(b)

(a) (b)

(a) (b) (c)

(d) (e)

(a)

(b)

(a)

(b)

(c)

(a)

(b)

(c)

(a)

(b)

(c)

PIEZOELECTRIC DEVICE AND ACOUSTO-ELECTRIC TRANSDUCER AND METHOD FOR MANUFACTURING THE SAME

BACKGROUND OF THE INVENTION

1. Technical Field

This invention is related to a piezoelectric device and an acousto-electric transducer, and the method for manufacturing the same, which enables the characteristic frequency to be extremely higher.

2. Description of Related Art

Quartz oscillators (resonators), as one of piezoelectric devices, are used for a wide variety of application fields such as fundamental frequency generators of communication apparatus and sensing instrumentation and clock sources of general computers, office automation information equipment, home appliances, and so forth. It has been required for those characteristic frequencies to be higher by decreasing the thickness of their oscillators (resonators) in order to achieve the high performance of the information processing and transfer capabilities. Also the lens-line type finishing was proposed to produce higher quality oscillators (resonators), and these performances were accomplished for those relatively lower frequency domains.

Quartz oscillators are the essential electronic devices for digital machines such as communication equipment, computers, and so forth. It is demanded for those oscillators to increase the primary oscillation frequency by decreasing the thickness in order to achieve the high performance of the information processing and transfer abilities. Especially for mobile communication, the fundamental frequency is required to be higher for the small sizing and power saving management.

Quartz oscillators have been generally manufactured by the mechanical polishing and chemical wet etching processes. The former polishing shows the fine surface finish, however it cannot machine in lower than 30 $\mu$m. The latter etching has the advantage of decreasing deteriorated surface in principle, but it has the limitation of thickness due to the etching channel generation and so forth. On the other hand, the reactive ion etching (RIE), inductive coupled plasma etching (ICP) or plasma-etching process (abbreviated as chemical dry etching) makes the damaged surface layer, however the dry etching allows the device to be thin without the inconvenient surface roughness.

The novel mass-productive manufacturing method of high frequency quartz oscillator is developed, by combining efficiently the advantages of these processes. However the problem of reducing the thickness of those oscillators (resonators) by the dual-face polishing method (dual-face polishing machine) is presently incapable reducing the thickness to less than 30.0 $\mu$m (=55.6 MHz).

Furthermore, when oscillators were finishing in lens shape, it was extremely difficult to make the curved surface on the thin plate, and there existed no machining method of mass production with low cost.

SUMMARY OF THE INVENTION

Thereafter the present invention was developed to solve these problems, and shall make possible the manufacture the lens shape piezoelectric device, which is thinner than the thickness limitation in the conventional method.

In order to solve previously mentioned problems, the piezoelectric device of present invention has one flat surface, and the other side has the thickest peripheral holding portion and a central oscillation part connected by at least two steps, which one side is decreasing the thickness toward the central region. Also another type of piezoelectric device has the thickest peripheral holding portion and the central oscillation part at least with two steps, and both sides are decreasing in thickness toward the central region.

The oscillating part at the thinnest center of piezoelectric device is in convex lens shape at least for the one surface.

Furthermore the present invention enables the piezoelectric device to be manufactured to make the first oscillating part to be seen toward the crystal orientation of the piezoelectric material at the central part of a nearly rectangular quartz blank, and afterward to make the second oscillating part so as not to be seen toward the crystal orientation of the piezoelectric material.

Furthermore, an acousto-electric transducer of the present invention is manufactured so as to make the final shape profile at both end surfaces of piezoelectric rod, and to make the end surface of above stick as homogeneously and relatively decreasing the thickness toward the central direction of the rod in the similar geometric shape by a dry etching process such as RIE, without machining the outer wall thickness of the rod. Then the oscillating part at the inner central region of the cylindrical rod is made the oscillation device with the final thickness and profile.

A pair of electrodes is vacuum deposited in the center of these vibrating parts on both sides, and a gold wire is led as a lead wire from each electrode.

DETAILED DESCRIPTION OF THE INVENTION

Figure 1:
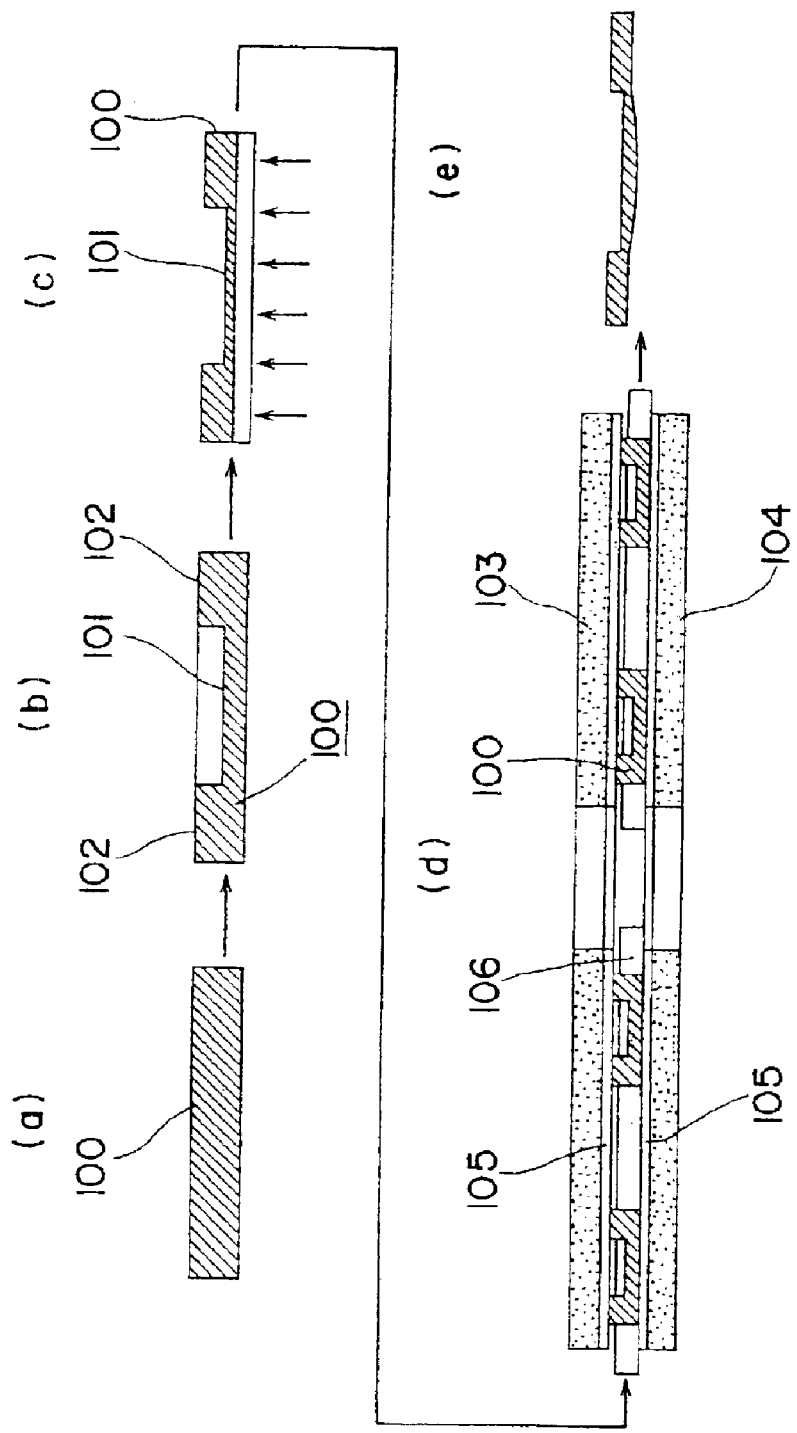
FIG. 1 illustrates the flow chart of manufacturing process for the present invention.

FIG. 1 shows a manufacturing method for the present invention. At first the quartz blank 100 (FIG. 1(*a*)) is cut to 50 $\mu$m from artificial quartz, then a part of one side (upper surface) is solved by etching with hydrogen fluoride, and a concave groove 101 is made (FIG. 1(*b*)). The oscillation part is generated by the thin layer between this pit 101 and the lower surface of quartz blank 100, the remaining part becomes the frame 102, which is attached by electrodes. These are same as the conventional manufacturing methods.

As the next step, the whole lower surface is processed by a dry etching as ion etching (hereafter ion etching process) with hydrogen fluoride, and the quartz blank 100 becomes thinner FIG. 1(*c*). This ion etching process is to sputter silicone atoms in silicone dioxide at the surface of quartz blank 100, when the electric voltage is impressed to fluorine atoms and accelerate ions after the molecular bondages are cut in the plasma state.

As mentioned previously, it is not possible for the sole chemical wet etching to decrease the thickness thinner than 20 $\mu$m. Afterwards the ion etching process will decrease the thickness down to approximately 10.3 $\mu$m.

The target thickness is 10 $\mu$m. However, the ion etching process alone will not achieve the target thickness. The ion etching can decrease the thickness, however this has the disadvantage of forming an ion-damaged layer, which is unknown defect with non-crystalline component at the mono-crystalline surface, since the ion etching process uses atomic collisions. The thickness of the layer is approximately 0.2–0.3 $\mu$m.

Therefore we employed the mechanical polishing. The dual face polishing machine does the job to polish the final processing (FIG. 1(*d*)), and it machines the blank down to 10.3 $\mu$m with the surface layer 0.3 $\mu$m. The dual face polishing machine structure is similar to a planet gear. At first the quartz plate 100 is set to the steel carrier 106, which corresponds to the planet gear and rotates with axis-rotation at the same time, and the blank 100 is sandwiched between the lower fixed table 104 and the upper table 103. Both fixed tables are patched by foamed poly-urethane polishing pad 105.

Thereafter, cerium oxide whetstone powder is streaming with water, the quartz blank 100 held by carrier 106 rotates around its own axis between the lower and upper tables 103, 104, also the upper table 103 rotates, and then the quartz 100 can be polished.

As shown in FIG. 1(*e*), the lower surface of quartz blank 100 becomes curved in convex lens shape. This lens shape is known to be efficient in generating more steady oscillation, since spurious oscillation (secondary vibration) as the erroneous reaction for electronics does not appear.

Figure 2:
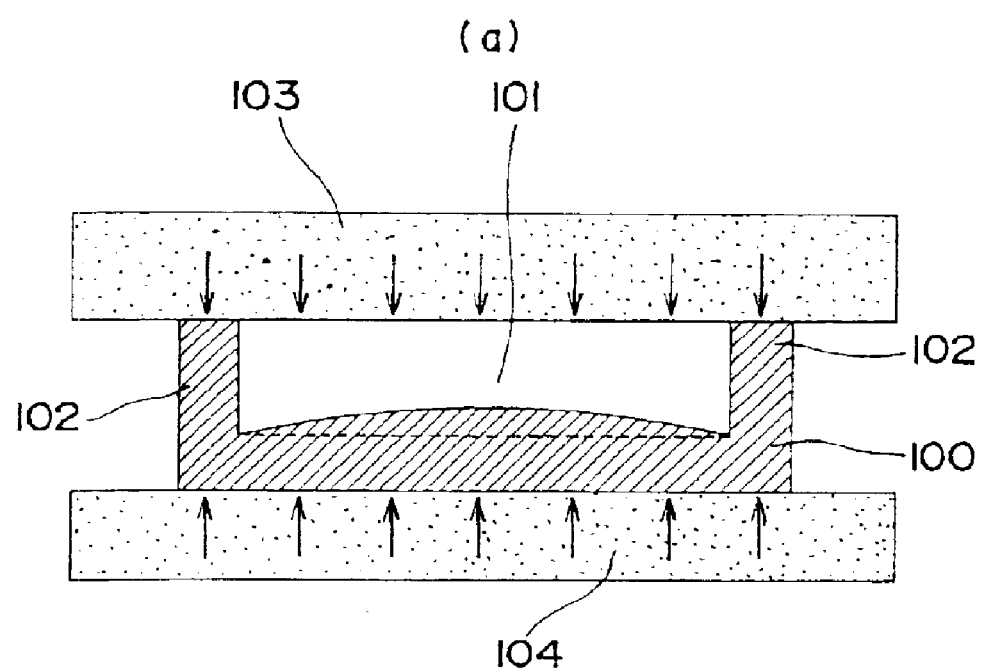
FIG. 2 illustrates the design diagram of forming the convex lens shape of piezoelectric device for the present invention.
Figure 2:

FIG. 2 will show how the convex lens shape of the blank is formed.

The polished quantity is proportional to the polishing pressure. The frame 102 of concave quartz blank 100 after the ion etching is strongly pressurized to be polished between the upper table 103 and lower table 104, and the grooved part for oscillation is slightly impressed only by the lower table 104. Furthermore the polishing force at the central region of the concaved structure part 101 is weaker (FIG. 2(*a*)). Therefore the polished mass is at minimum at the center of the concave part 101, it becomes maximum at the frame part 102, and the polished quantity among these parts changes with a curvature like a part of a sphere. As a consequence, the quartz oscillator was finished in the convex lens shape (FIG. 2(*b*)). The thickest central part of the lens is as thin as 10 $\mu$m.

As understood from the above, the dual polishing machine cuts only 0.3 $\mu$m. This small amount of polishing enables the damaged layer to be removed and shaped in a convex lens shape. In other words, the chemical etching and dry etching process corresponds to the coarse machining, and the dual face polishing processing corresponds to the fine machining.

The combination of these polishing processes in this invention makes the piezoelectric device thinner than the conventional one, and also the oscillation part in a convex lens shape makes it steady in electric vibration without the spurious one.

This invention presents the manufacturing method of a high frequency quartz oscillator with an efficient combination of chemical wet etching (abbreviated as chemical etching), reactive ion etching (RIE), inductive coupled plasma etching (dry etching) and mechanical polishing. As a result, we could manufacture the high frequency quartz oscillator in a plano-convex type with a general dual face polishing machine, when the quartz blank was in one step single-sided inverted mesa type.

Figure 3:
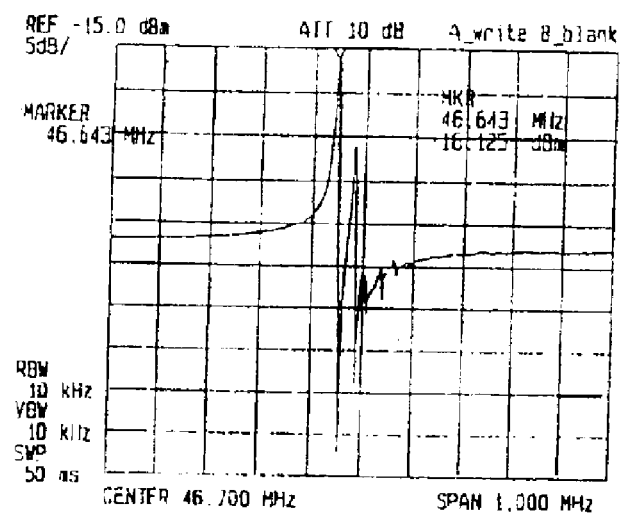
FIG. 3 illustrates a characteristic diagram of reactance-frequency for the thick quartz resonator which blank is AT-cut.
Figure 3:
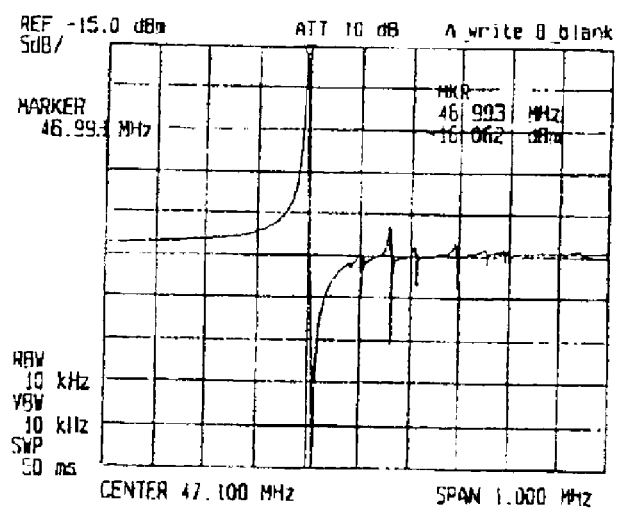

FIG. 3(*a*) illustrates a reactance-frequency characteristic example of quartz oscillator, which is made by RIE and ion milling (or plasma etching). There exists the spurious peak near the primary peak at the resonance frequency. This is thought to be due to the ion damage of the dry etching process. After the dry etched surface was manually polished, the spurious peaks were removed as shown in FIG. 3(*b*), the electric property was improved. Therefore the ion-damaged layer of the dry etching process was found to be extremely thin as 0.3 $\mu$m, and this could be removed by the mechanical polishing process.

Figure 4:
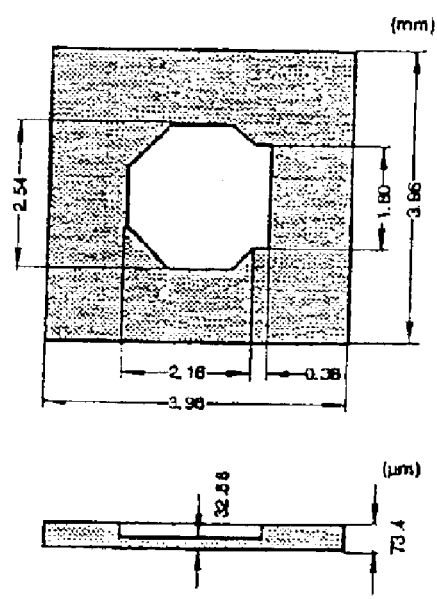
FIG. 4 illustrates a characteristic oscillation diagram of reactance-frequency for the thick quartz resonator which blank is AT-cut, and the plane and longitude diagrams of single-sided inverted mesa type quartz resonator with one step.
Figure 4:
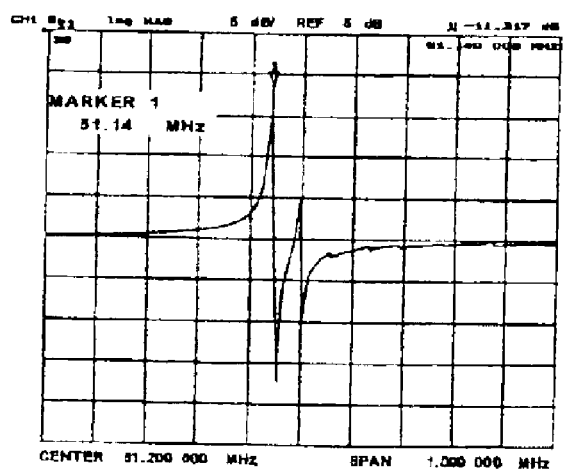

In order to mass-produce quartz blanks in one step single sided inverse mesa type by chemical etching, quartz wafers were masked and chemically etched. The shape is shown in FIG. 4(*a*). The oscillating part of a 73.4 $\mu$m thick quartz wafer was chemically etched down to 32.68 $\mu$m, and the depth of the etched pit was sufficiently deep with acceptable surface roughness.

A reactance-frequency property of this quartz blank is seen in FIG. 4(*b*). This is similar to that of the dry etching process as shown in FIG. 3(*a*).

Figure 5:
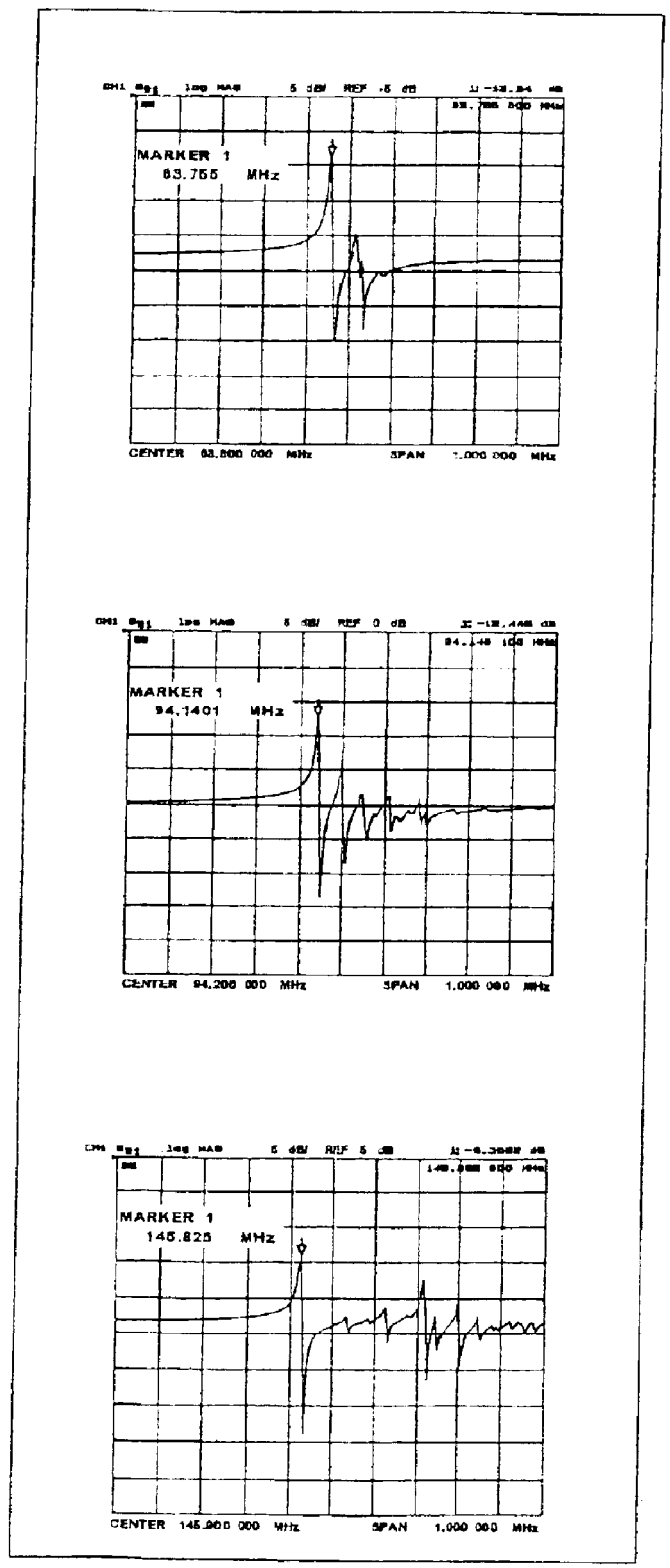
FIG. 5 illustrates a characteristic diagram of reactance-frequency for the thin quartz resonator which blank is AT-cut.

In order to achieve higher frequency, the dry etching process of the mechanical polishing process with the dual face polishing machine was employed to decrease the thickness. Here before the ion-damaged layer must be removed, the surface side of dry etching was selected to be the planar surface of quartz blank in single-sided inverse mesa type. This RIE processing condition was the standard one. It is possible for the ion damage to be decreased by small RF power and high pressure. However this means a slower ion etching rate, and the first dry etching was performed in the high efficient mode, and the third one was performed in the low damage condition. By the way, the removed mass was controlled by the processing time of the first dry etching process. FIG. 5 shows the reactance-frequency of the machined blank after the series of above processing. After performing these processes, four machined blanks were produced by one chemical etching and three dry etchings.

Figure 6:
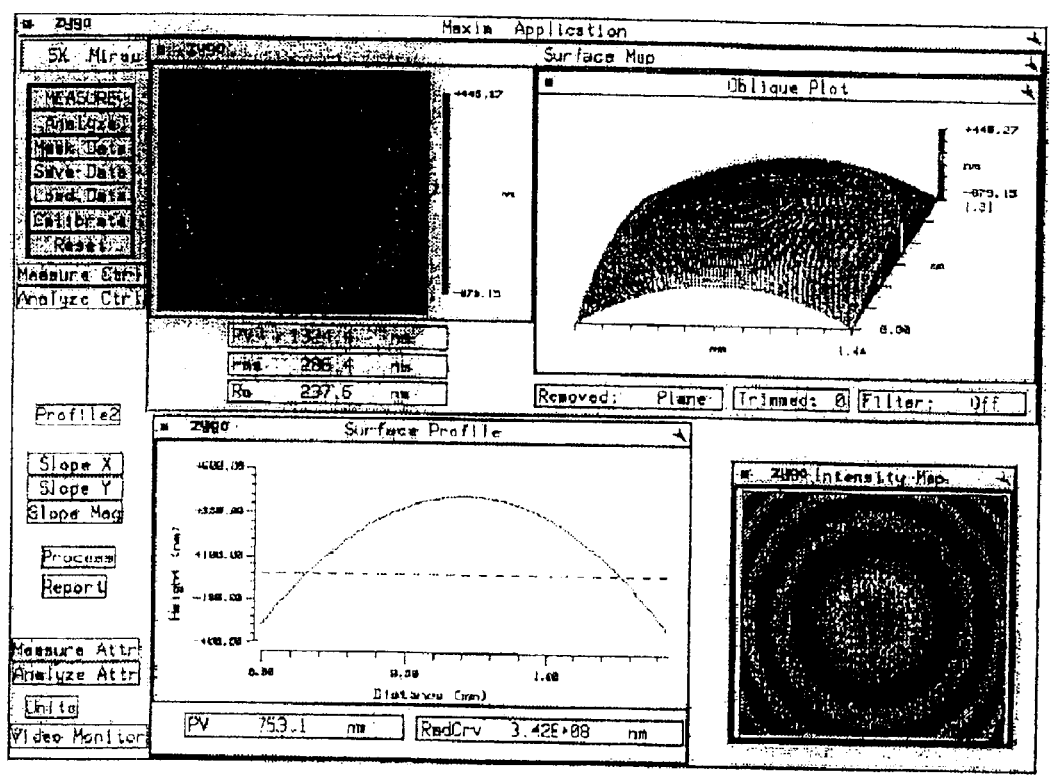
FIG. 6 illustrates a measurement diagram of quartz resonator shape by an interference microscope.

FIG. 6 shows the polishing condition and the mechanical polishing result. The quartz blank in a single-sided inverse mesa type with one step after the previous process was polished by the dual-face polishing machine. In this case, it was polished by the conventional processing condition. However two upper polishing plates were made from iron and aluminum to study the damage to the thin oscillation part and the effect of the shape. When the upper polishing plate is made from iron, the pressure to quartz is 1.8 times stronger than aluminum.

When the mechanical polishing was executed with the dual face polishing machine, the blank could be machined without any fear of the first problem of breaking the thin oscillation part. The second target of forming the shape was successfully accomplished as shown in FIG. 6. This FIG. 6 illustrates the measured result of the shape when the inference microscope was used to observe the flat surface of the quartz oscillation part in the single-sided inverse mesa type with one step. Then the oscillation part was found to be protruding in a convex lens shape. This shape is apparently spherical, and the opposite side is basically planar. Therefore, although the dual face polishing machine is designed to form a planar surface, this machine can make the single-sided convex quartz oscillator, when the polished material is a quartz blank of the single-sided inverse mesa type.

The principle of this shaping mechanism is seen as follows. When the quartz blank in one step single-sided inverse mesa type with thin oscillation part is impressed with the polishing pressure, the thin part is distorted toward the cavity direction and this part cannot be substantially polished. After the polishing process is finished and the polishing pressure is relieved, the thin part (which is distorted toward the pit) rebounds to the opposite side, and this shape becomes the protruded lens shape.

Figure 7:
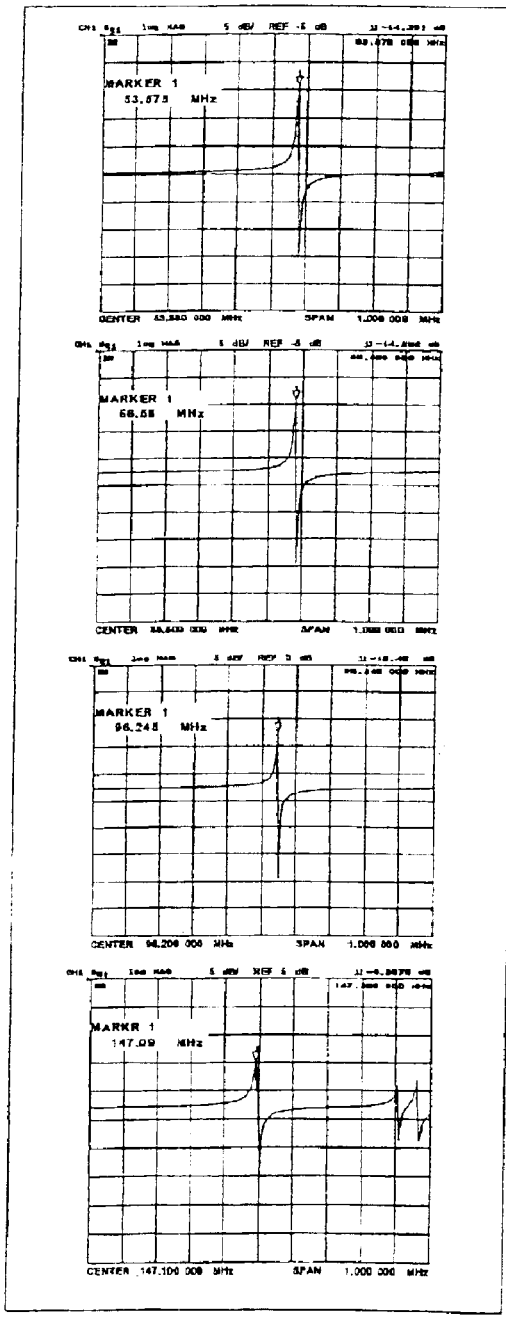
FIG. 7 illustrates a characteristic diagram of reactance-frequency for the thin quartz resonator which blank is AT-cut.
Figure 7:
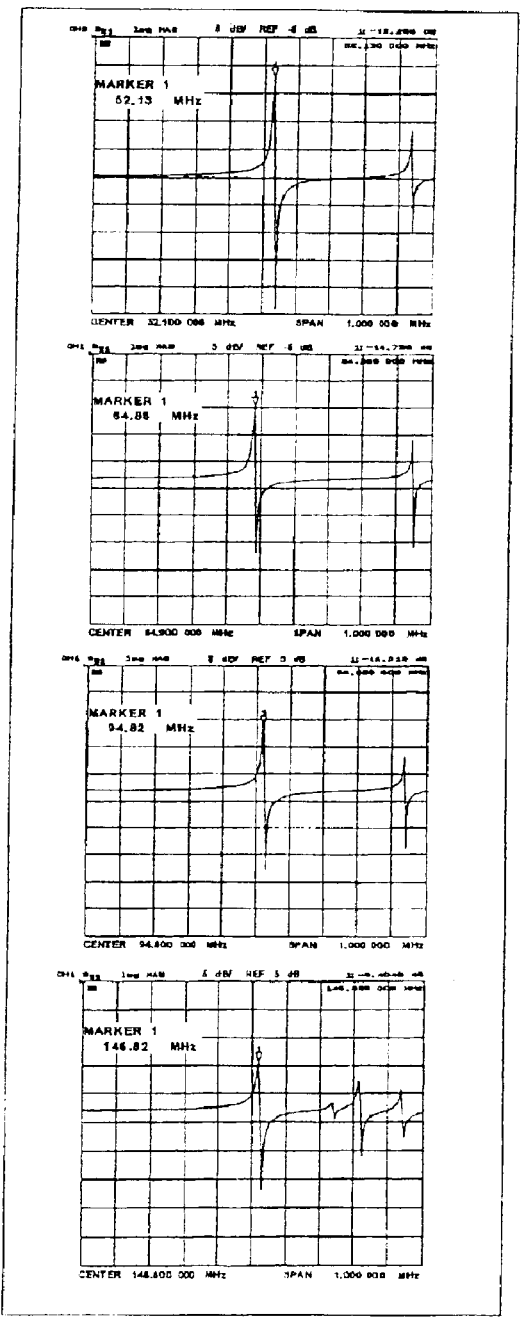

FIG. 7 illustrates a characteristic diagram of acoustic reactance-frequency for four blanks and two machining pressures. The electric property (a) after the polishing process is remarkably improved compared to that (b) before the polishing process, and this can oscillate in a high frequency. The spurious resonance before the polishing process (b) is eliminated by the polishing process, and the sharp resonance curve is observed. However, if this thickness becomes too thin or the polishing pressure becomes too strong, the spurious resonance appears, although the primary peak remains. There exists an optimum pressure and an aperture/thickness ratio.

Figure 8:
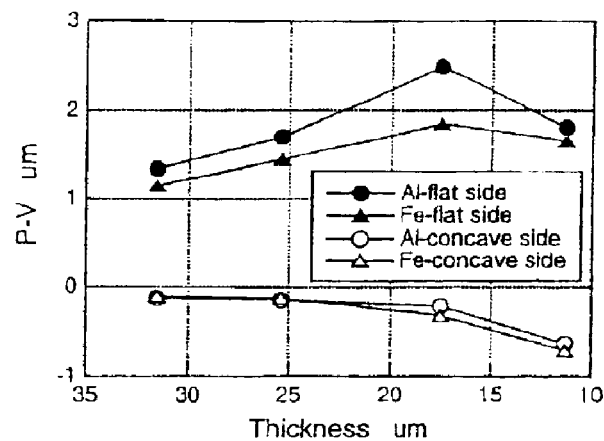
FIG. 8 illustrates a graph to show the level difference (P-V) between the peak and valley versus the changing quartz resonator thickness.
Figure 9:
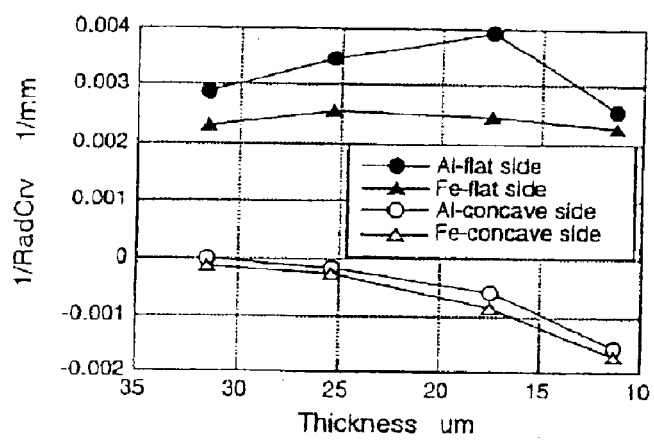
FIG. 9 shows an inverse graph of curvature radius in a convex lens shape to form single-sided inverse mesa type with one step.

FIG. 8 illustrates the form and surface roughness as a function of the resonator thickness, i.e. the changing graph to show the level difference (P–V) between the peak and valley at the central oscillation part (1.44×1.31 mm) versus the quartz resonator thickness. FIG. 9 shows the inverse of finished curvature radius in convex lens shape as a function of the thickness. Since FIG. 8 is identical to FIG. 9 in cases of the aluminum fixed table, but are different from the iron table, the shape is thought to be pure spherical for Al and distorted one for Fe. On the other hand, the concave curvature of the quartz oscillator increased when the thickness increased in one step single-sided inverse mesa type. This means the machining distortion rate when the convex lens shape was formed at the planar surface. The electric property will be improved when the optimum condition is chosen for the polishing and heat processing rates.

Figure 10:
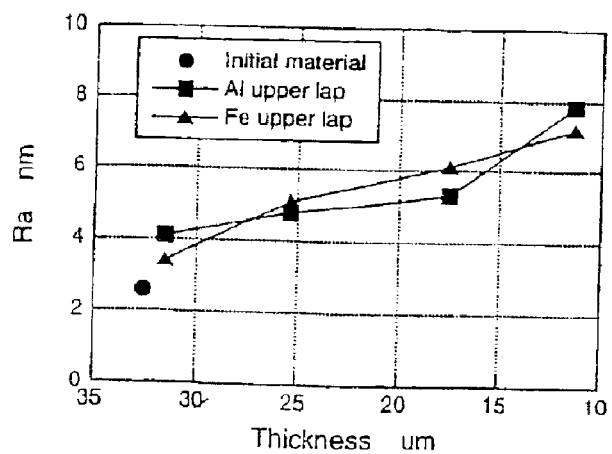
FIG. 10 shows a roughness graph of the central concave surface part for the single-sided inverse mesa type with one step.

FIG. 10 shows the roughness at the concave central part versus the thickness. The free whetstone powder changes the roughness even where the polishing pad does not make contact. For the chemical etching process, the roughness was Ra 2.6 nm, it deteriorated to Ra 7 nm where the typical concave and convex stripes appeared due to the chemical polishing. This roughness will be relieved, when the ion damaged layer is cut by the mechanical polishing in 0.3–0.4 µm thickness, after the concave part (one step single-sided inverse mesa type or one step double-sided inverse mesa type) is formed by dry etching process.

Also FIG. 10 shows that the property of a one step double-sided inverse mesa type was demonstrated to be improved by the dual-face polishing machine, same as the one step single-sided inverse mesa type, after the blank was processed by the dry etching.

Based on these results, the electrically high performance quartz oscillator was proved to be made above 334 MHz high frequency, when the aperture thickness ratio (d/t) was from 50 to 150 (optimum 80).

The following theme concerns the acousto-electric transducer as an application of the piezoelectric device of this invention.

While a conventional detection and prediction of earthquake was executed by ocean observation, underground structure probe, earth magnetic observation, ground movement measurements between two points with GPS and Laser, and so forth, acoustic wave observation due to the earthquake and Tsunami will be one of these detection and prediction. A focused microphone can transform the acoustic wave to an electric signal, which is convenient to record and analyze, but it is difficult to detect the acoustic wave at the specific frequency due to the picking up of noises.

Figure 11:
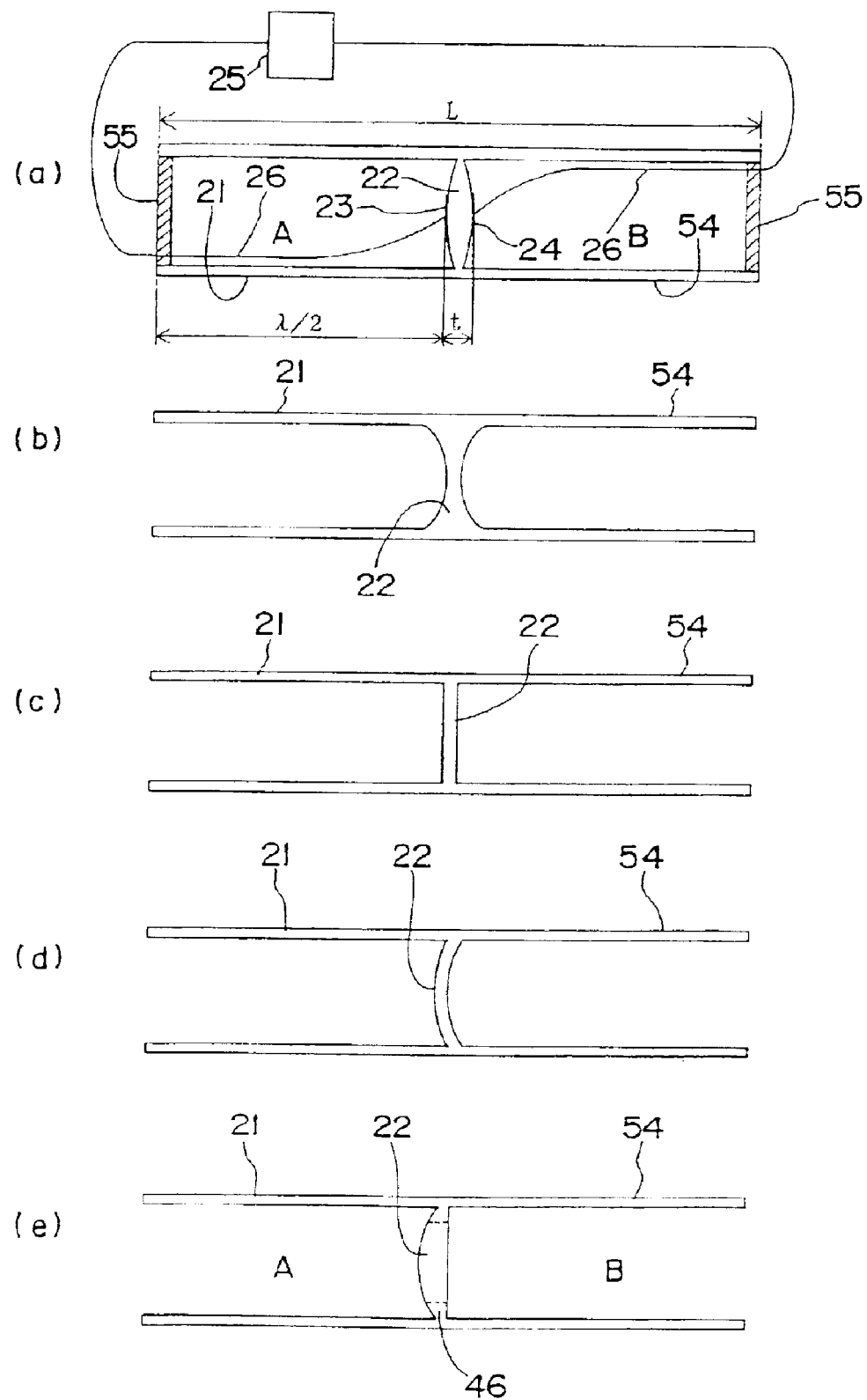
FIG. 11 shows a cross section for a real example of present acousto-electric transducer.

FIGS. 11 from (a) to (e) illustrate variously executed examples of acousto-electric transducer of piezoelectric device in this invention. In FIG. 11, cylinders 21 and 54 are made from piezoelectric material of mono-crystalline such as quartz and lithium niobium oxide or other ceramics as such barium titan oxide. In FIG. 11 a pressure receiver 22 is located at the center of cylinders 21 and 54, two electrodes 23 and 24 are vaporized by metal on the pressure receiver, gold lead wires 26 are pasted to electrodes 23 and 24 by electrically conductive adhesive, and the amplifier is connected between electrodes 23 and 24 to measure the inductive voltage. (Electrodes 23, 24 and amplifier 25 are illustrated only in FIG. 11(a)) FIG. 11(a) is bi-convex type, (b) is bi-concave type, (c) is planar, (d) is convex-concave type, and (e) is plano-convex type. As seen FIG. 11(a), rooms A and B are formed by two plugs 55, which seal the inside of cylinder 21, and seal the inside of cylinder 54, respectively. Both rooms A and B are de-pressurized (if possible vacuum or inert gas filling), and both cylinders 21 and 54 catch acoustic waves along parallel and vertical axes. This structure allows the pressure receiver 22 to catch signal intensively compared to the case without cylinders 21 and 54. Then we made the precise pressuresensor, since the pressure receiver 22 can easily hear the external vibration with slender cylinders 21 and 54. When the cylinders are not evacuated, the cylinders must be filled with inert gas.

Figure 12:
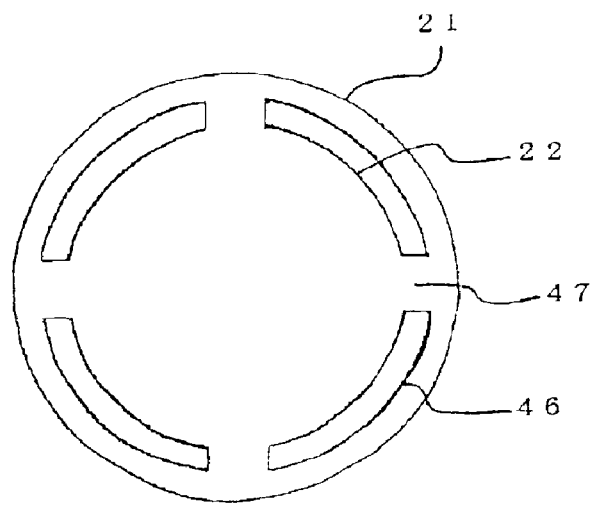
FIG. 12 is an upper surface diagram of the real example proposed above.

FIG. 12 shows the upper surface diagram of the acousto-electric transducer in FIGS. 11(a) and (b), the hole or space part 47 is formed at the pressure plate 22. Then the vibration at the left cylinder 21 and right cylinder 54 moves freely from part A to B and vice versa, and the vibration at A resonates with B at the central part. Consequently the pressure receiver 22 at the central part vibrates more strongly, when there is a hole or space 47. By the way there exists a specific good case without the hole or space 47.

Figure 13:
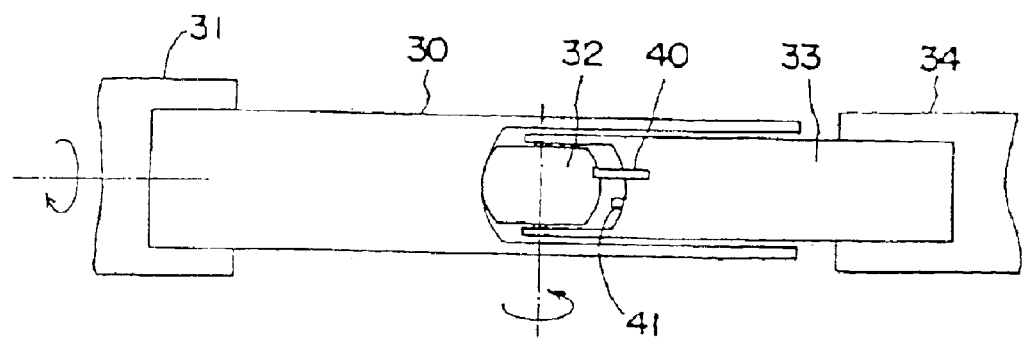
FIG. 13 is a cross section to show the machining method proposed above.
Figure 14:
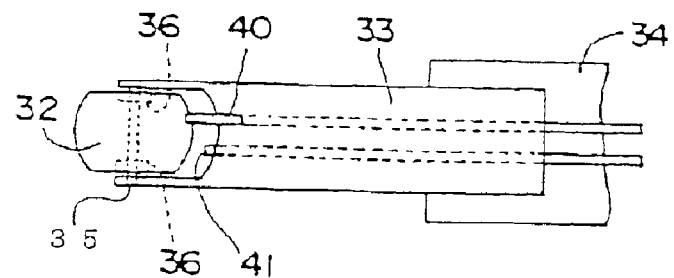
FIG. 14 is a side diagram to show the machining tools for a real example proposed above.
Figure 15:
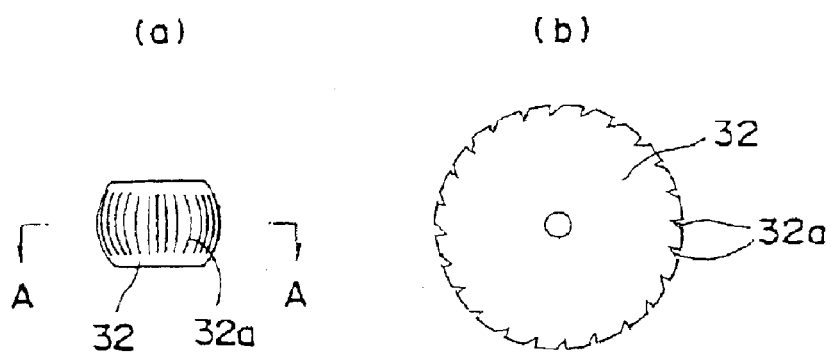
FIG. 15 is the side and A—A cross section diagrams to show the whetstone for a real example proposed above.

In this paragraph, the method, which was proposed in the previous invention by the present applicant, is described to explain the mechanical formation of the pressure receiver 22. In the fundamental method, the circular rod 30, which is made from a piezoelectric material such as quartz, barium titan oxide, lithium niobium or other ceramics and so on as shown in FIG. 13, is held by a chuck 31 of a polishing machine such as a lathe. The tool holder 34, which has a freely rotating whetstone with diamond powder on the surface, is fixed by the tool holder 34. The whetstone 32 is spherical to be cut at the opposite side as seen in FIG. 14, and this is freely rotatably held by the axis holder 36 at the tip of the holding arm 35. At the outer part of the whetstone 32, there are V shape grooves 32a as shown in FIG. 15(a) and the enlarged diagram of FIG. 15(b) taken along section line A—A, one inner wall of groove 32a is directional to the surface at the central part. The whetstone 32 is rotated at high speed by an air jet stream, which is generated by an air nozzle 40, that is disposed in a tangential direction (preferably 8~50 rpm), ans the polished blank is slowly cut (for example 1 μm/min). During the polishing time, a jet nozzle 41 ejects water, cools the whetstone 32, and wipes out the polished waste. When the whetstone 32 is rotated, the circular rod 30 is rotated around the axis as shown in FIG. 13, and it becomes circular or a circular hole is formed by the whetstone 32.

Figure 16:
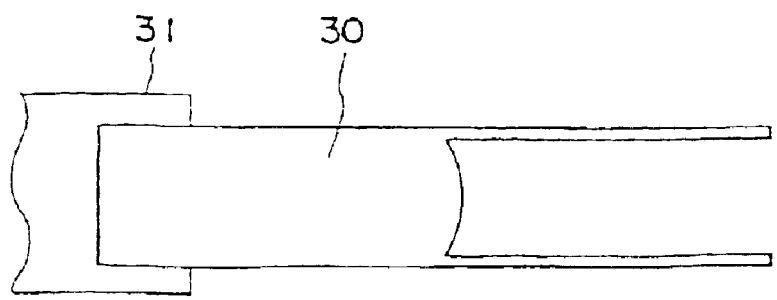
FIG. 16 is a cross section diagram to show a real example proposed above.
Figure 17:
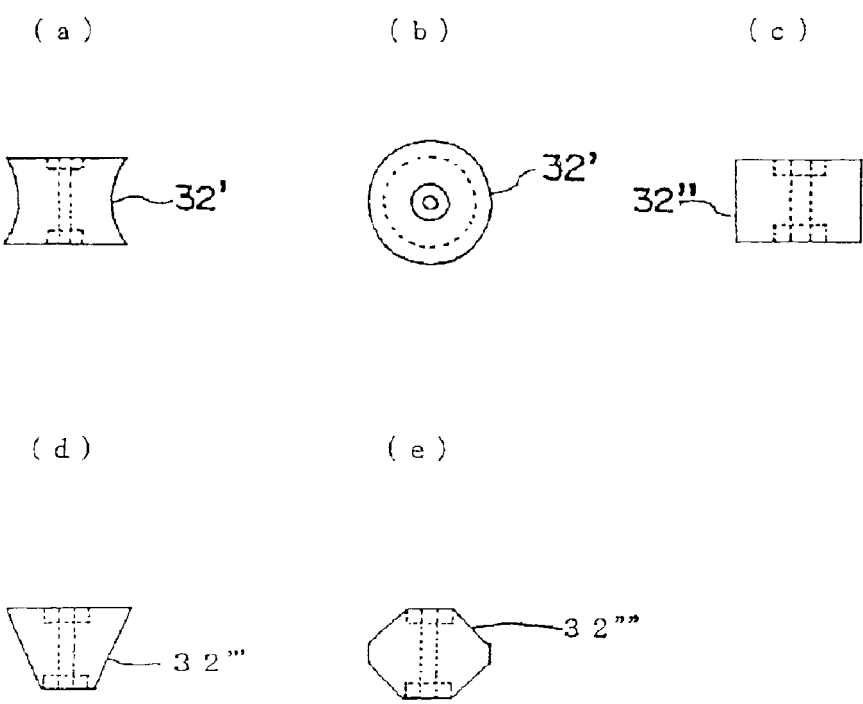
FIG. 17 illustrates a side and plane diagrams to show another whetstone for a real example proposed above.
Figure 18:
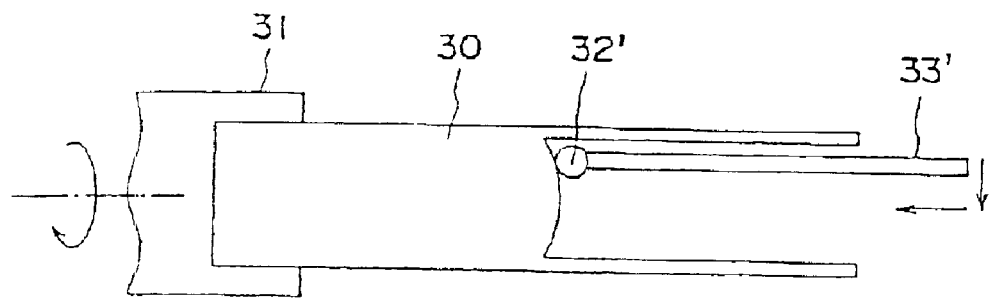
FIGS. 18–20 respectively illustrate cross sections of other machining tools for the real examples proposed above.

Also when the polishing surface of pressured surface 22 is convex as shown in FIG. 16, a dram type whetstone 32' is used as seen in FIG. 17((a) is the front view and (b) is the plan view). When the polishing surface of pressured surface 22 is flat, a flat type whetstone 32" is used as seen in FIG. 17(c). Otherwise, the whetstone 32, which is much smaller than the hole diameter as shown in FIG. 18, rotates along the curved surface of pressured surface 22 with the same machining tool 33 in FIG. 14 of NC machine.

At the same time, a chuck 31 rotates and polishes the pressured surface with a circular rod 30. Also the tool to make the hole or space part 47 is a whetstone 32" in FIG. 17(d), which does not cut the holding part 47 and machines the hole or space part 47. Of course the tool to make the hole or space part 47 can be a conventional drill, which is electrically gilt by diamonds.

Figure 19:
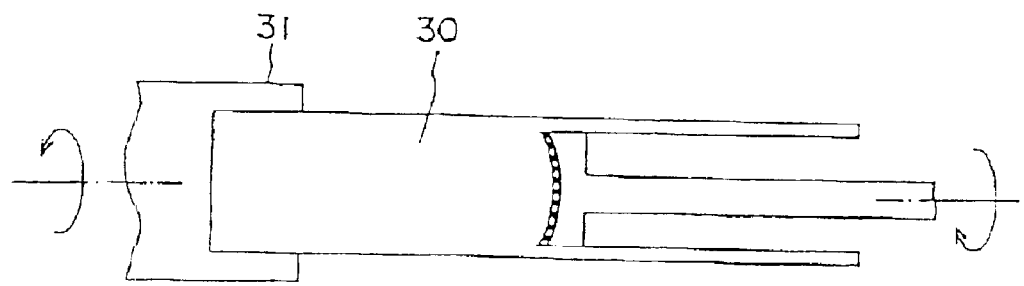
Figure 20:
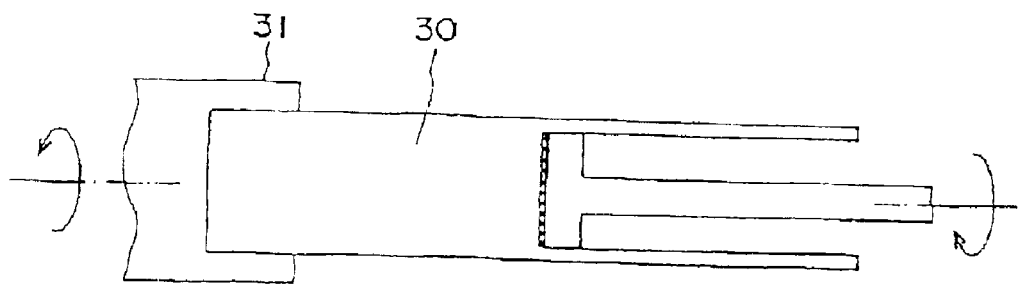

Also the circular hole of the machining tool can be the usual rotating one around the axis, for example, a spherical whetstone as shown in FIG. 19 or a disk type one as shown in FIG. 20. After the whetstone 32 has completed the coarse machining, the polishing whetstone 32" (instead of the whetstone 32), which is made from felt or buff and so forth, can do the fine lapping process. This whetstone 32"" of felt or buff with grooves 32a can be rotated an by air jet stream, which is generated by air nozzle 40 as with the whetstone 32, and it can easily perform the polishing step.

Figure 21:
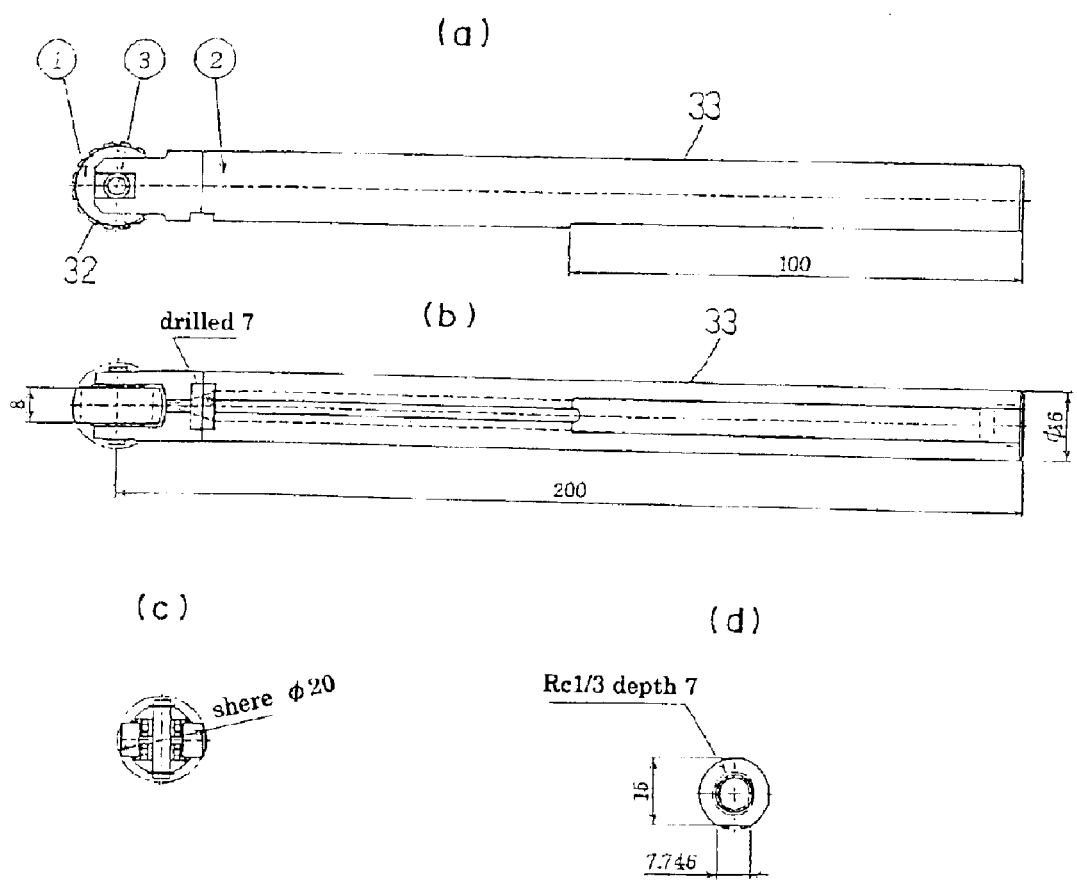
FIG. 21 illustrates the side and upper diagrams to show the manufacturing charts of the machining tools for a real example proposed above.
Figure 22:
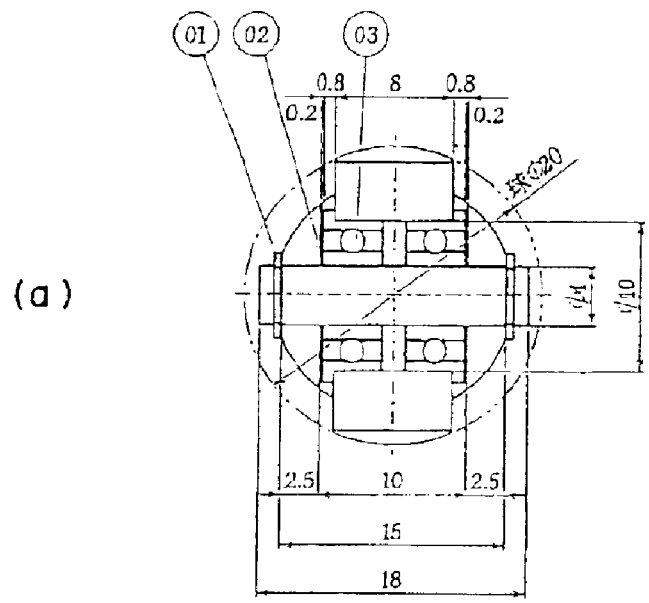
FIG. 22 illustrates the enlarged side and upper diagrams to show the manufacturing charts of the machining tools proposed above.
Figure 22:
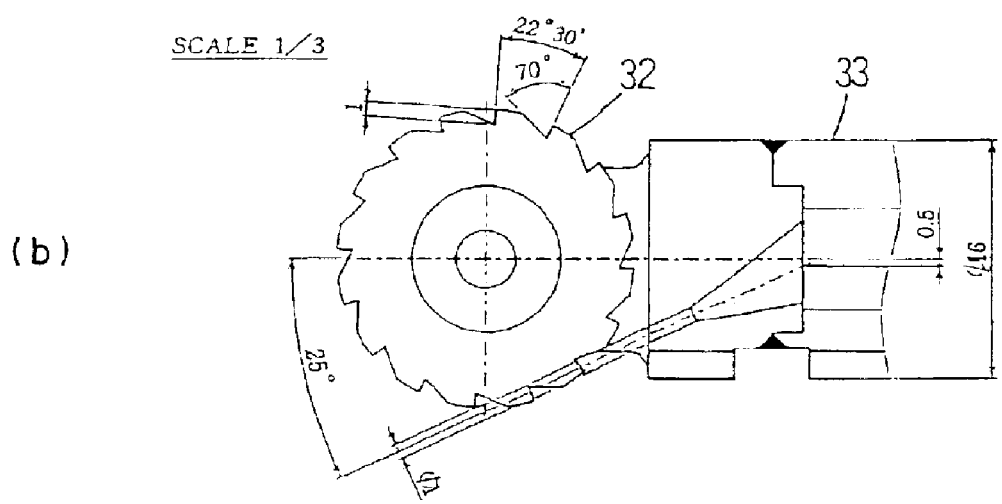

FIGS. 21 and 22 illustrate manufacturing charts of the cutting and polishing machines which structure is shown in FIG. 14. The diameter of whetstone 32 is 20 mm, and the depth of grooves 32(a) are 1 mm. The following measured figures are the rotation number of whetstone 32 and air pressure, when the air nozzle 40 of a cutting and polishing machine with 16 grooves ejects air directed tangentially at the periphery of whetstone 40.

①Air pressure is 0.5 atmosphere, and rotation of whetstone 32 is about 12,200 rpm.
②Air pressure is 1.0 atmosphere, and rotation of whetstone 32 is about 22,000 rpm.
③Air pressure is 2.0 atmosphere, and rotation of whetstone 32 is about 37,500 rpm.
④Air pressure is 3.0 atmosphere, and rotation of whetstone 32 is about 47,800 rpm.
⑤Air pressure is 4.0 atmosphere, and rotation of whetstone 32 is about 50,000 rpm, which is the bearing limitation.

Also, instead of the cutting whetstone 32 the cutting and polishing machine in FIGS. 21 and 22, we can use the polishing whetstone shown in FIG. 17(e), which is made from iron, aluminum, metal as cupper, buff, felt, glass, plastics, ceramics or others. The machining method shown in FIG. 13, which uses polishing whetstone 32"" and a polishing agent such as diamond paste, cerium oxide, alumina, GC or others, can cut and polish piezoelectric material such as quartz in various shapes as shown in FIG. 11 at the same time. It is the reason for the polishing machine to cut and polish at the same time, since the whetstone 32"" in FIG. 17(e) can easily rotate up to 50,000 rpm at the bearing limit. As this can be efficiently done only with the polishing process, this method, which uses this polishing whetstone 32"" of felt, buff, iron, or others, can cut and polish piezoelectric material such as extremely thin quartz at the same time.

The above paragraph explains the manufacturing method, which was previously invented by us, and the following introduces newly invented acousto-electric transducer.

Figure 23:
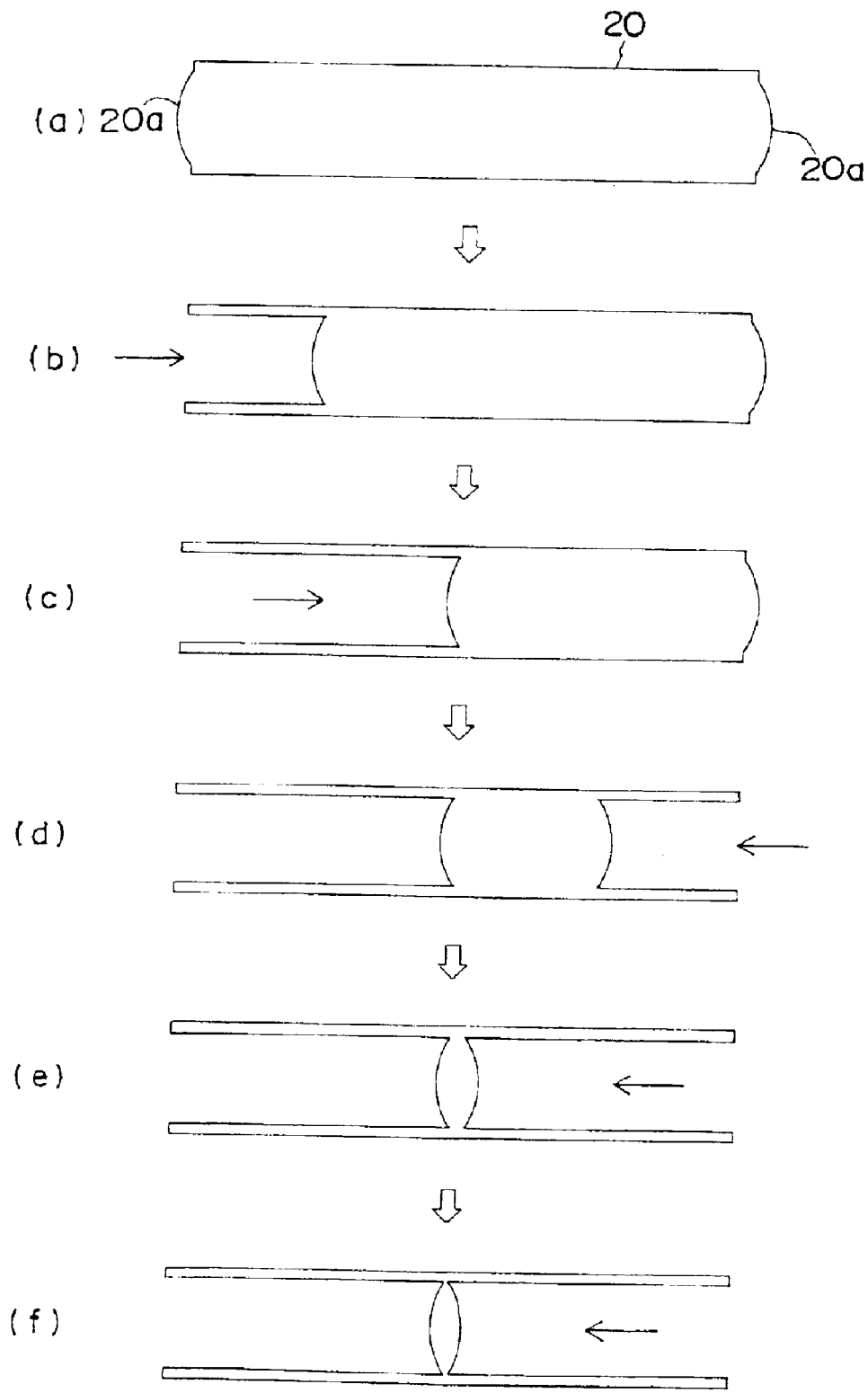
FIGS. 23–30 respectively illustrate cross sections of oscillators (resonators) to show those manufacturing processes for acousto-electric transducers and other applications of the present invention

Initially, we will explain the method of forming the convex lens type pressure receiver 22 (oscillation surface) in FIG. 23 at the center of piezoelectric material in a hollow cylindrical shape in as shown FIG. 11(a).

(a) The first product, the target of which is to form the convex lens shape 20a, is made from both ends of cylindrical piezoelectric material 20 by means of mechanical polishing, etching process, or the like.
(b) Only a cylindrical part of the first product in the convex lens shape is processed by the dry etching process (RIE or CIP process), other parts are not etched. This process can be executed by setting the ring mask, which is made from glass, quartz, tungsten, nickel, pure iron, plastic or other materials, on the end of the cylindrical piezoelectric material 20.
(c) This process continues to the central part of the piezoelectric material 20 as shown in FIG. 23(c).
(d) After the dry etching process reaches the predetermined length at the central part, the same dry etching process is undertook from the opposite surface. In practice, this is done by inverting the piezoelectric material 20, not by moving the dry etching machine.
(e) As shown in FIG. 23(e), after the convex lens shape is formed at the central part of piezoelectric material 20, the ion-damaged layer, which is generated by the dry etching process in 0.2 μm–0.3 μm depth, is removed by the mechanical polishing method. Then we have the oscillator (resonator) with electrically excellent performance, since the lens shape of ring support type is formed at the cylindrical central part as shown in FIG. 23(f).

Figure 24:
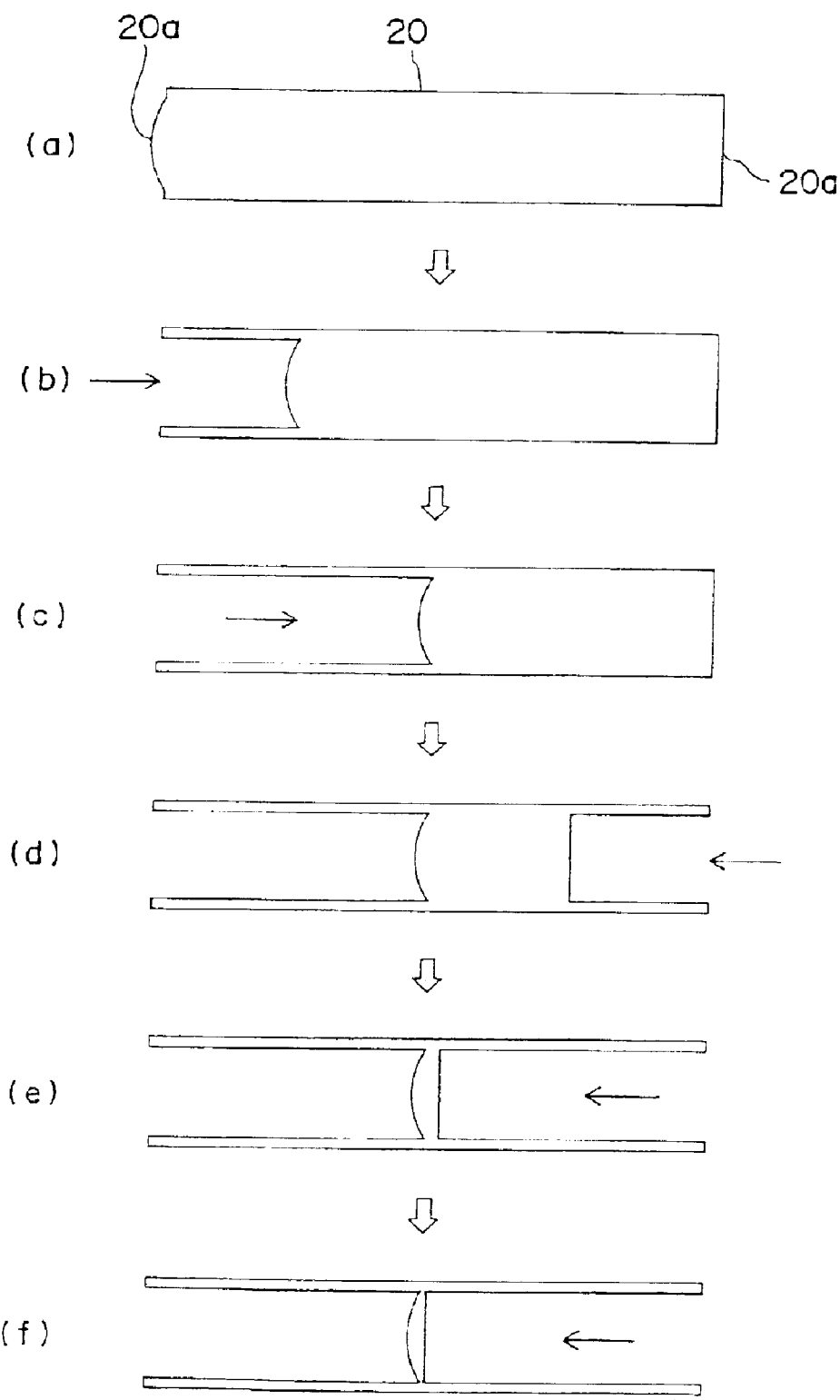

FIG. 24 illustrates the machining stage to process the pressure receiver (oscillating surface), of which one side is in a convex lens shape and the other side is flat.

Figure 25:
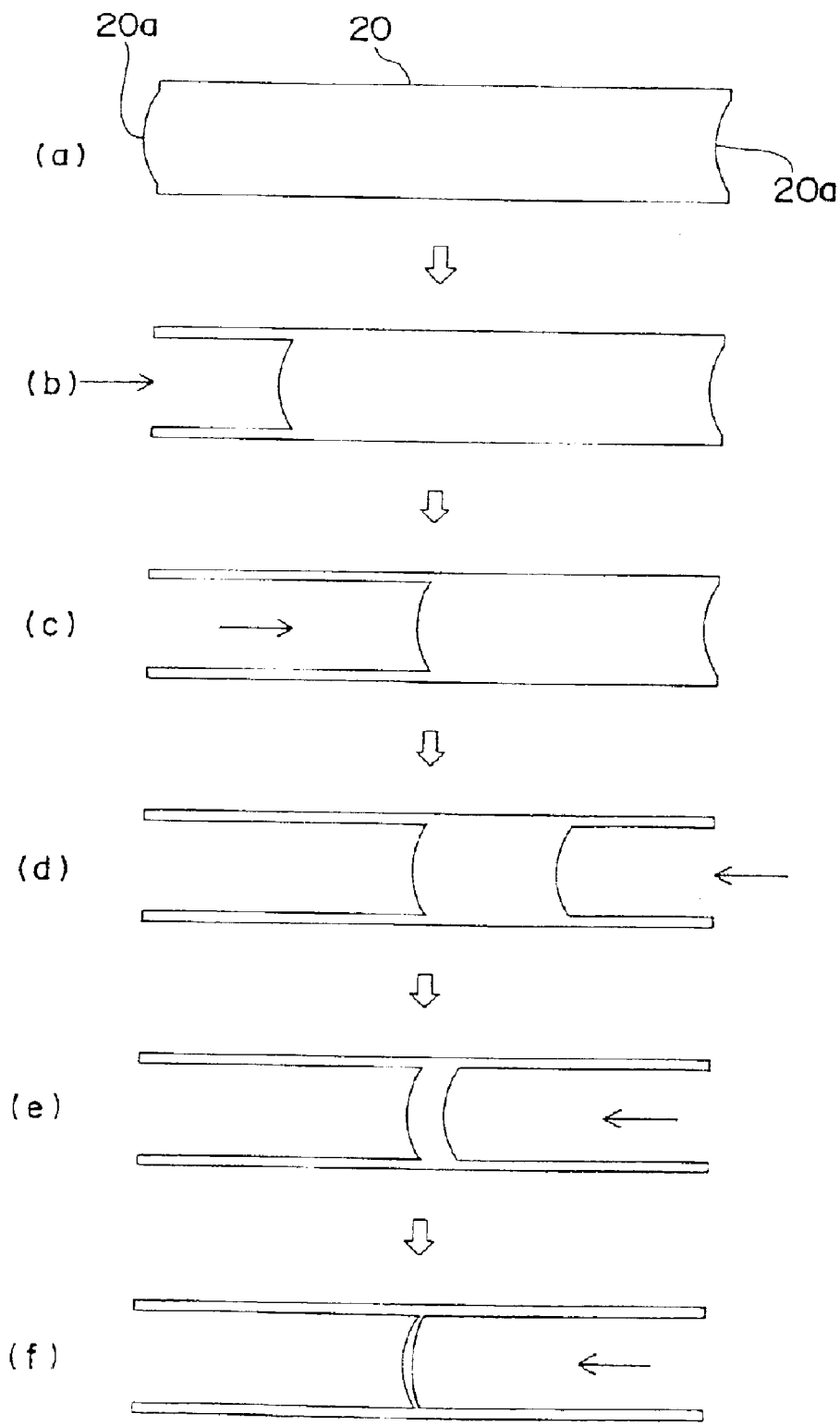

FIG. 25 illustrates the machining stage to process the pressure receiver (oscillating surface), of which one side is in a convex lens shape and the other side is concave.

Figure 26:
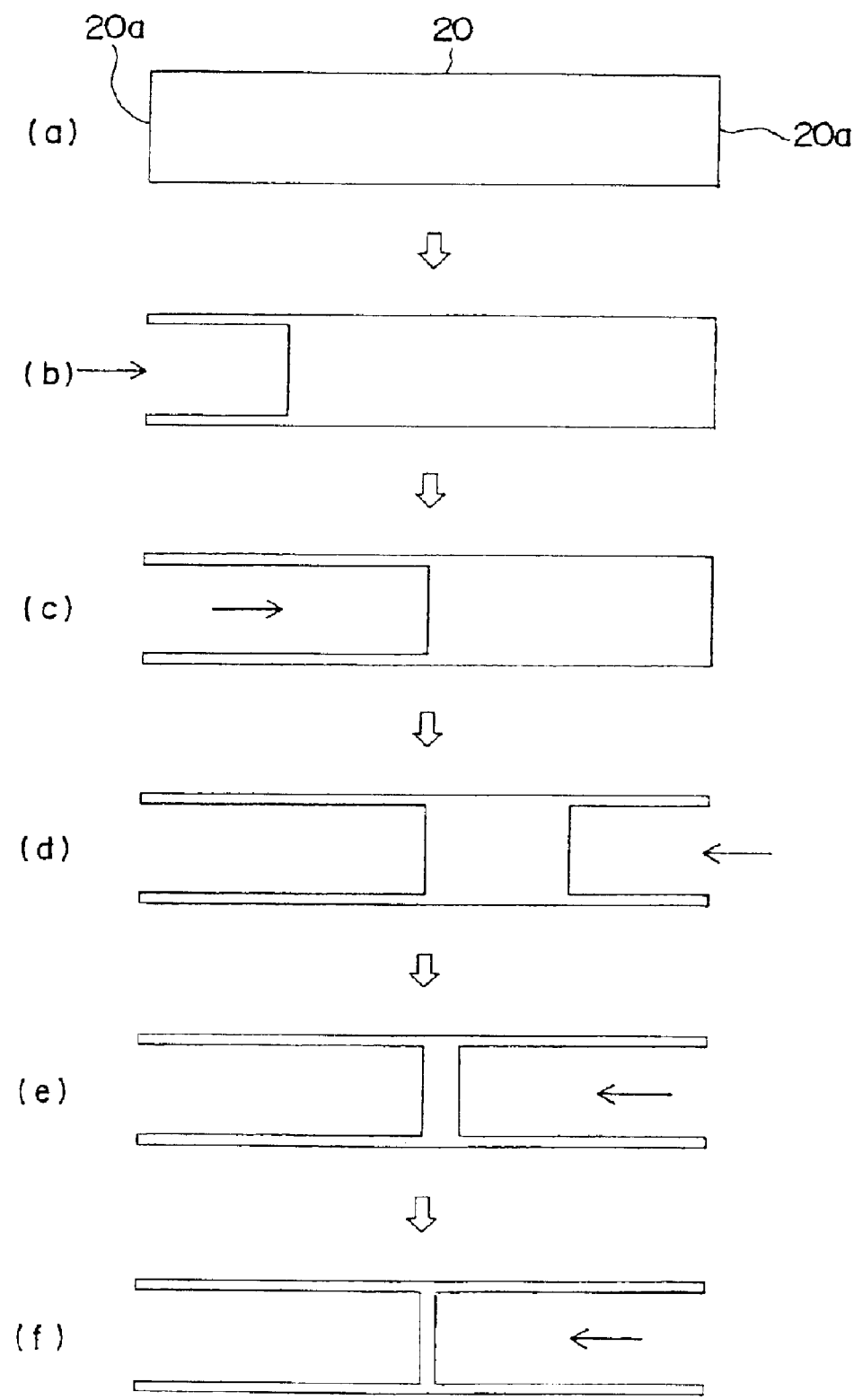
Figure 27:
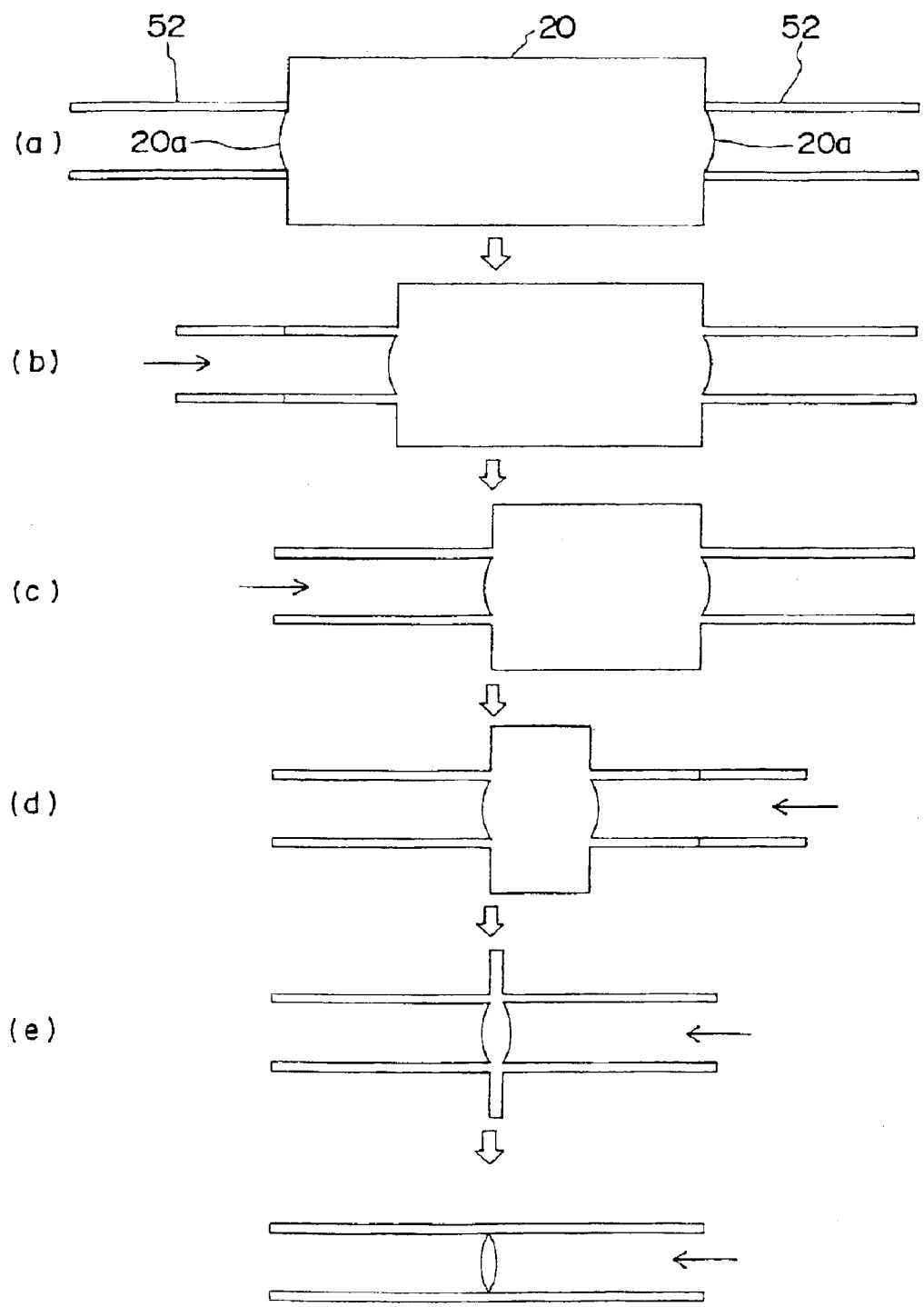

FIG. 26 illustrates the machining stage to process the pressure receiver (oscillating surface), of which both sides are flat FIG. 27 illustrates another machining process for forming a hollow cylindrical oscillator. The successive engineering stages is described as follows.

(a) The first product, the target of which is to form the convex lens shape 20a, is made from both ends of cylindrical piezoelectric material 20 by means of mechanical polishing, etching process, or the like.

(b) Only a cylindrical part of the first product in the convex lens shape is processed by the dry etching (RIE or CIP process), other parts are not etched. This process can be executed by setting a hollow cylinder 52, which is smaller than the material 20 and made from glass, quartz, tungsten, nickel, pure iron, plastic, or other material, on the end of the cylindrical piezoelectric material 20. Then the dry etching process is simultaneously performed at the inner and outer surfaces of piezoelectric hollow cylinder 52. At the same time, the end surface of the cylinder 52 is shaven.

(c) This process continues to the central part of the piezoelectric material 20 as shown in FIG. 27(c).

(d) After the dry etching process reaches the predetermined length of the central part, the same dry etching process is undertook from the opposite surface. In practice, this is done by inverting the piezoelectric material 20, not by moving the dry etching machine.

(e) As shown in FIG. 27(e), after the convex lens shape is formed at the central part of piezoelectric material 20, the ion-damaged layer, which is generated by the dry etching process in 0.2 $\mu$m~0.3 $\mu$m depth, is removed by the mechanical polishing method. Then we have the oscillator (resonator) with electrically excellent performance, since the lens shape of ring support type is formed at the cylindrical central part, and a lens shape shown in FIG. 27(f) is formed at the central part of hollow cylinder, we get the oscillator (resonator), which contains the holding part in a ring-support shape and is electrically excellent.

Although FIG. 27 shows the example of producing the bi-convex lens shape, other shapes of the oscillator in those arbitrary shapes can be made also by processing to maintain the initial shape.

The following paragraph introduces a processing method to make the convex lens shape oscillator (resonator), which is connected to an extremely thin connector.

Figure 28:
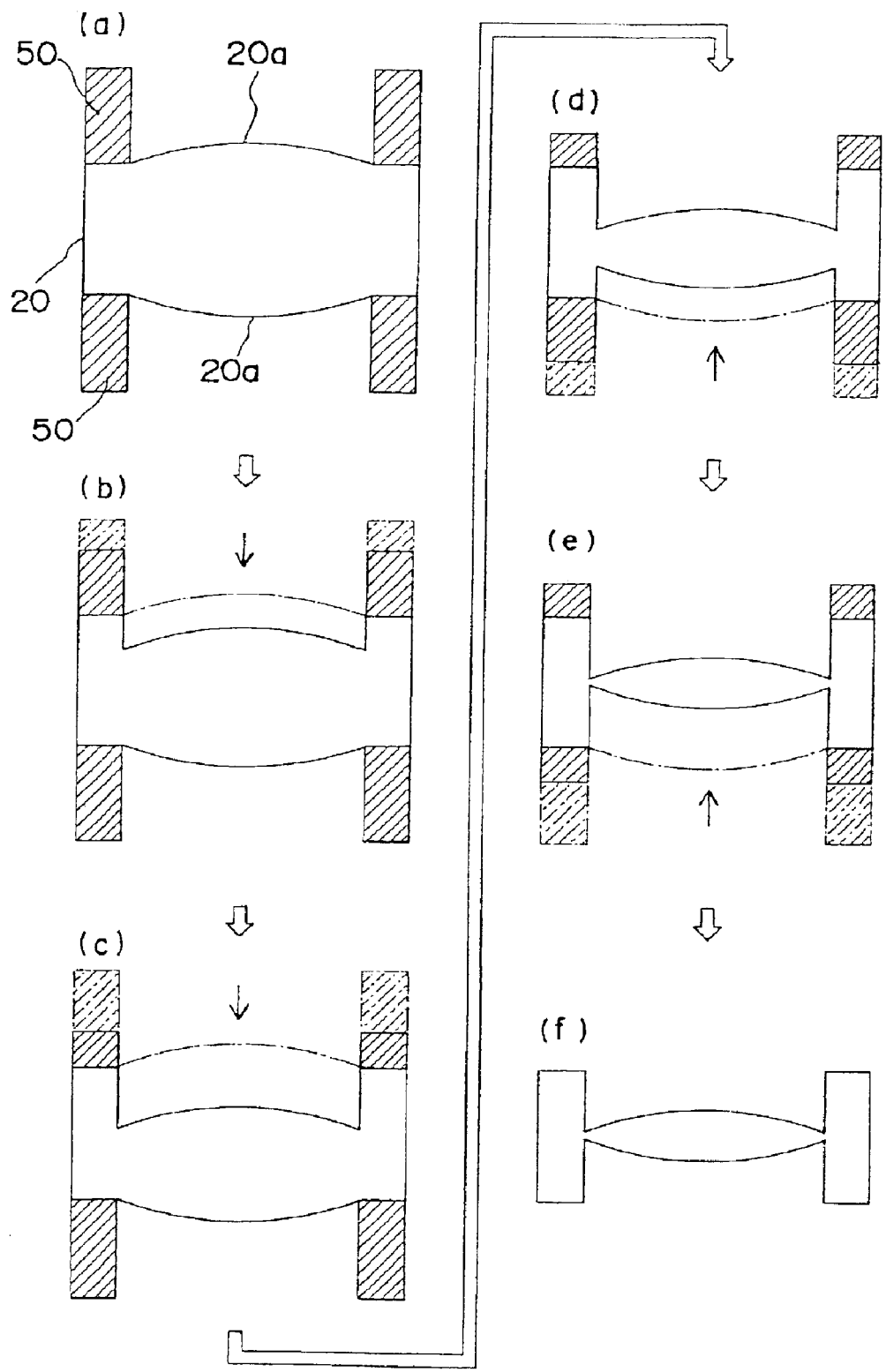
Figure 29:
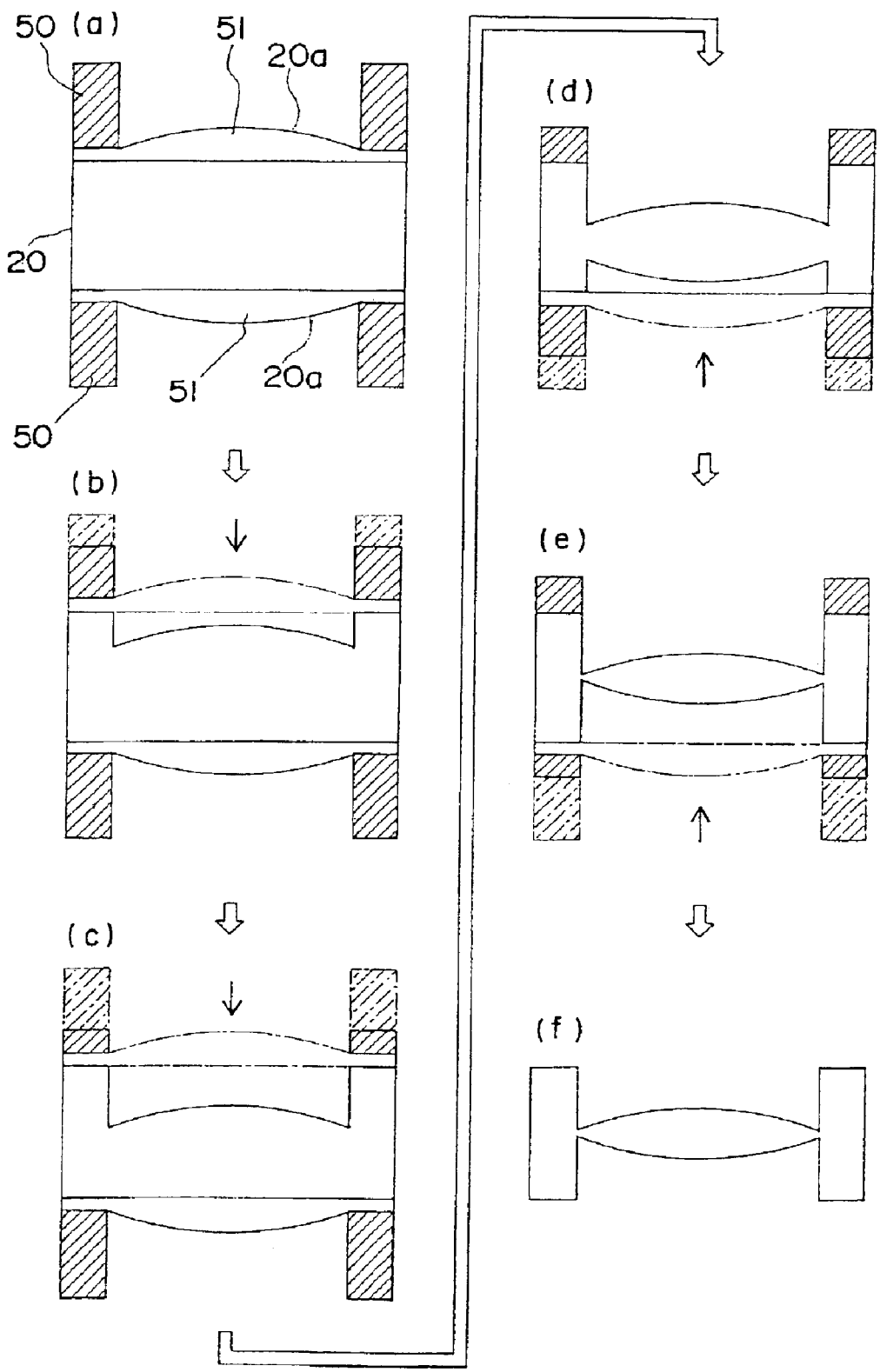

FIGS. 28 and 29 show the processing method, and this is explained as follows.

(1) The first product, the target of which is to form the convex lens shape 20a, is made from both ends of a thick piezoelectric plate 20 by means of mechanical polishing, etching process, or the like.

(2) Only a cylindrical part of the first product in the convex lens shape is processed by the dry etching process, as other parts are not etched. This process can be executed by setting a hollow cylindrical auxiliary tool 50 (on the top of the first product), which is smaller than the hollow cylinder 20 and made from glass, quartz, tungsten, nickel, pure iron, plastic or other material, and the surface of the tool 50 and the both ends are shaven by the dry etching process at the same time or successively (step one end in this sample). Then, after the convex lens shape is formed at the central part of piezoelectric material 20, the ion-damaged layer, which is generated by the dry etching process in 0.2 $\mu$m~0.3 $\mu$m depth, is removed by the mechanical polishing method. Then we have the oscillator with electrically excellent performance, since the lens shape of ring support type is formed at the cylindrical central part, and a lens shape in FIG. 27(f) is formed at the central part of hollow cylinder, we get the oscillator (resonator), which outer surface is in a ring-support shape with the holding part.

Although FIGS. 28 and 29 show the example of producing the convex lens shape, other shapes of the oscillator (resonator) in plano-convex, bi-convex, concavo-convex, or other arbitrary shapes, can be made also by processing to maintain the initial shape, when both surfaces of the piezoelectric material 20 are machined in flat, concave or other shapes.

FIG. 29 illustrates another process to make the convex lens shape oscillation part (resonation part) with a very thin connector in the ring shape holder. This is described step by step as follows.

(1) At both ends of the piezoelectric disk, a convex lens type auxiliary blank 51 is pressingly set by using the mechanical polishing process, press formation (to make lens), etching process, or other means. Otherwise, the auxiliary blank 51 is pasted on the piezoelectric material 20 by using resist (for instance OSPR resist made in Tokyo Ohka Kogyo Ltd.) or other adhesives. Here the material of the auxiliary blank 51 is glass, optical glass, lens, quartz, tungsten, nickel, pure iron, plastics, or other material.

(2) Only the convex lens shape part of auxiliary blank 51 is dry etched, a hollow cylindrical auxiliary tool 50, which is made from glass, optical glass, lens, quartz, tungsten, nickel, pure iron, plastics or other material, is set on the top of the auxiliary blank 51, in order not to etch other part of the convex lens shape. And the surface of auxiliary tool 50 is homogeneously shaven by dry etching process at the same time. Then the surface of blank 51 is etched at first, next the surface of piezoelectric material 20 is shaven, and an ultra thin convex lens shape is formed at the central part in hollow cylindrical shape. After the mechanical lapping process removes the 0.2 $\mu$m~0.3 $\mu$m ion-damaged layer, which is followed by the dry etching, and finally formed is the electrically excellent oscillator, which has the lens shape in the hollow cylindrical central part and the ring-support type holder at the outer part.

Figure 30:
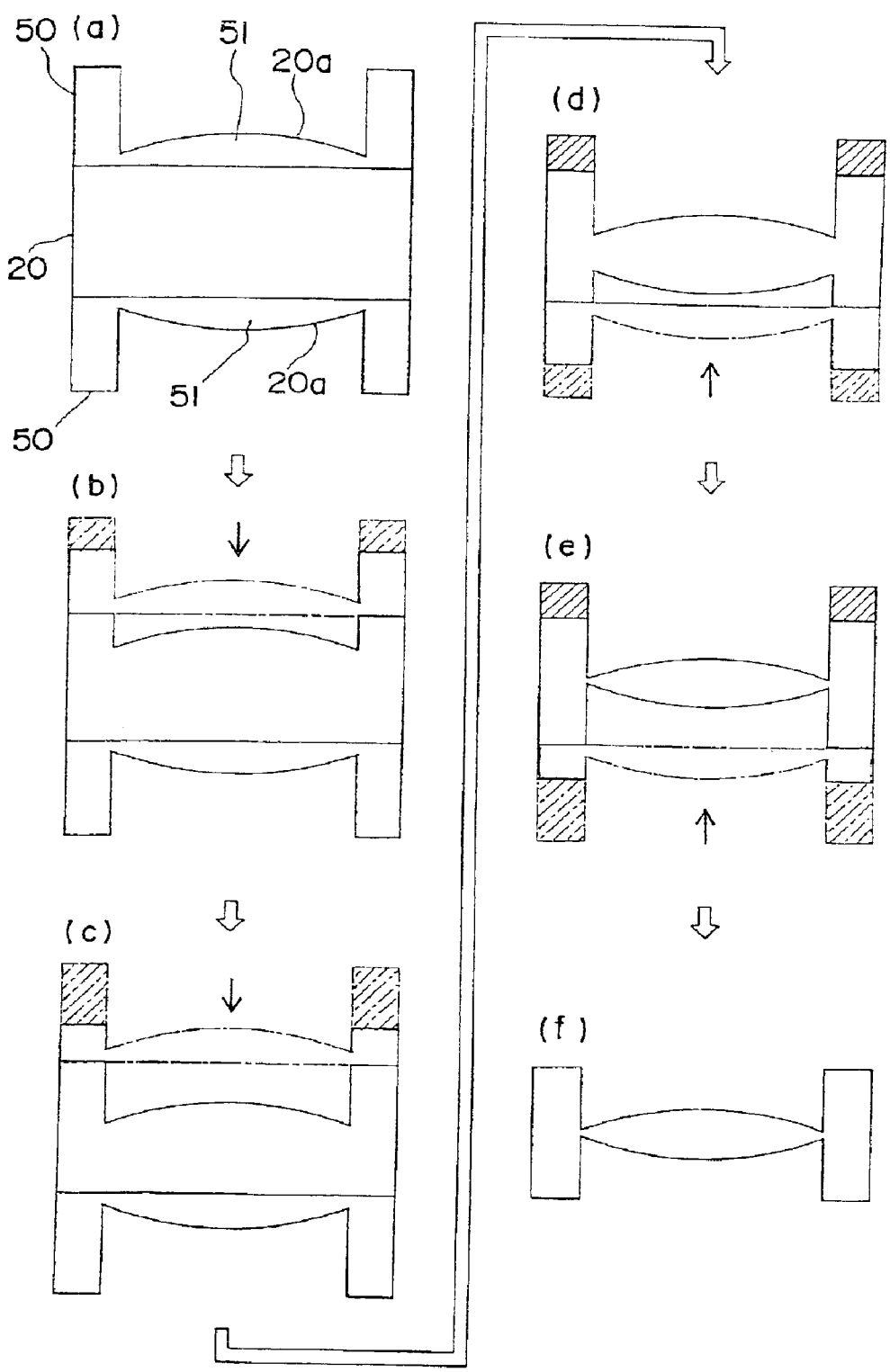

FIG. 30 shows the auxiliary blank 51, which is made by a pressing process or others in the lens shape at the hollow cylindrical central part and the ring-support type holder, and this is different from FIGS. 28 and 29. Quartz oscillators, which have the lens shape in the hollow cylindrical central part and also have the ring-support type holder at the outer part as shown in FIG. 30(f), can be conveniently made without using the auxiliary tool 50, which is made from glass, optical glass, lens, quartz, tungsten, nickel, pure iron, plastics, or other materials.

The material of the auxiliary blank 51 can be made from glass, optical glass, lens, quartz, tungsten, nickel, pure iron, plastics or others, however the best material is quartz glass similar to quartz crystal to press the auxiliary blank 51, but other material is to be useful. In FIG. 30 the convex lens auxiliary blank 51 is set by pressing on both sides of piezoelectric material 20 or pasted by resist adhesives and dry etched, however other arbitrary shapes such as plano-convex, bi-flat, concavo-convex, bi-convex are to be made by processing the auxiliary blank 51 in convex lens, concave lens or other shapes and by decreasing the thickness of the initial shape by the dry etching process.

Figure 31:
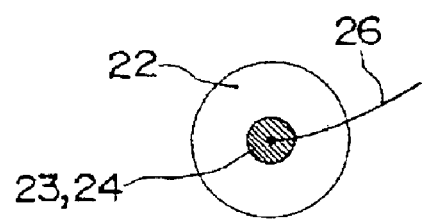
FIG. 31 is a front diagram of state, which has gold lead from electrode in this invention.

Electrodes 23 and 24 in FIG. 31 are made by vapor depositing Al, Ag, Au and so forth on both sides of the oscillator (resonator), which is made by the above process. Also, the ultra slender gold wire 26 (for example 18 μm) is pasted to the electrode with a bonding machine or electrically conductive adhesive. Usually the electrode and lead wire are made by vaporization only, however the electrode only is vaporized and afterwards the gold wire is pasted to the electrode, since the electrode and lead wire cannot be made solely by the vaporization when the diameter of the hollow cylinder is very small and slender.

Figure 32:
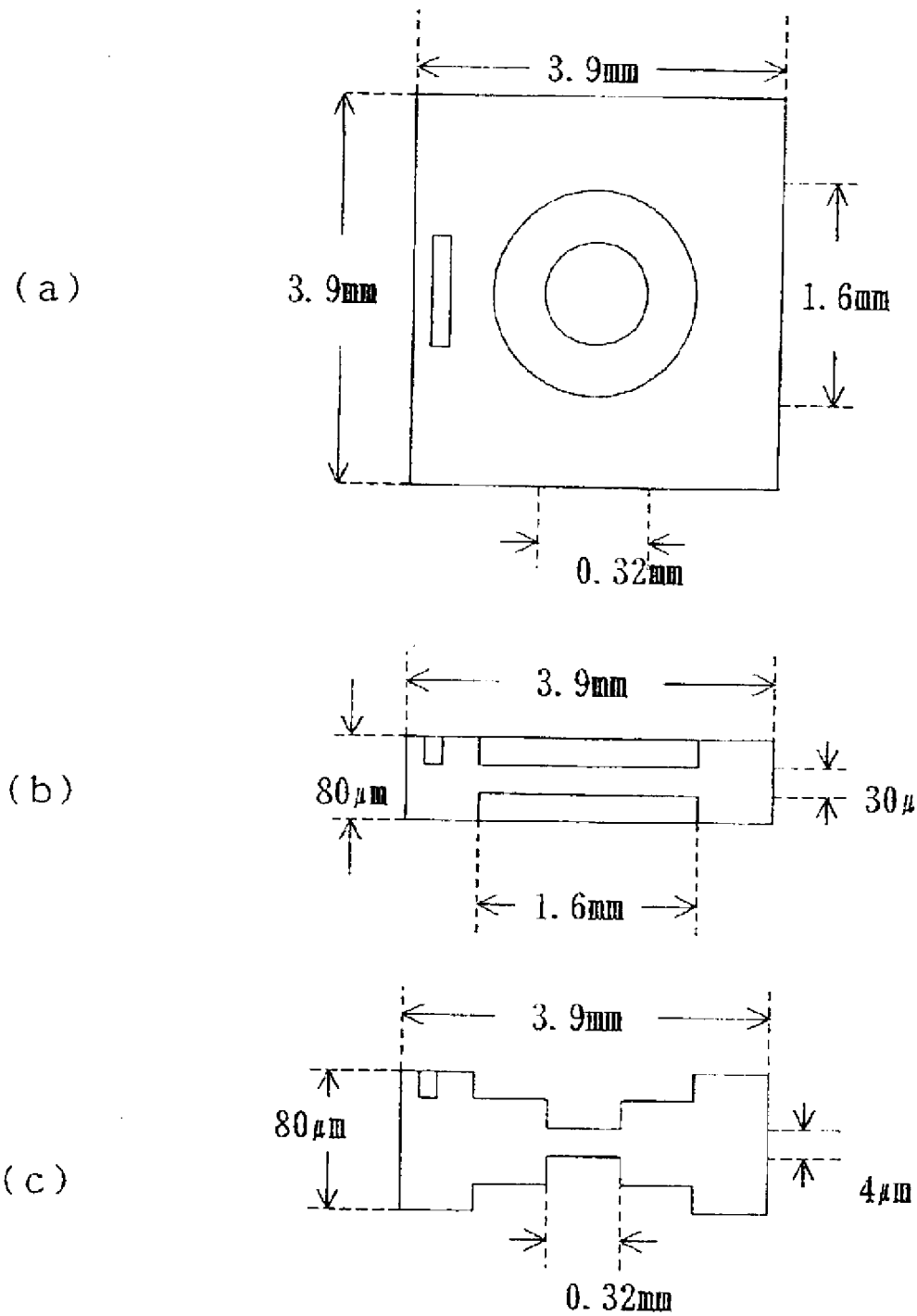
FIGS. 32–54 respectively show upper and cross section diagrams of oscillators (resonators) for real examples in this invention.

Other examples are illustrated in FIGS. 32, 33, 34 and 35. In order to mass produce quartz blanks in two steps double-sided grooved type by the chemical wet etching and dry etching process, the quartz wafer is masked and etched by the wet or dry process in these cases. These shapes are shown in FIGS. 32(*a*), 33, 34(*a*) and 35(*a*).

In these examples, an 80 μm thick quartz wafer is masked as the first step, then the oscillation part is processed in every 25 μm from both sides of the quartz wafer by chemical etching or dry etching as shown in FIGS. 32(*b*), 33(*b*), 34(*b*) and 35(*b*), and the thickness of oscillation part becomes 30 μm after these etching processes. Then, the quartz wafer an masked as the second step, the 30 μm oscillation part is processed in every 13 μm from both sides by chemical etching or dry etching as shown in FIGS. 32(*c*), 33(*c*), 34(*c*) and 35(*c*), and the thickness of the oscillation part becomes 4 μm after these etching processes.

Figure 34:
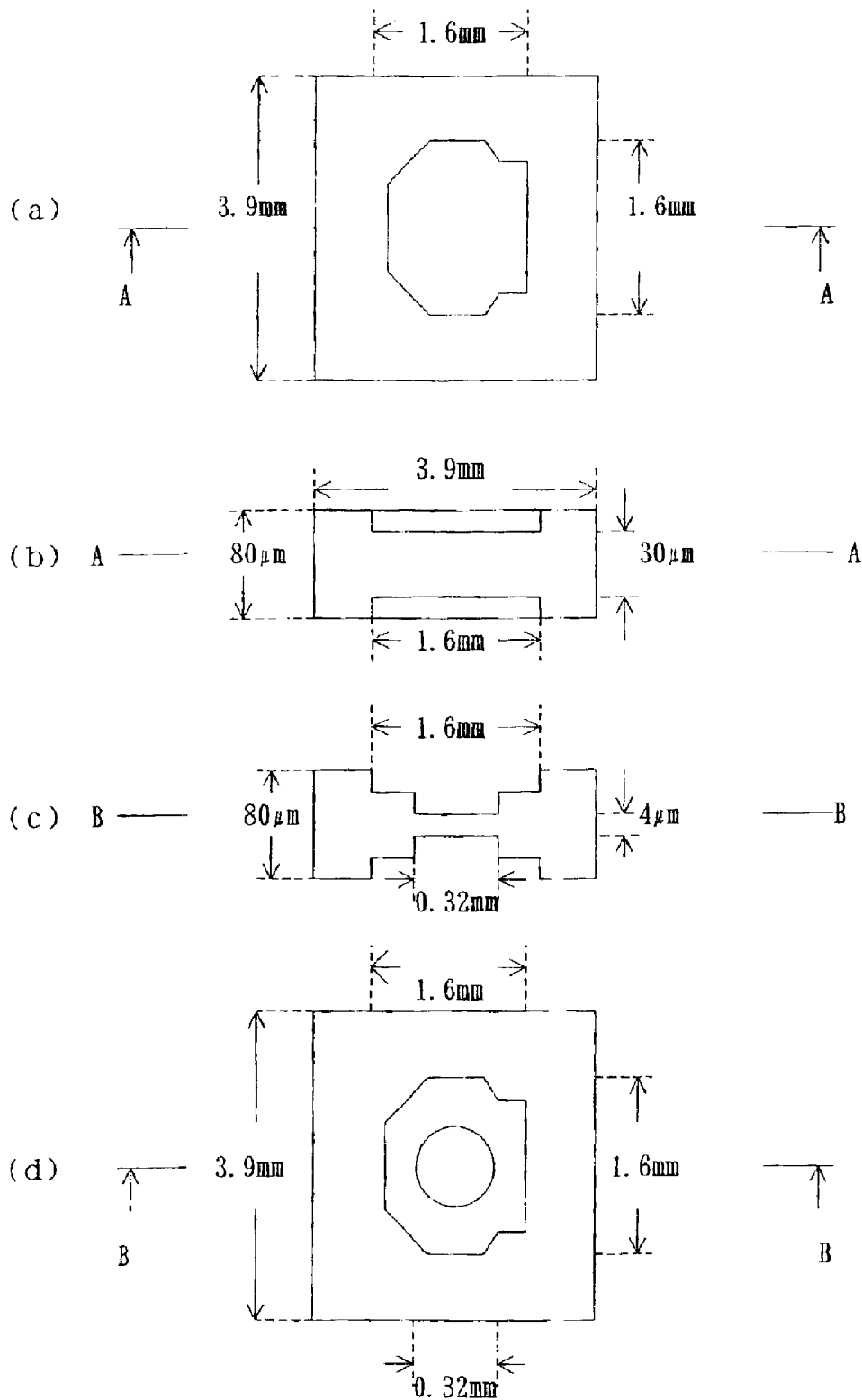
Figure 35:
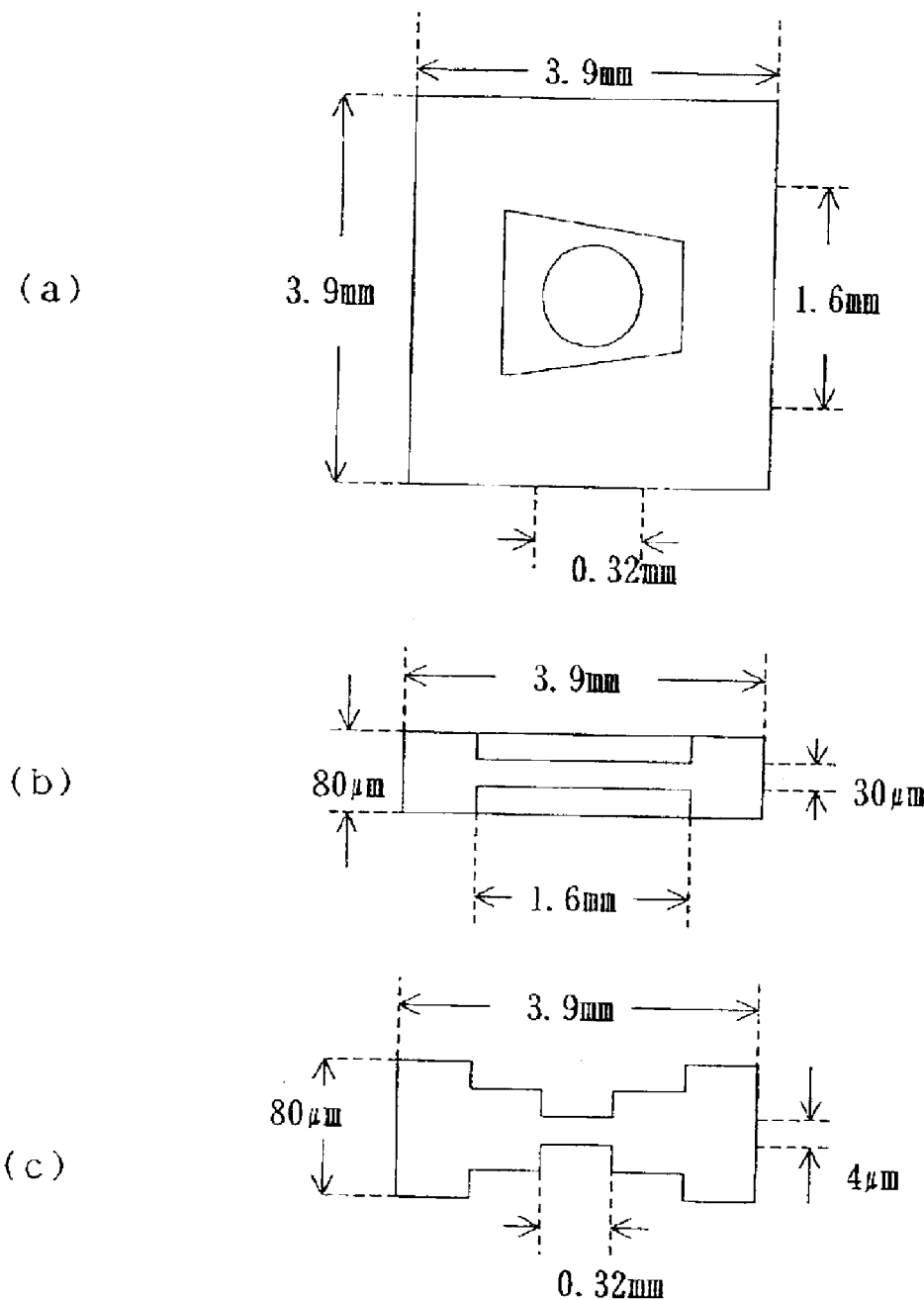

Like the circle shapes shown in FIGS. 32(*a*) and 33(*a*), hexagonal shape shown in FIG. 34(*a*), square shape shown in FIG. 35(*a*), or other quartz wafer shapes can be masked as the first step so as to be 30 μm thick of the oscillation part by the chemical etching or dry etching. As the second masking process shown in FIGS. 32(*c*), 33(*c*), 34(*c*), and 35(*c*), the thickness of the oscillation part is processed in order to be 4 μm.

This method has the following merits.

① Although the outer shape is square or rectangular, the shape of the oscillation part becomes pure circular or circle, which is electrically excellent.

Figure 33:
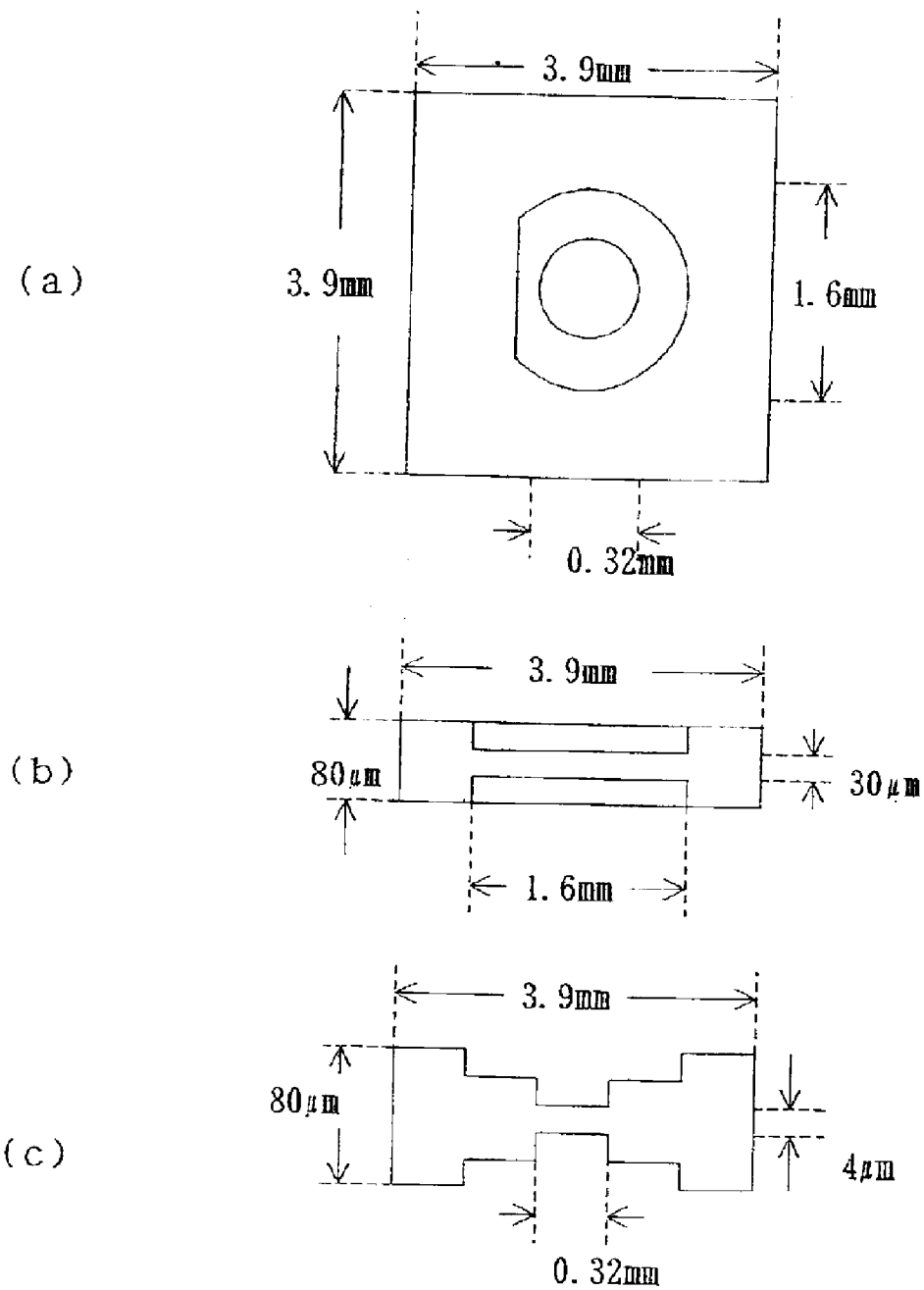

② As shown in FIGS. 32 and 33, when the outer shape of quartz blank is square or rectangular, and the shape of the oscillation part is purely circular or in circle, it becomes difficult for the crystal orientation to be seen, since the crystal orientation has no mark. Then the crystal orientation is marked by etching in a specific shape as shown in FIG. 32(*a*) and FIG. 33(*a*), when the shape of the oscillation part is processed to be circular.

③ As shown in FIGS. 32, 33, 34 and 35, when the outer shape of quartz blank is square, mass production becomes easy compared to the circular case, because the cutting is conveniently done.

④ The outer shape of the quartz blank can be square, however the electric property of quartz oscillator becomes more excellent, when the shape of oscillation part is purely circular or in circle.

⑤ As shown in FIGS. 32(*c*), 33(*c*), 34(*c*), and 35(*c*), the ratio of diameter over the thickness (d/t) is to be approximately 80 and the optimum diameter of the oscillation part is 4 μm×80=0.32 mm, in order to get the best electric performance, when the oscillation part is 4 μm thick. When the initial quartz blank is 80 μm thick and the oscillation diameter is 0.32 mm, it is impossible for the circular oscillation part to be processed down to 4 μm thick by only one masking after the chemical etching of 76 μm. When the diameter of oscillation part becomes as small as 0.32 mm, the chemical etching cannot be homogeneously processed due to the surface tension of solution as hydrogen fluoride and the crystalline anisotropy. When the chemical etching is successively processed more than two times, it become possible for the blank of the small diameter less than 0.32 mm to be shaved.

⑥ In the case of the dry etching process, there exists no problem for the diameter of the oscillation part to be as small as 0.32 mm.

⑦ When this is in two steps wise shape and the thickness is decreased step by step, the mechanical polishing process can easily remove the damaged layer, which is generated during the chemical or dry etching.

Figure 36:
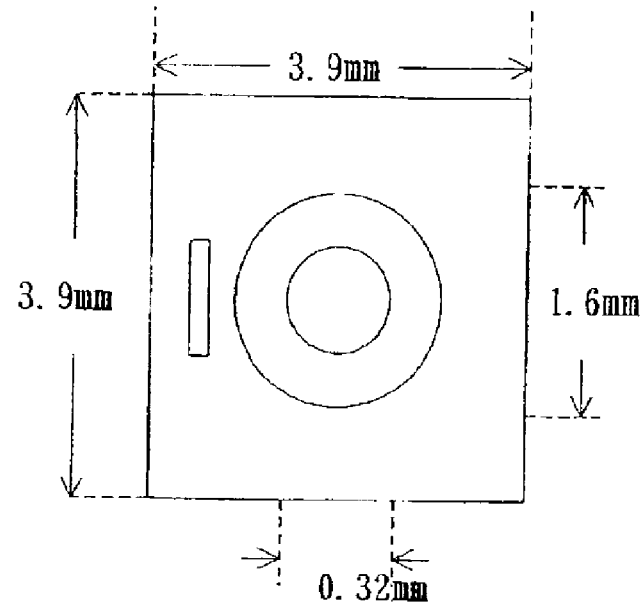
Figure 36:
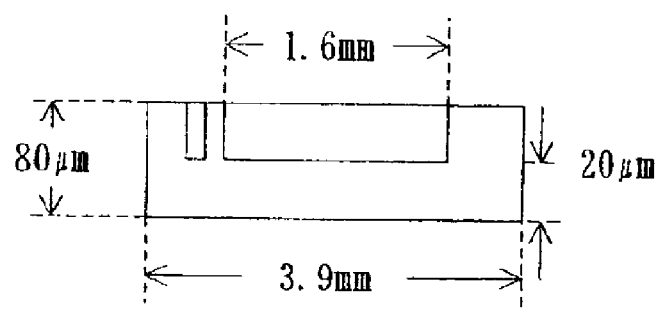
Figure 36:
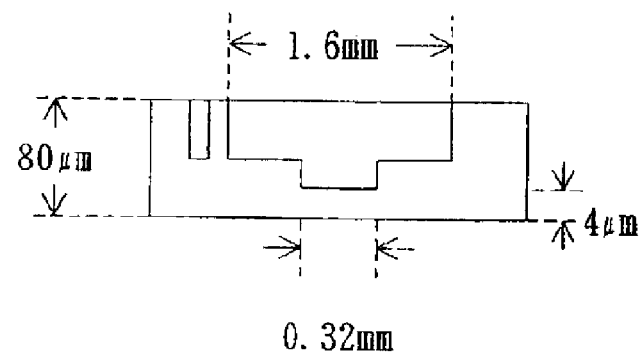
Figure 37:
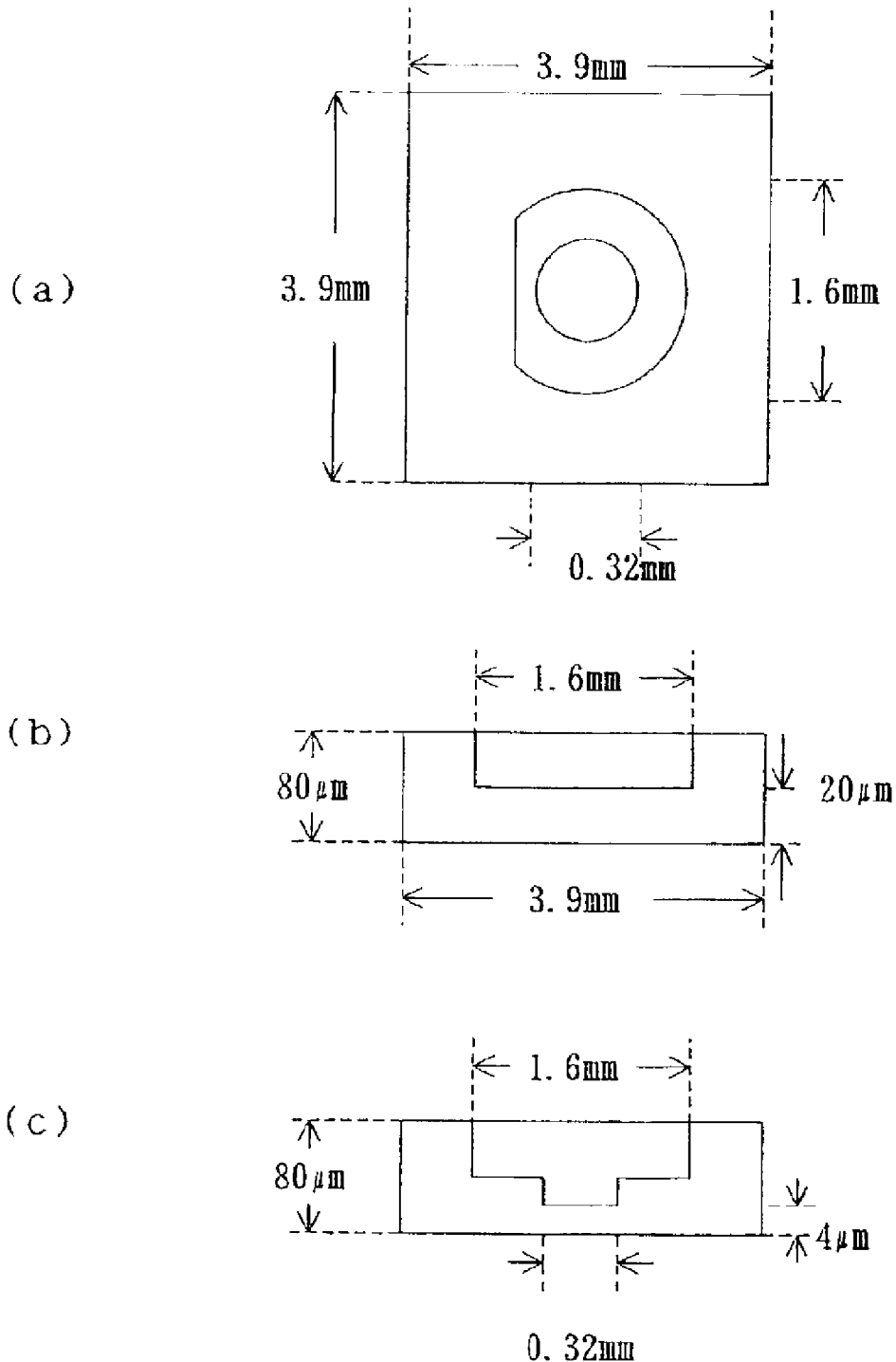

FIGS. 36, 37, 38, and 39 illustrate quartz blank samples of a two stepped single-sided concave shape, which are different from those in FIGS. 32, 33, 34 and 35. In these examples, the quartz wafer is masked and processed by chemical and dry etching to produce massively. These shapes are illustrated in FIGS. 36(*a*), 37(*a*), 38(*a*), and 39(*a*). Initially, an 80 μm thick quartz wafer is masked in the first stage, and one side of the wafer is shaved by 60 μm by chemical etching and dry etching as shown in FIGS. 36(*b*), 37(*b*), 38(*b*), and 39(*b*), and the thickness becomes 20 μm. Then the 20 μm wafer is masked in the second stage, and it is shaved in 16 μm by chemical etching and dry etching as shown in FIGS. 36(*c*), 37(*c*), 38(*c*), and 39(*c*), and the thickness finally becomes 4 μm.

These processes serve to reduce the oscillation part to 4 μm, and have the following merits in addition to those shown in FIGS. 32, 33, 34 and 35.

Figure 38:
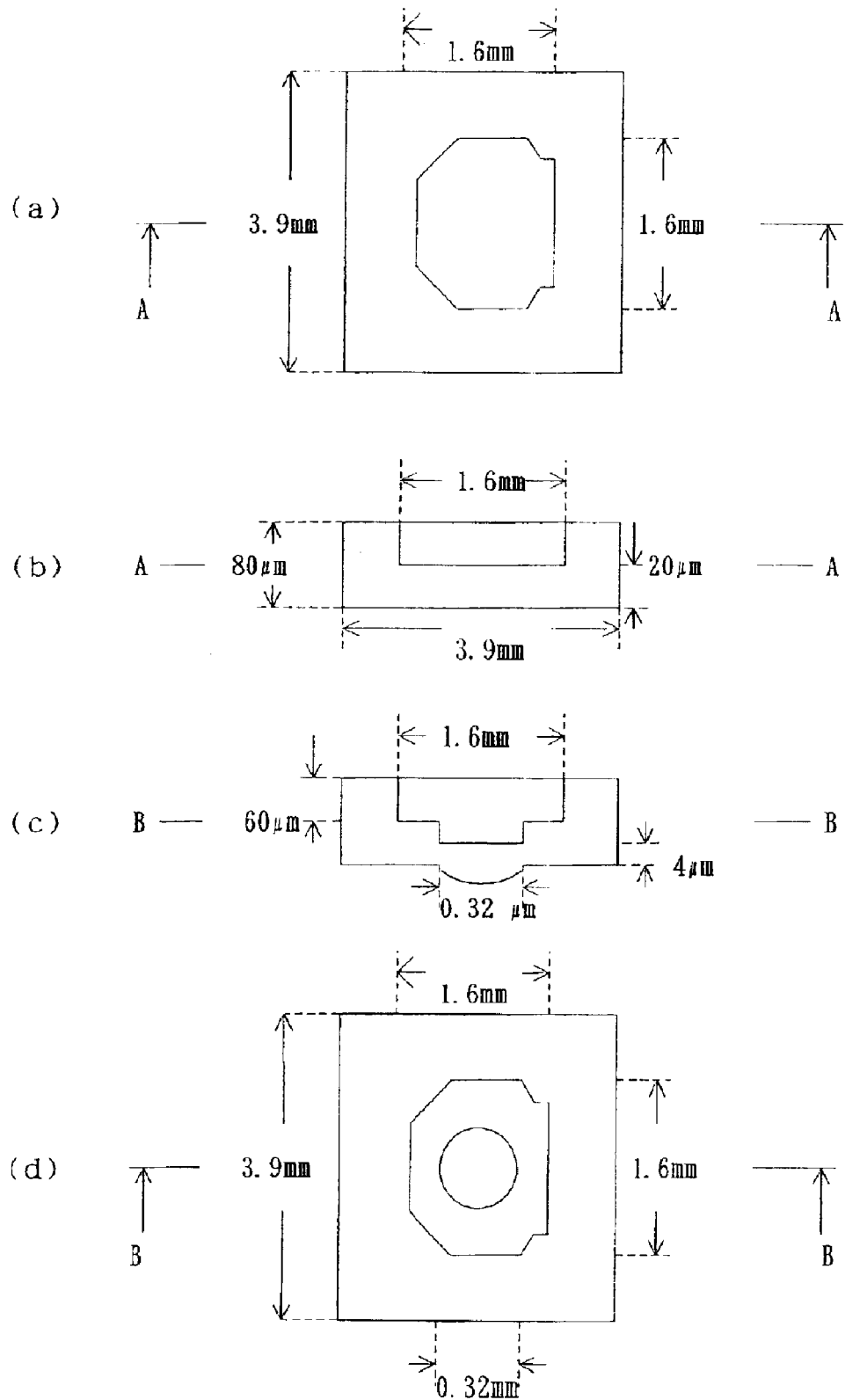
Figure 39:
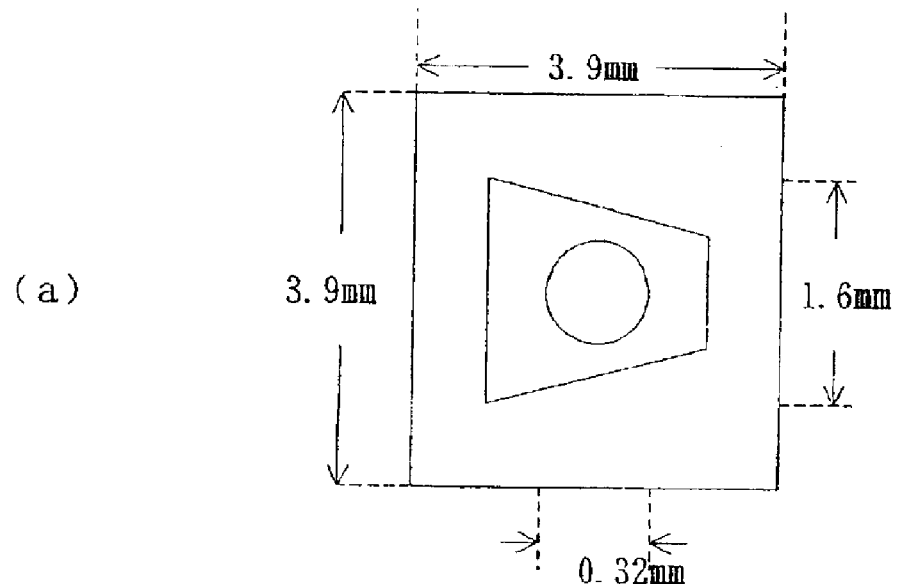
Figure 39:
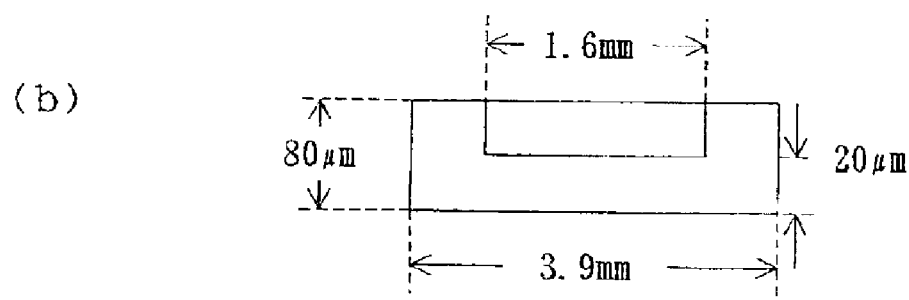
Figure 39:
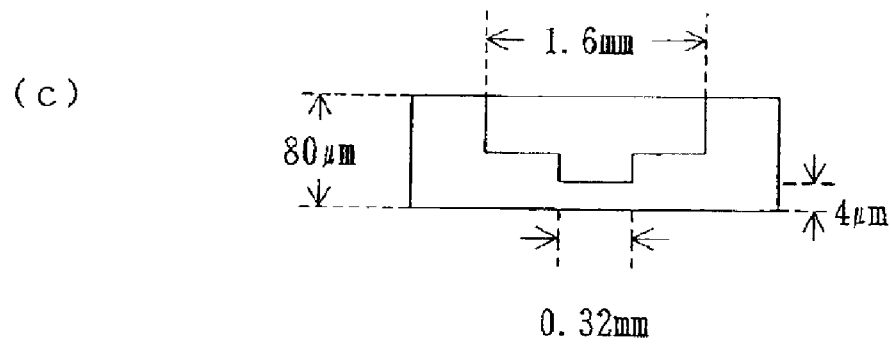

① After this is masked twice or more than two times to make the aperture ratio larger, processed by chemical etching and dry chemical etching, and then mechanically polished as shown in FIG. 2(*a*), the aperture ratio(d/t) becomes approximately 80 and the electrical property is at an optimum. FIG. 38(*c*) illustrates the cross section, and this structure is concave in order to widen the pressure distribution. This concave structure is not plano-convex with a larger curvature, it really becomes like a convex lens similar to concavo-convex or bi-convex shape, which electric property is ideal, and we complete the ultra thin quartz oscillator less than 0.5 μm. For example of BT-cut, the primary frequency of fundamental wave becomes approximately 5.0 GHz. Also, it is possible to use other materials such as AT-cut, SC-cut, FC-cut, IT-cut, and other cuts.

② When the outer region of oscillation part is structured so as to be another concave shape or stepwise, this electrode can be easily made, even if the target diameter of the oscillation part is extremely small.

③ After the chemical etching and dry etching processes are completed, the polishing process to remove the ion damaged layer (changed layer due to the process) is conveniently executed, since the thickness of quartz blank is, step by step, decreasing toward the center.

Figure 40:
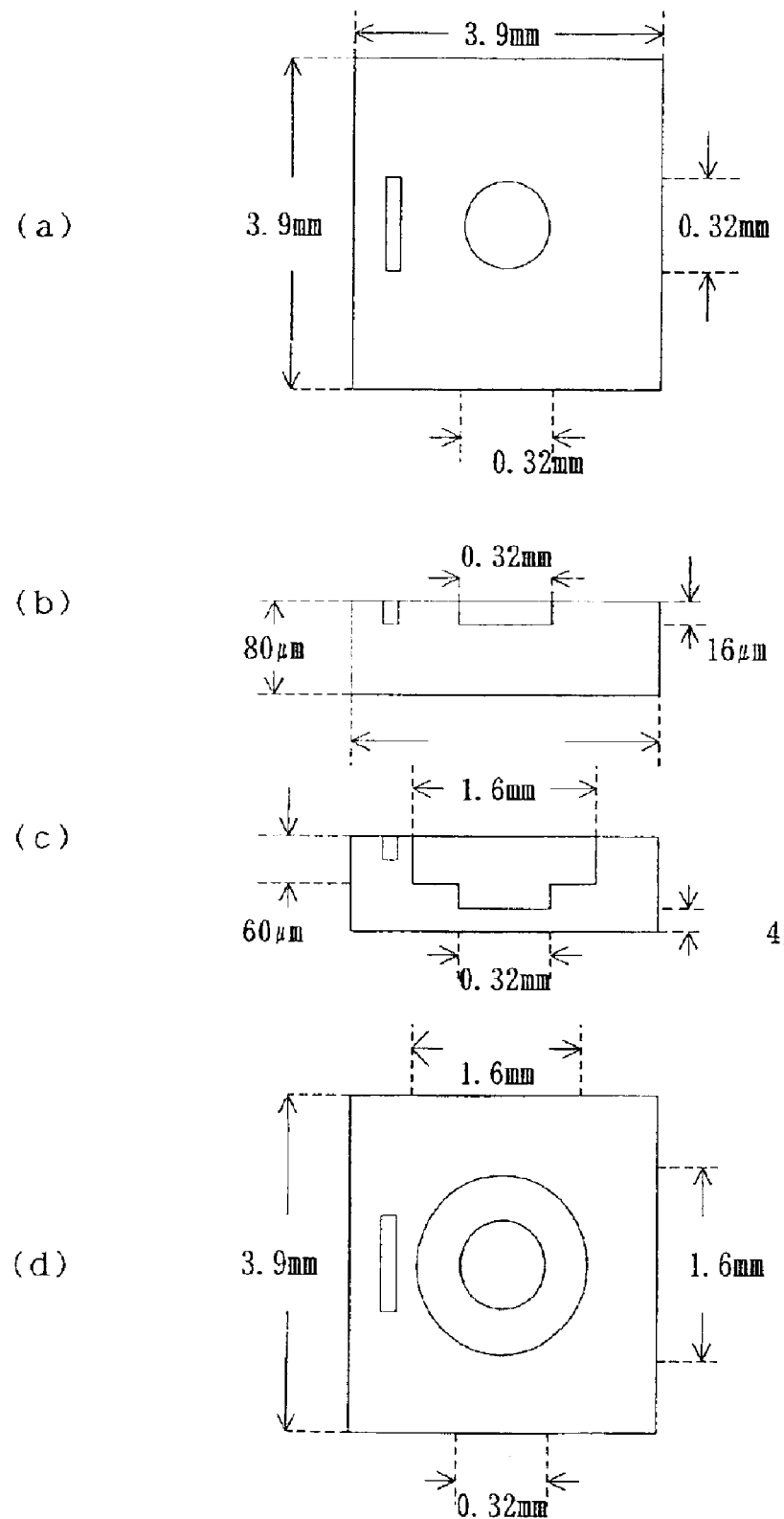
Figure 41:
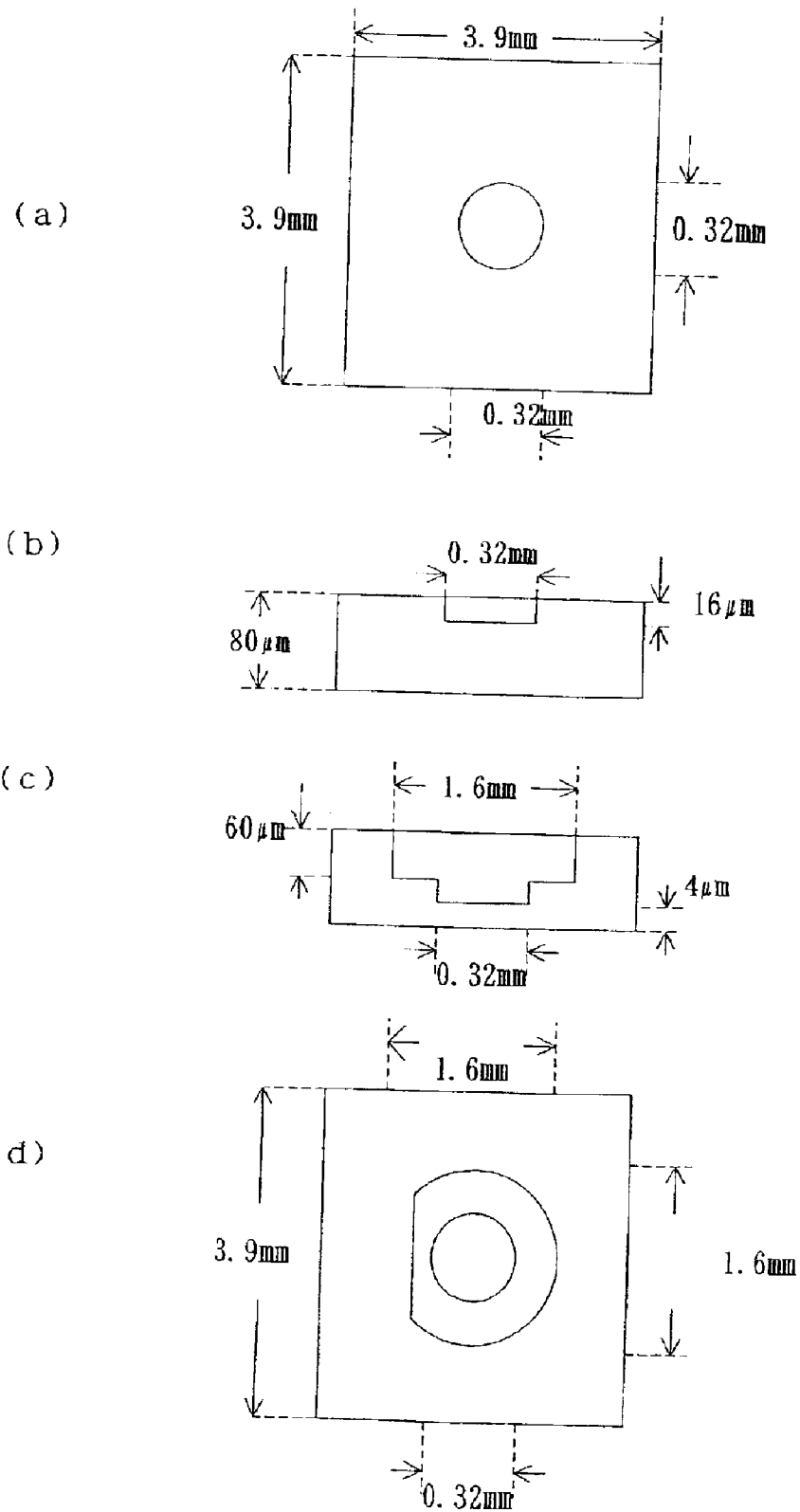
Figure 42:
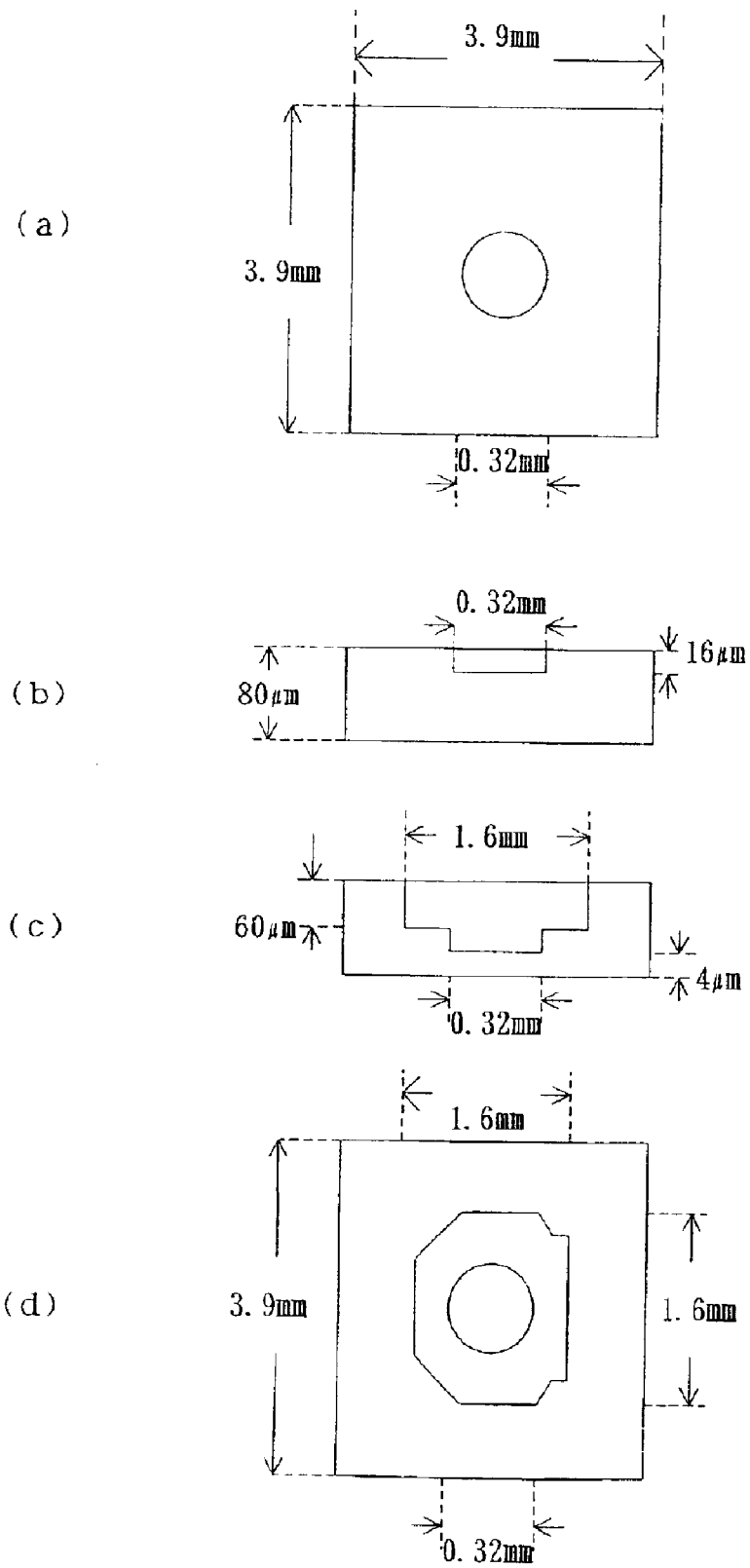
Figure 43:
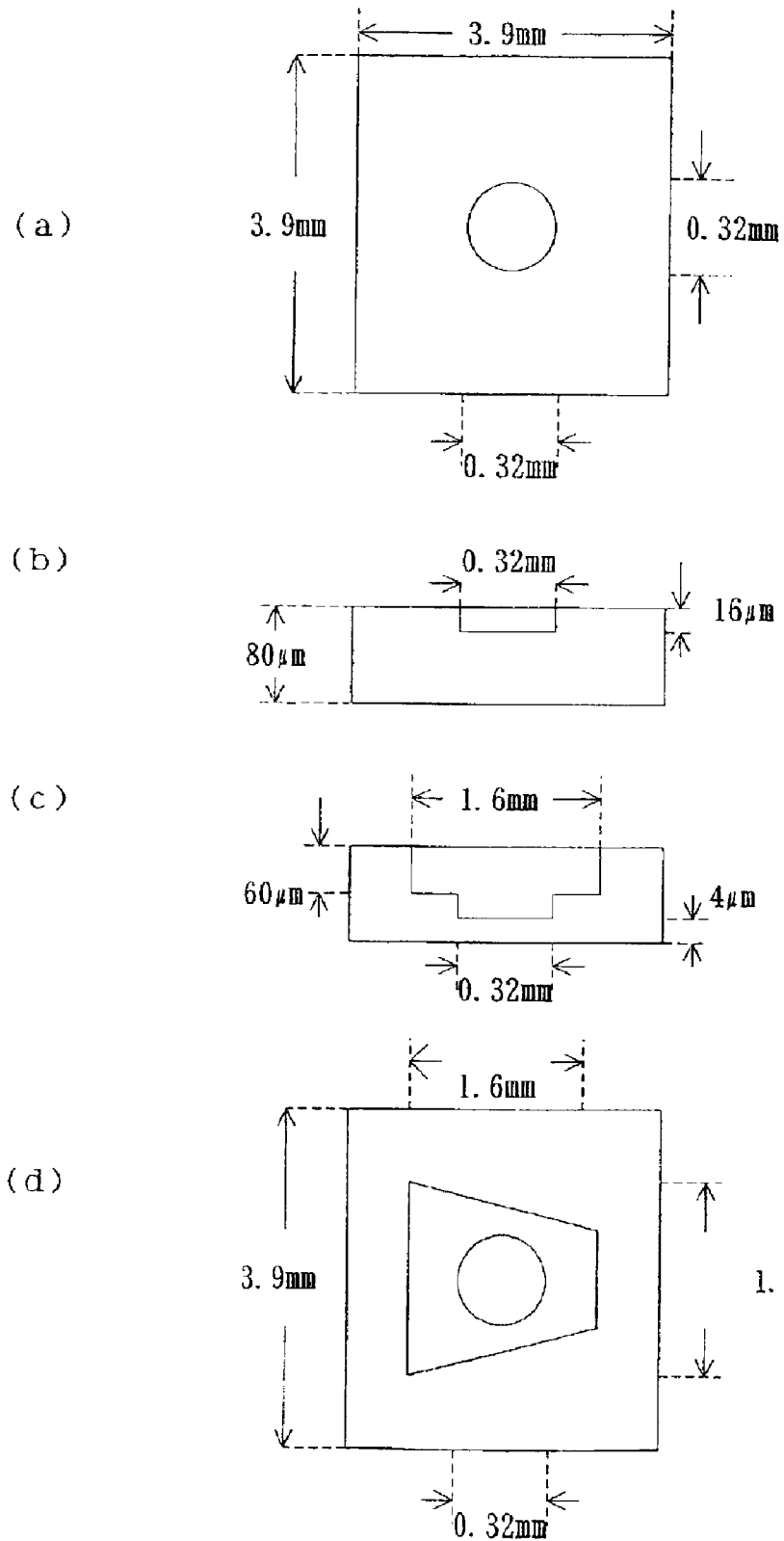

FIGS. 40, 41, 42, and 43 illustrate the manufacturing method of a quartz oscillator in a two-stepped single sided concave shape. As shown in FIGS. 40(*b*), 41(*b*), 42(*b*), and 43(*b*), one surface of 80 μm thick quartz wafer is masked as the first stage, and one side of the wafer, which diameter is 0.32 mm and pure circular (otherwise circular, square, hexagonal or other shape), is shaved 16 μm by chemical etching and dry etching. Then the quartz wafer is masked in the second stage, one side of wafer is shaved 60 μm by chemical etching and dry etching as shown in FIGS. 40(*c*), 41(*c*), 42(*c*), and 43(*c*), where the diameter is 1.6 mm and the shape is circular, square, hexagonal or others, and the thickness becomes 4 μm and the diameter of the oscillation part is 0.32 mm.

Also, the mechanically polished shape as shown in FIGS. 40(*c*), 41(*c*), 42(*c*), and 43(*c*) can remarkably improve the electrical performance, after the chemical etching and dry etching processes are done and the polishing process to remove the ion damaged layer due to the etching is properly executed.

FIGS. 44, 45, 46, and 47 illustrate manufacturing processes of quartz oscillators in two steps double-sided grooved types.

Figure 44:
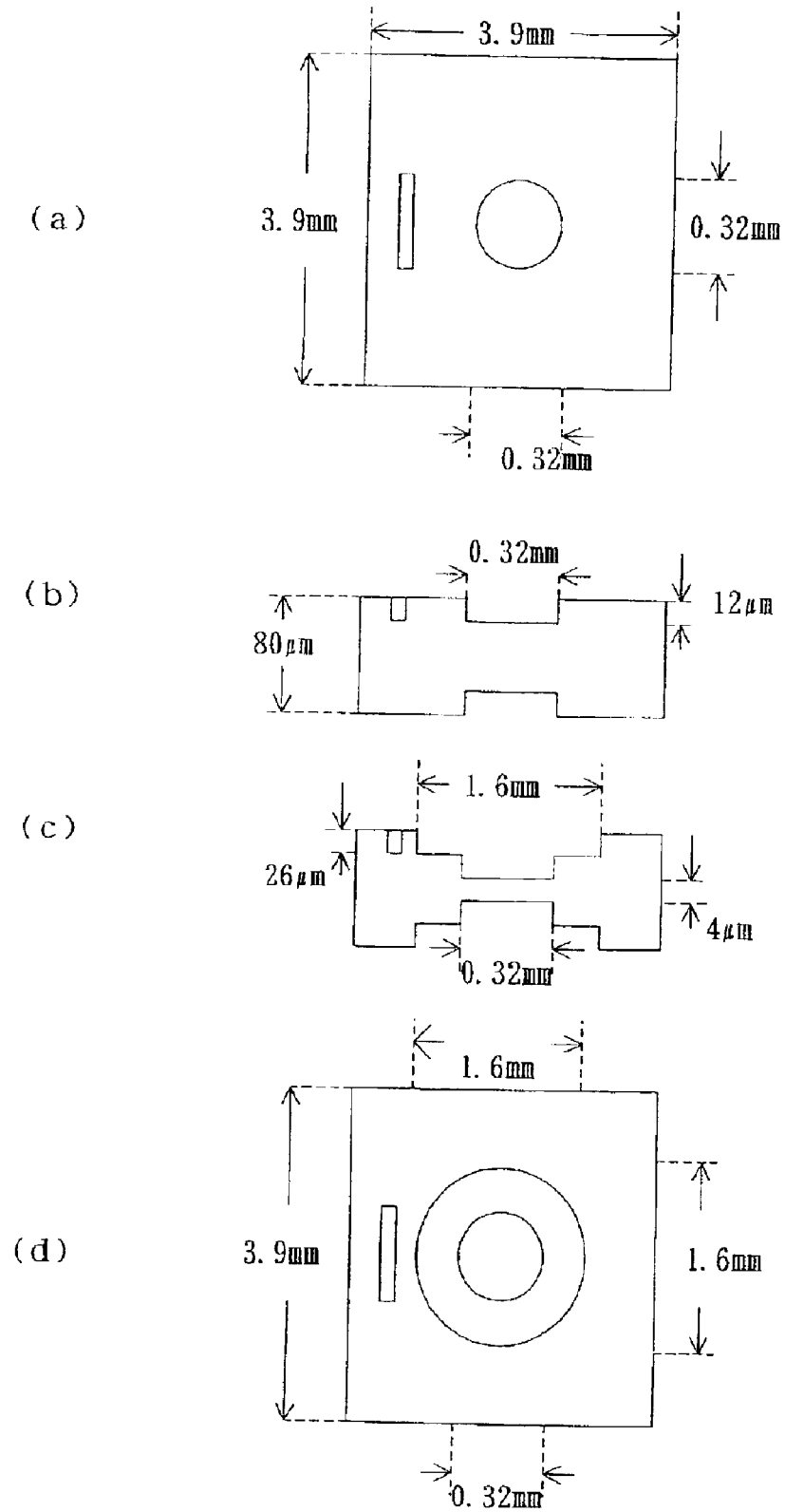
Figure 45:
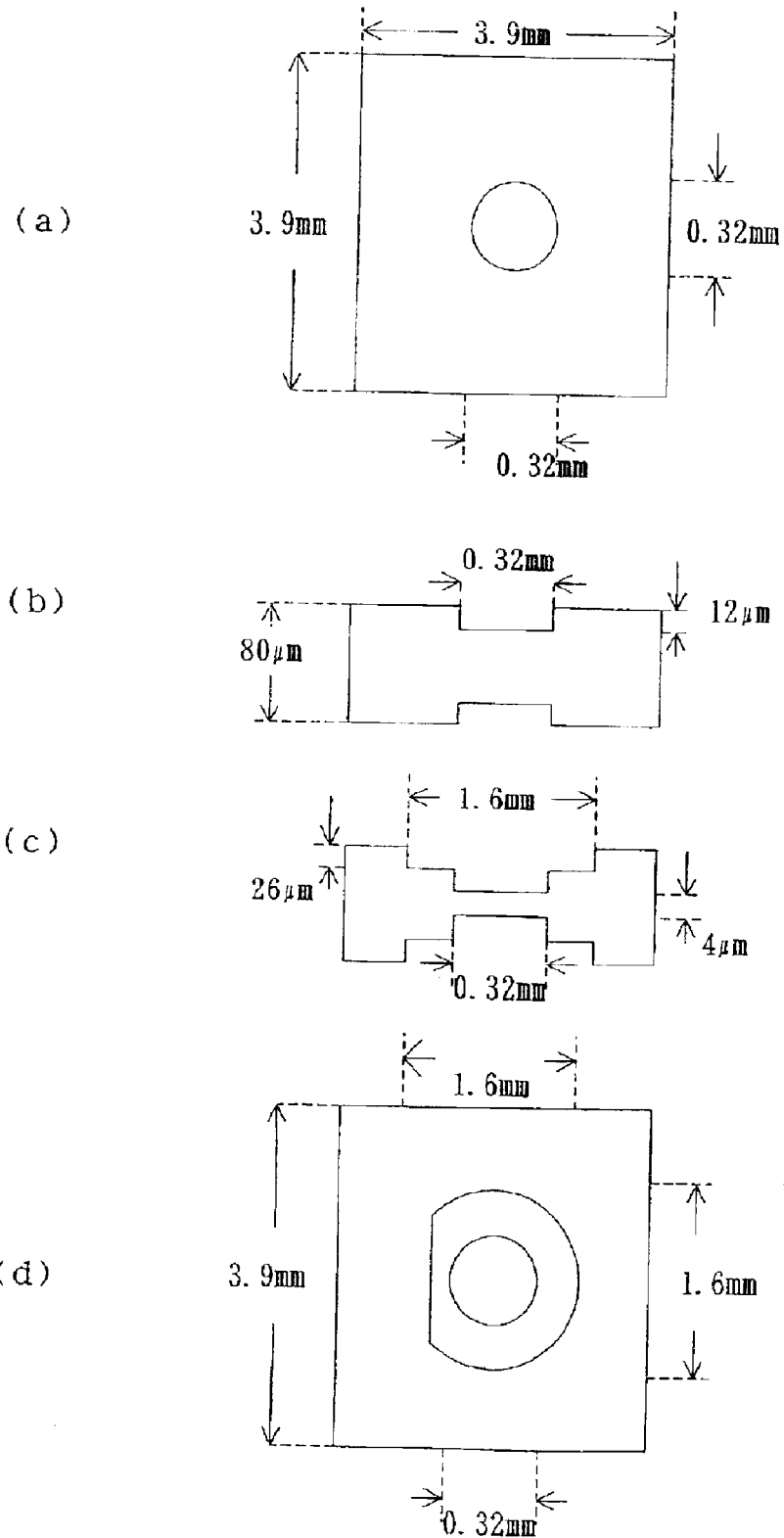
Figure 46:
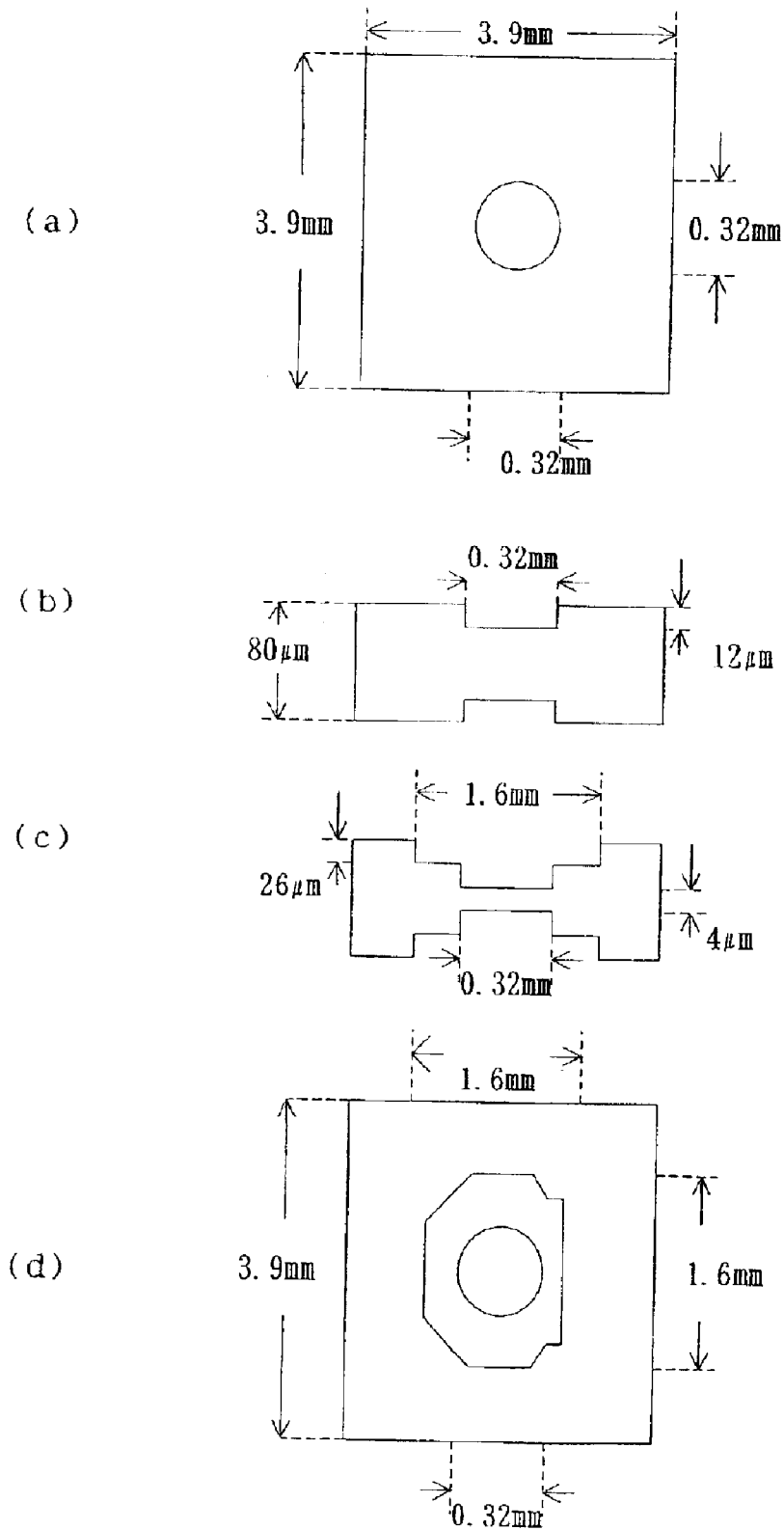
Figure 47:
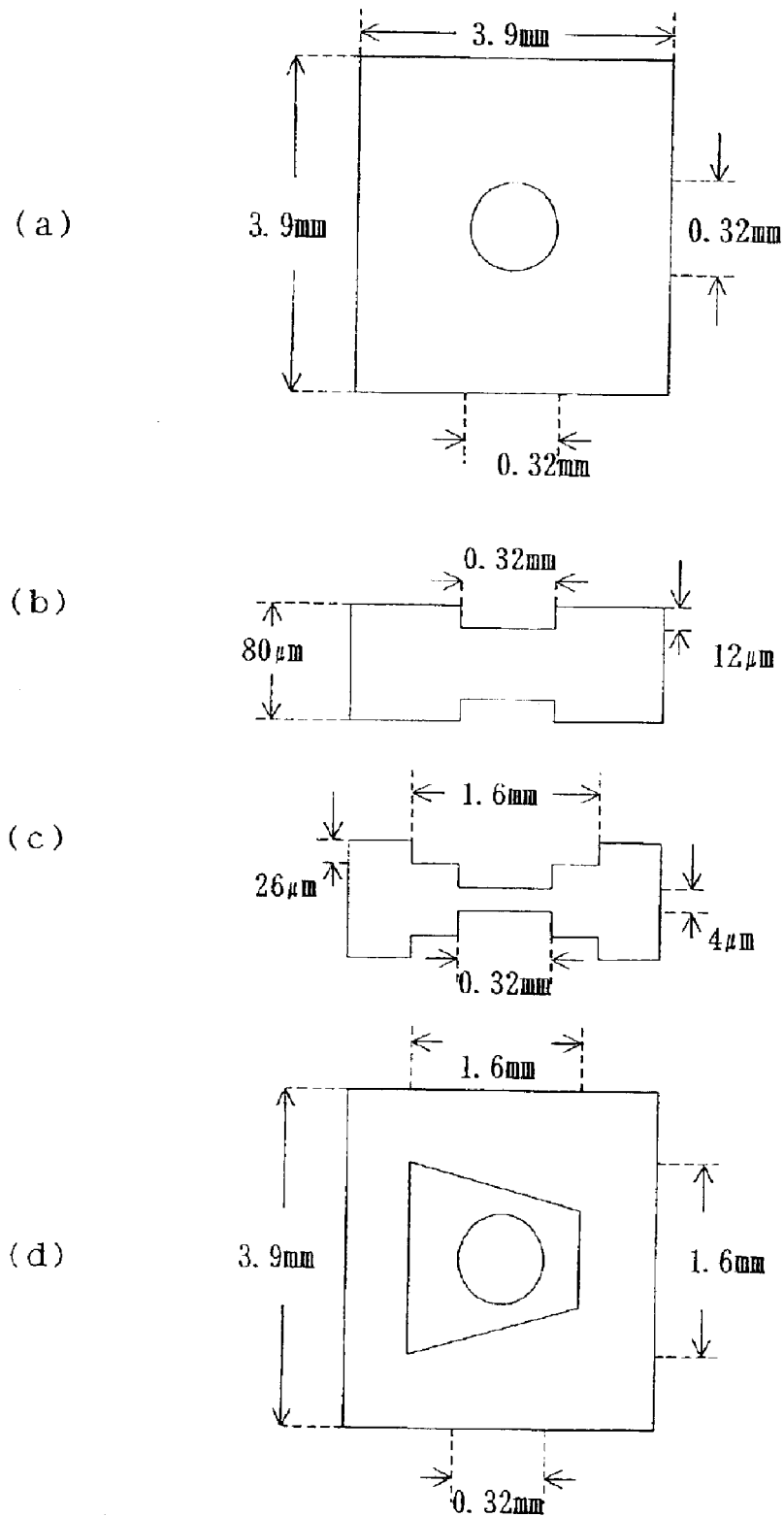

As shown in FIGS. 44(*b*), 45(*b*), 46(*b*) and 47(*b*), one surface of 80 μm thick quartz wafer is masked in the first stage, and one side of the wafer, which diameter is 0.32 mm and pure circular (otherwise nearly circular), is shaved 12 μm by chemical etching and dry etching. Then the quartz wafer is masked in the second stage, and both sides of the wafer are shaved 26 μm by chemical etching and dry etching as shown in FIGS. 44(*c*), 45(*c*), 46(*c*), and 47(*c*), where the diameter is 1.6 mm and the shape is circular, square, hexagonal, or others. The thickness becomes 4 μm and the diameter of the oscillation part is 0.32 mm.

Figure 48:
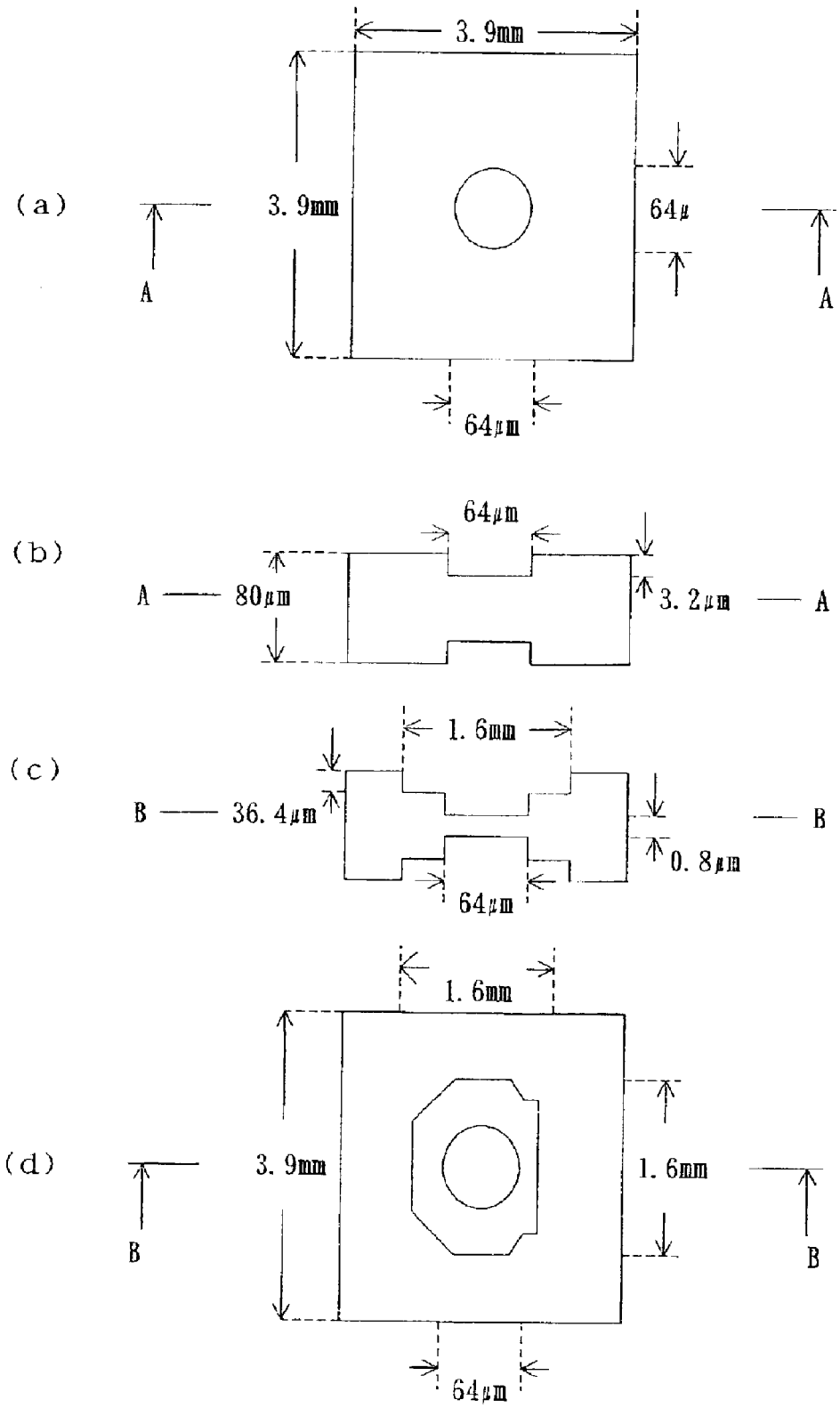
Figure 49:
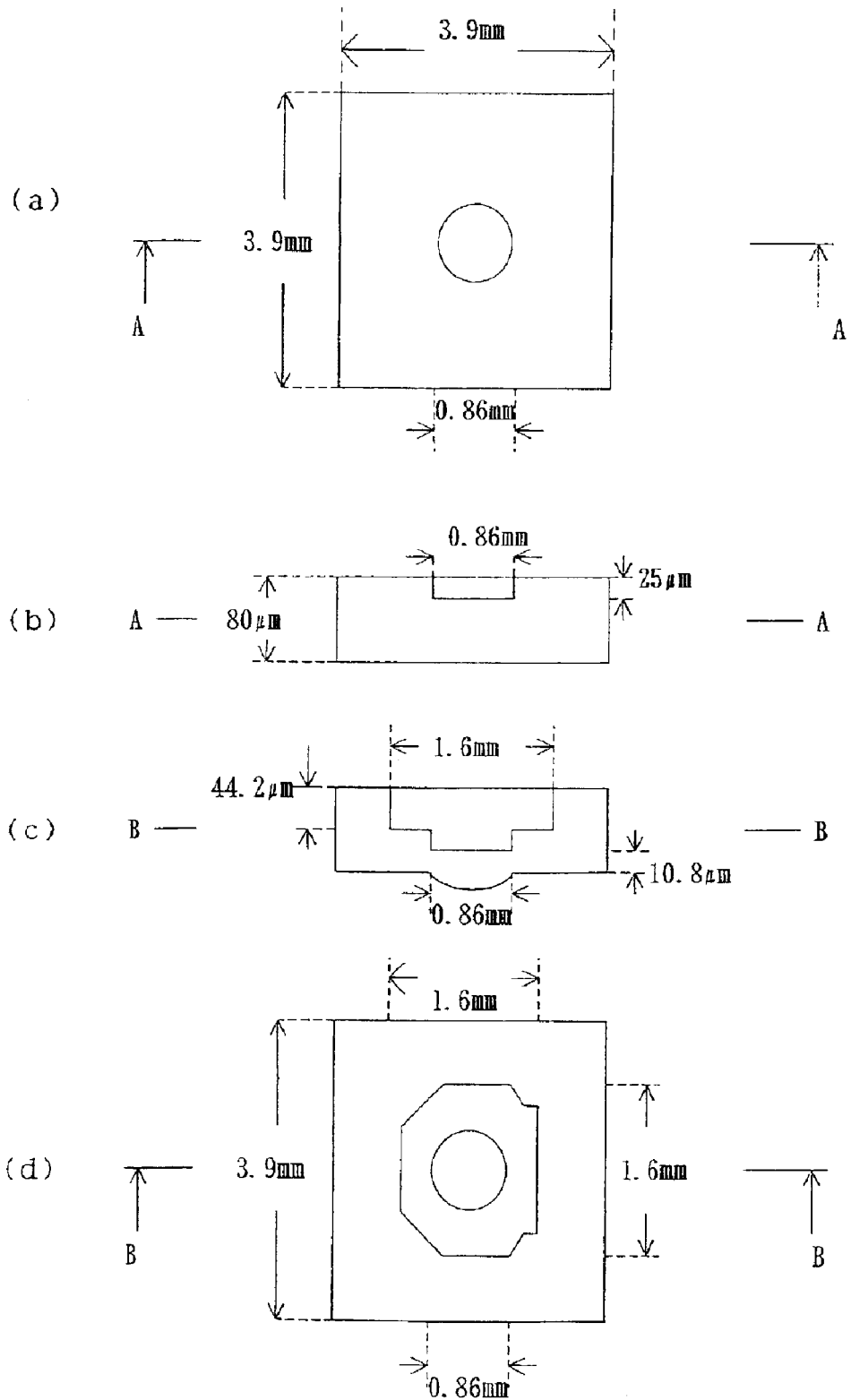
Figure 50:
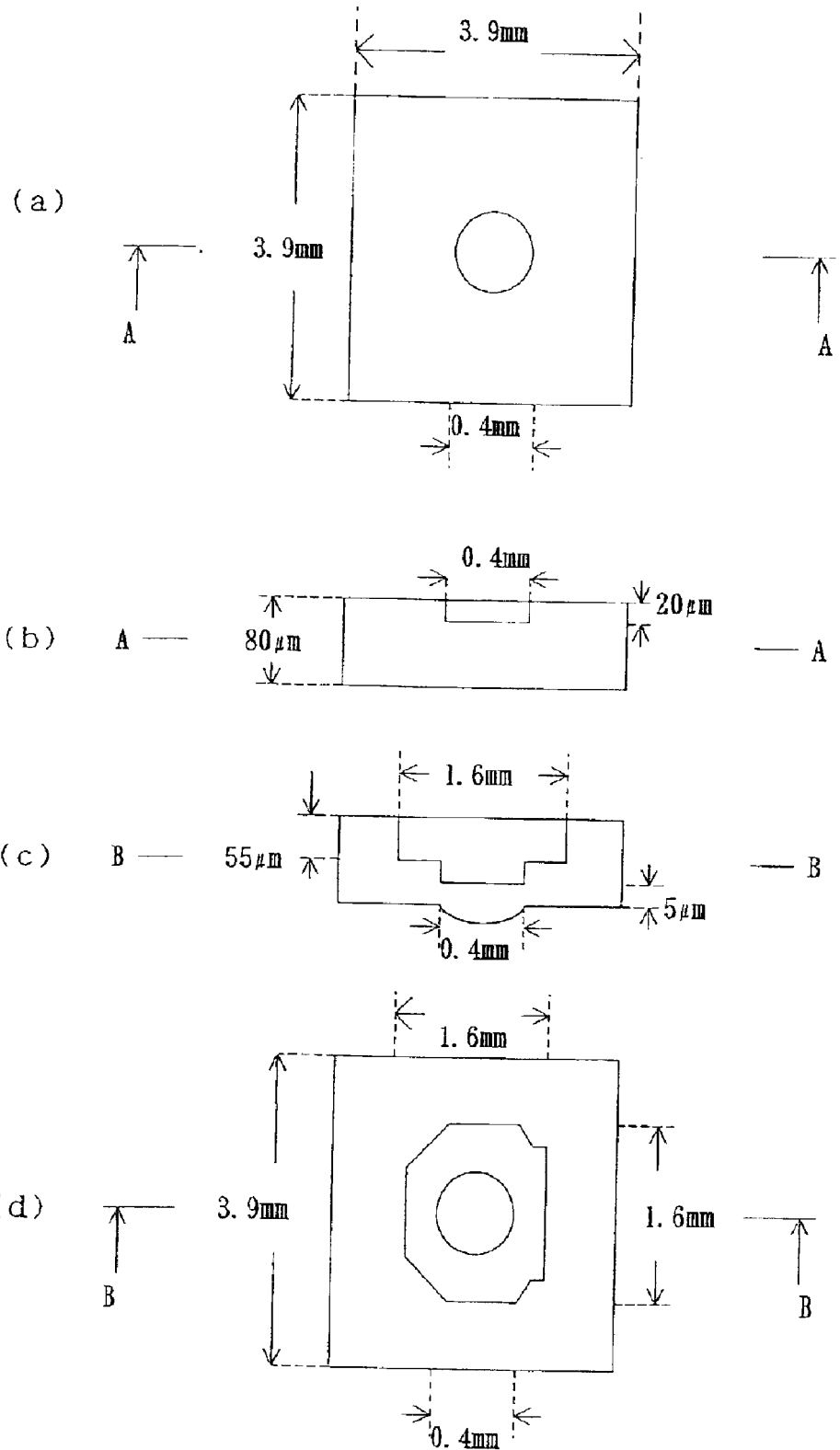
Figure 51:
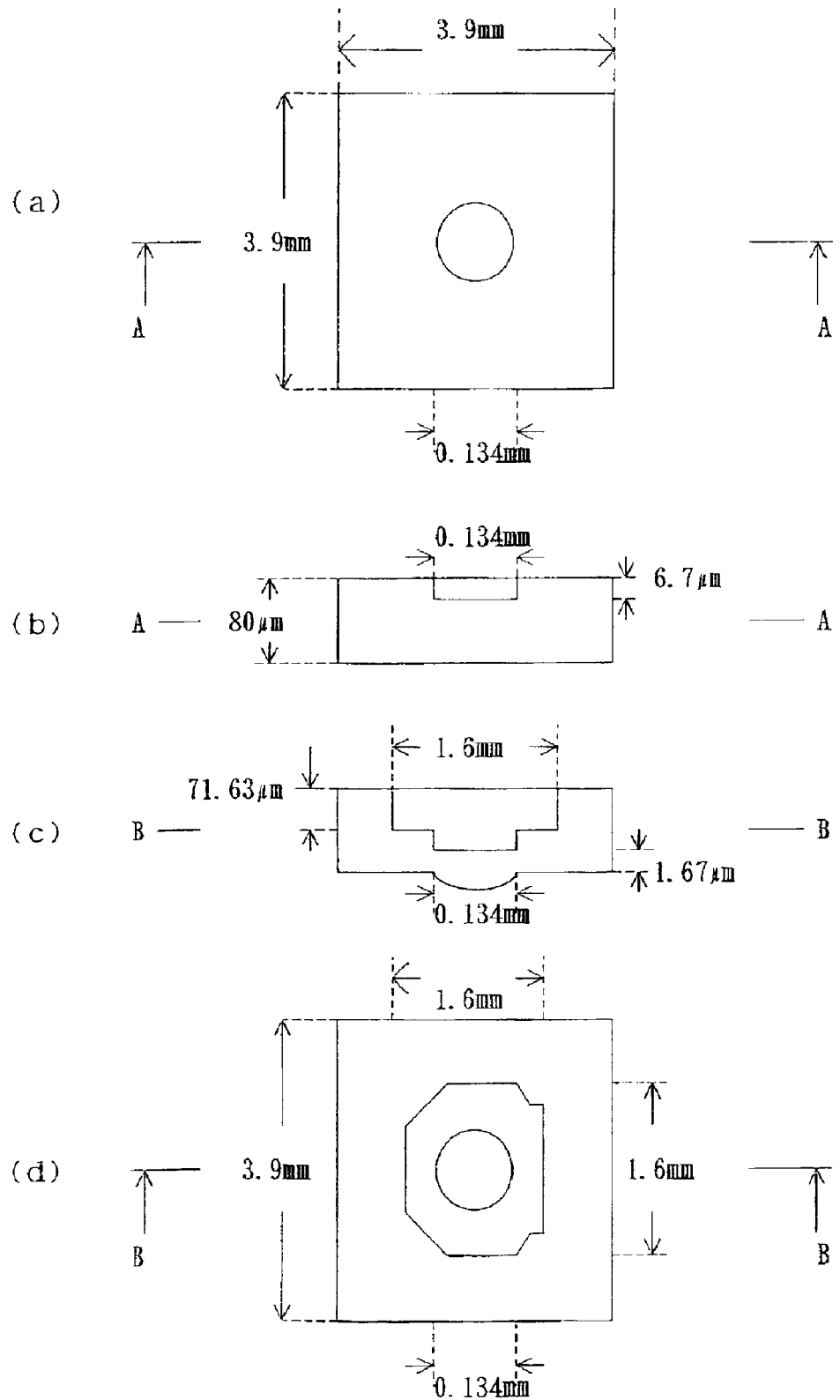
Figure 52:
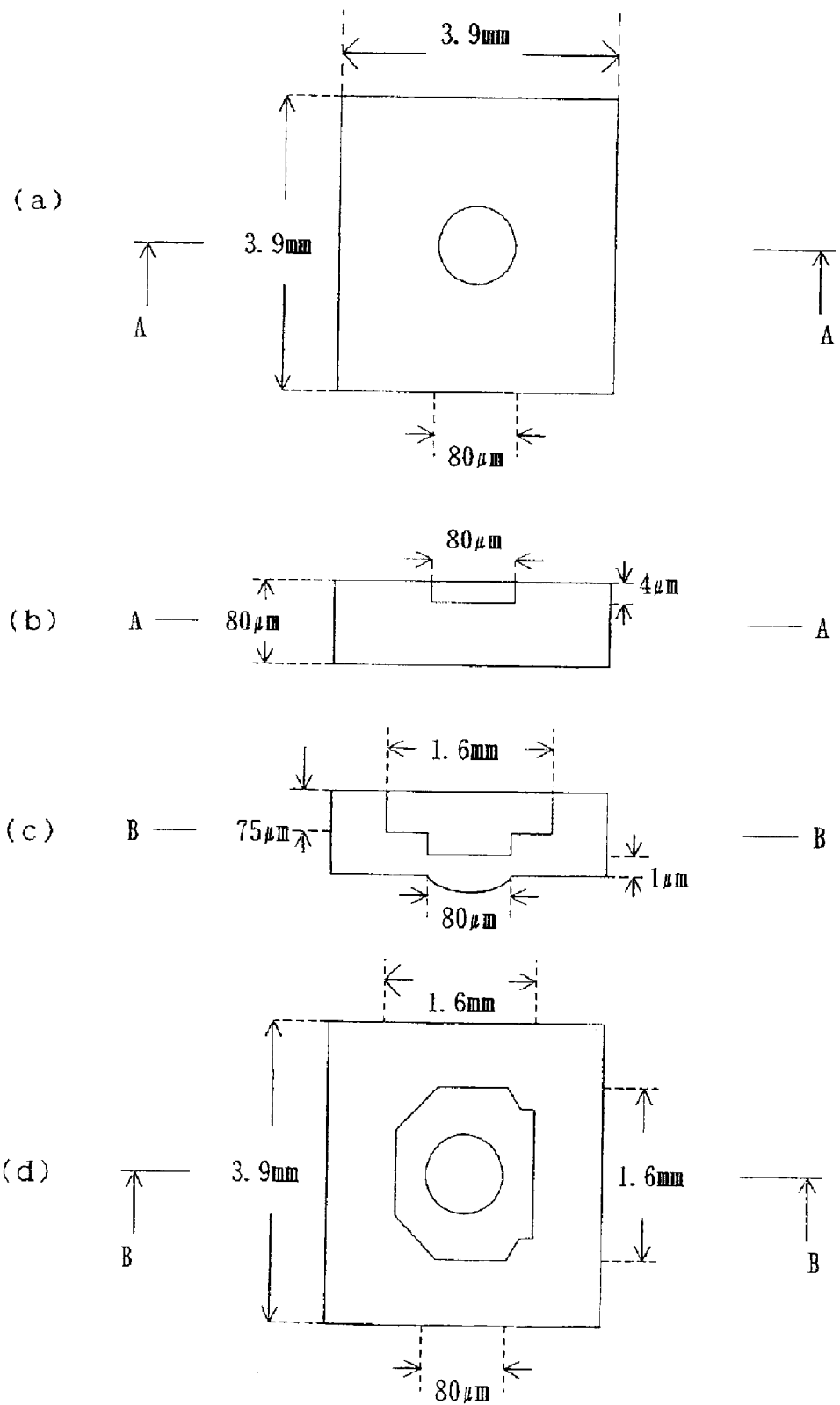
Figure 53:
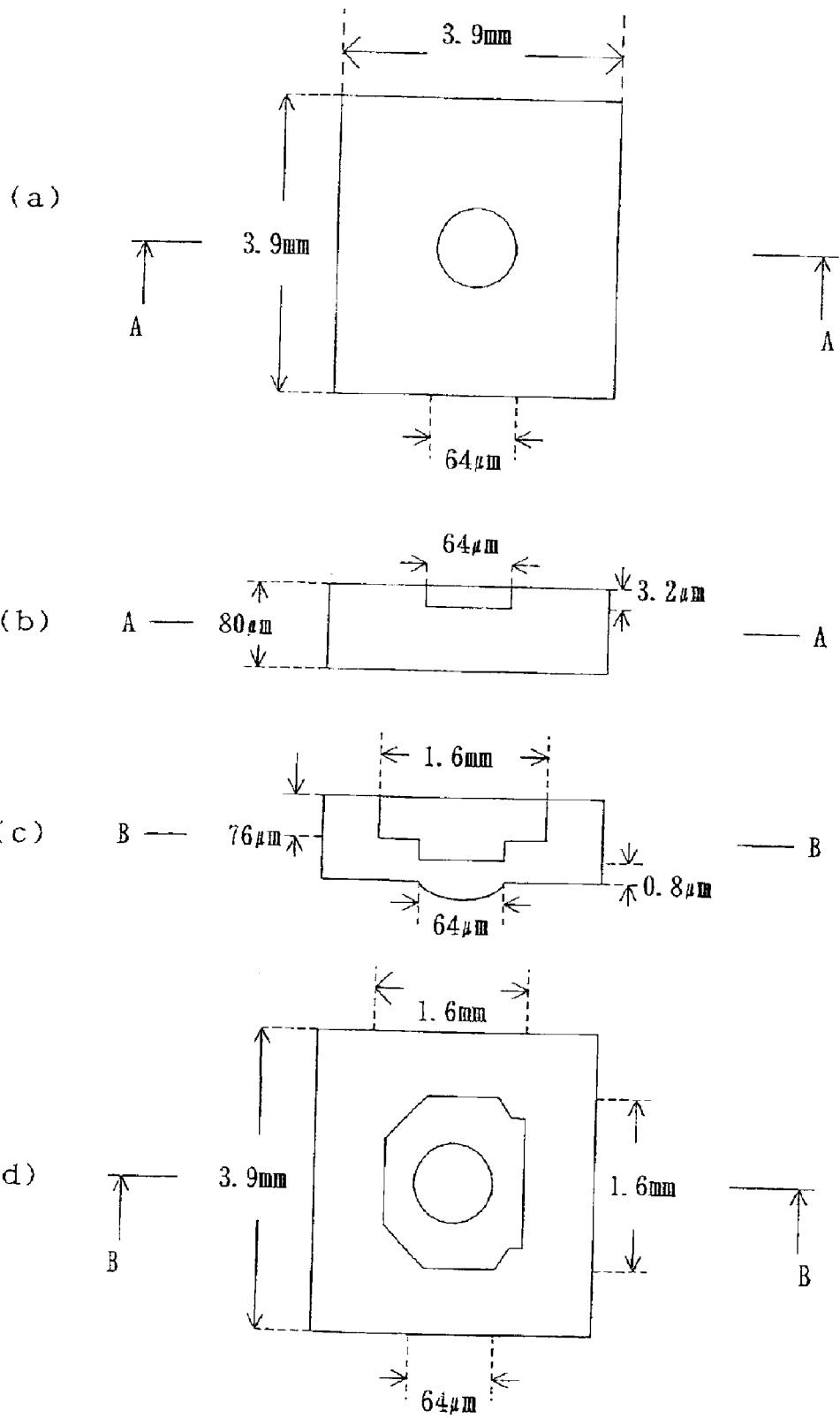

FIG. 48 illustrates an optimum dimension diagram, in which the oscillation part becomes 0.8 μm. In the case of AT-cut, the 0.8 μm thickness of the oscillation part means to complete a quartz oscillator of 2.1 GHz approximately. Then the next hand phone will becomes extremely small.

The oscillation part becomes the shape as shown in FIGS. 44(*c*), 45(*c*), 46(*c*), 47(*c*), and 48(*c*), after the chemical etching, dry etching and mechanical polishing process by a dual-face polishing machine (polishing table) and other polishing means to remove the damaged layer due to the etching. In this case, since the oscillation part of the quartz blank becomes stepwise and the oscillating diameter is large as illustrated in FIGS. 44(*c*), 45(*c*), 46(*c*), 47 and 48(*c*), the polishing agent such as cerium oxide can smoothly penetrate from both sides during the polishing process by the polishing table, barrel polishing machine, or ultrasonic polishing method. Therefore, the mechanical polishing process becomes efficient, and the electric performance of the quartz oscillator becomes ideal.

Here the following three problems occur during mass production.

① From the result of the examination, when a single-sided grooved type oscillator with two steps is processed to be piano-convex shape, the optimum aperture ratio (d/t) is approximately 80.

② The dimension of the blank is bigger than 1 inch ×1 inch, and the thickness becomes larger than 80 μm.

③ The quartz crystal is anisotropy, and the anisotropy appears when the chemical etching shaves more deeply than 1/20 of the oscillation diameter.

In order to clear these three problems, two chemical etching processes in FIGS. 49, 50, 51, 52, and 53 are employed by the relative etching process. At first, the central oscillation part with a small diameter is etched, and secondly, the second oscillation part (the second groove) with larger diameter is etched.

FIGS. 49, 50, 51, 52, and 53 illustrate shapes and dimensions that satisfy the above conditions. When the quartz oscillator in a two-stepped single-sided concave shape is made by a pressurized polishing process from both sides with the dual-face polishing machine or a one-face polishing process, the planar surface which is at the opposite side of the chemical etching becomes a convex lens shape nearly as plano-convex, concavo-convex, or bi-convex, which is ideal for the electric performance.

Figure 54:
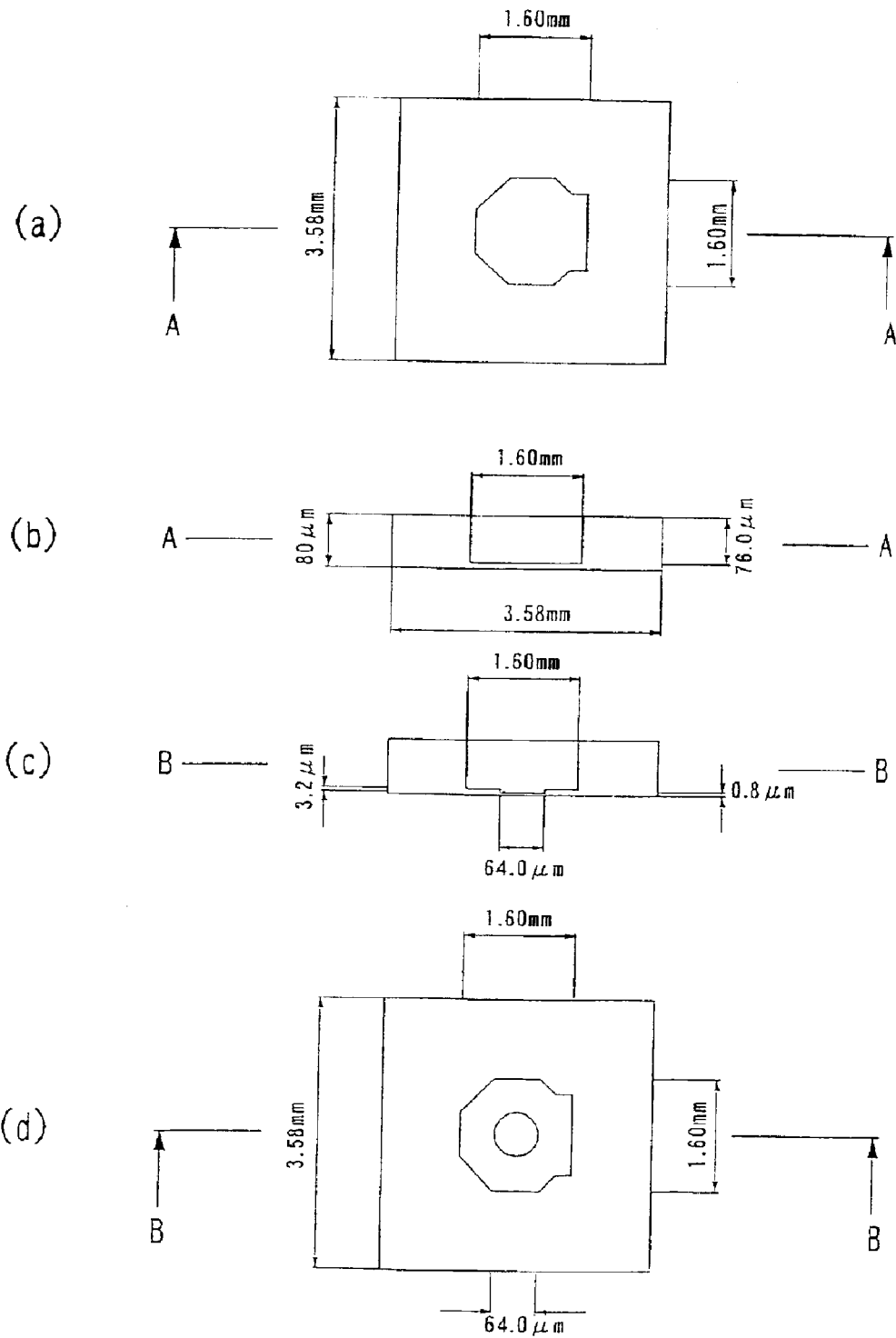
Figure 55:
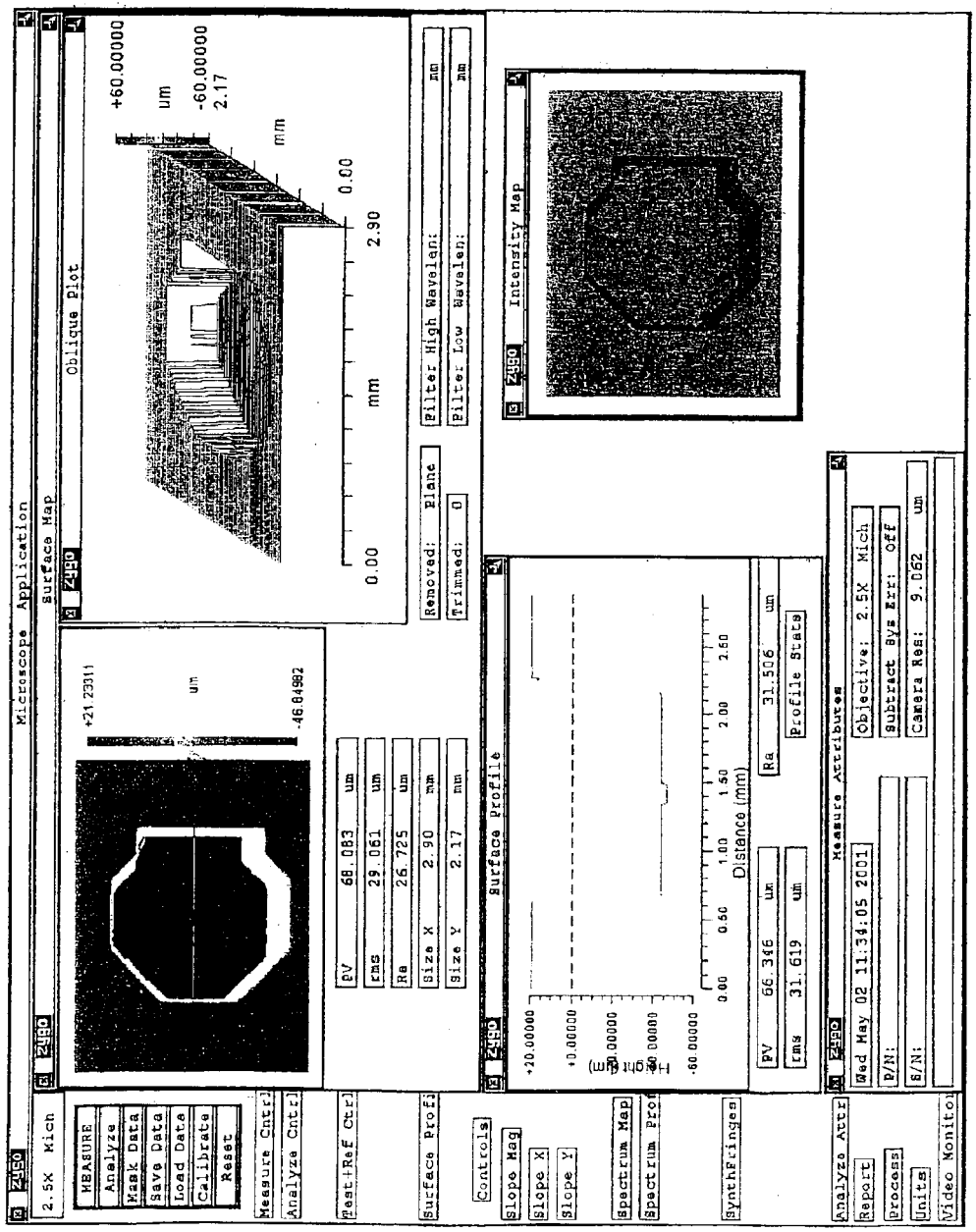
FIG. 55 shows a shape measurement diagram of manufactured quartz oscillator sample 1 with two steps single-sided concave type, which is measured by an interference microscope (laser interferometer).
Figure 56:
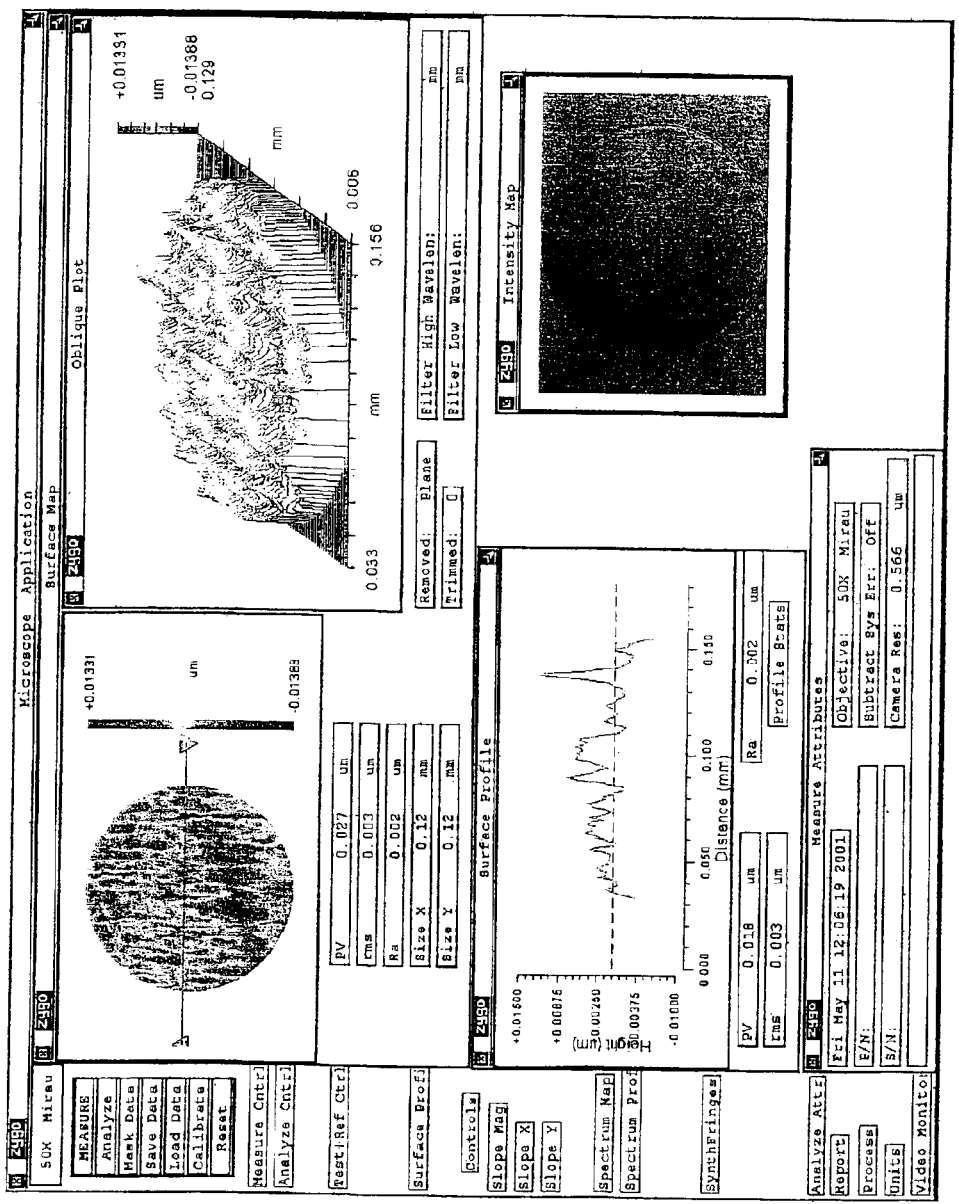
FIG. 56 illustrates a shape measurement diagram of manufactured quartz oscillator sample 1 with two steps single-sided grooved type, which is enlarged by an interference microscope.

FIGS. 55 and 56 illustrate the first shape example of two steps single-sided concave quartz oscillator, which were measured by an interference microscope, after the oscillator was made on the basis of the manufacturing diagram in FIG. 54. When the peak to valley of the surface profile is shown in FIGS. 55 and 56, the surface is manufactured to be as accurate as approximately 0.002 μm roughness. Also, the shape accuracy is made to be almost purely circular. Furthermore, measured data in FIG. 56 shows that the parallel accuracy is around 0.02 μm thick at the center of the first oscillation part, however this does not affect the electrical performance of the quartz oscillator.

Figure 57:
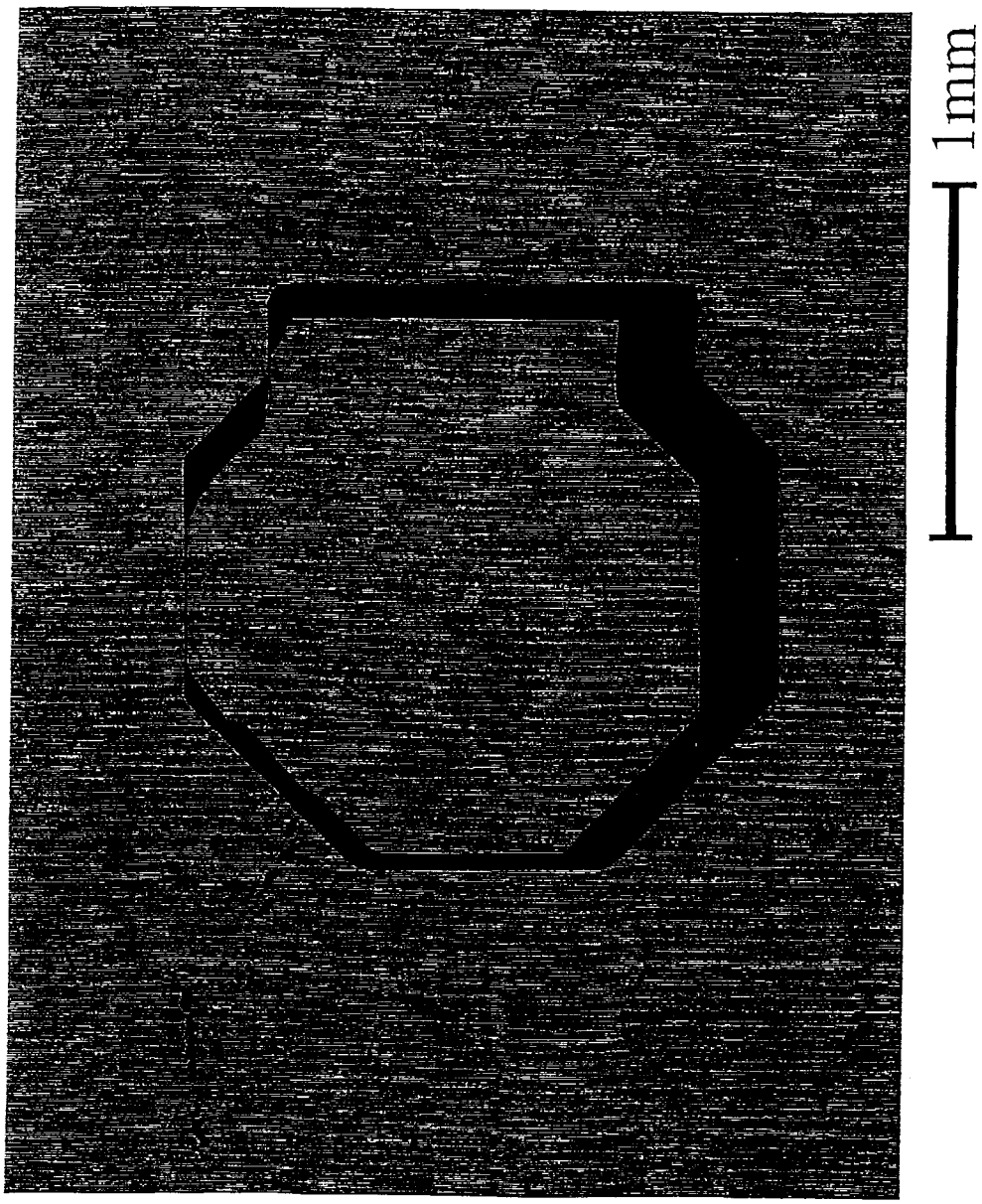
FIG. 57 illustrates a photograph (Normanski micrograph or differential interference micrometer) of manufactured quartz resonator sample 1 with two steps single-sided grooved type in FIGS. 55 and 56.

FIG. 57 shows the first photo sample (Normanski microgram) of two steps single-sided grooved type quartz oscillator in FIGS. 55 and 56. Based on the photograph in FIG. 57, the quartz anisotropy is said not to be observed.

Figure 58:
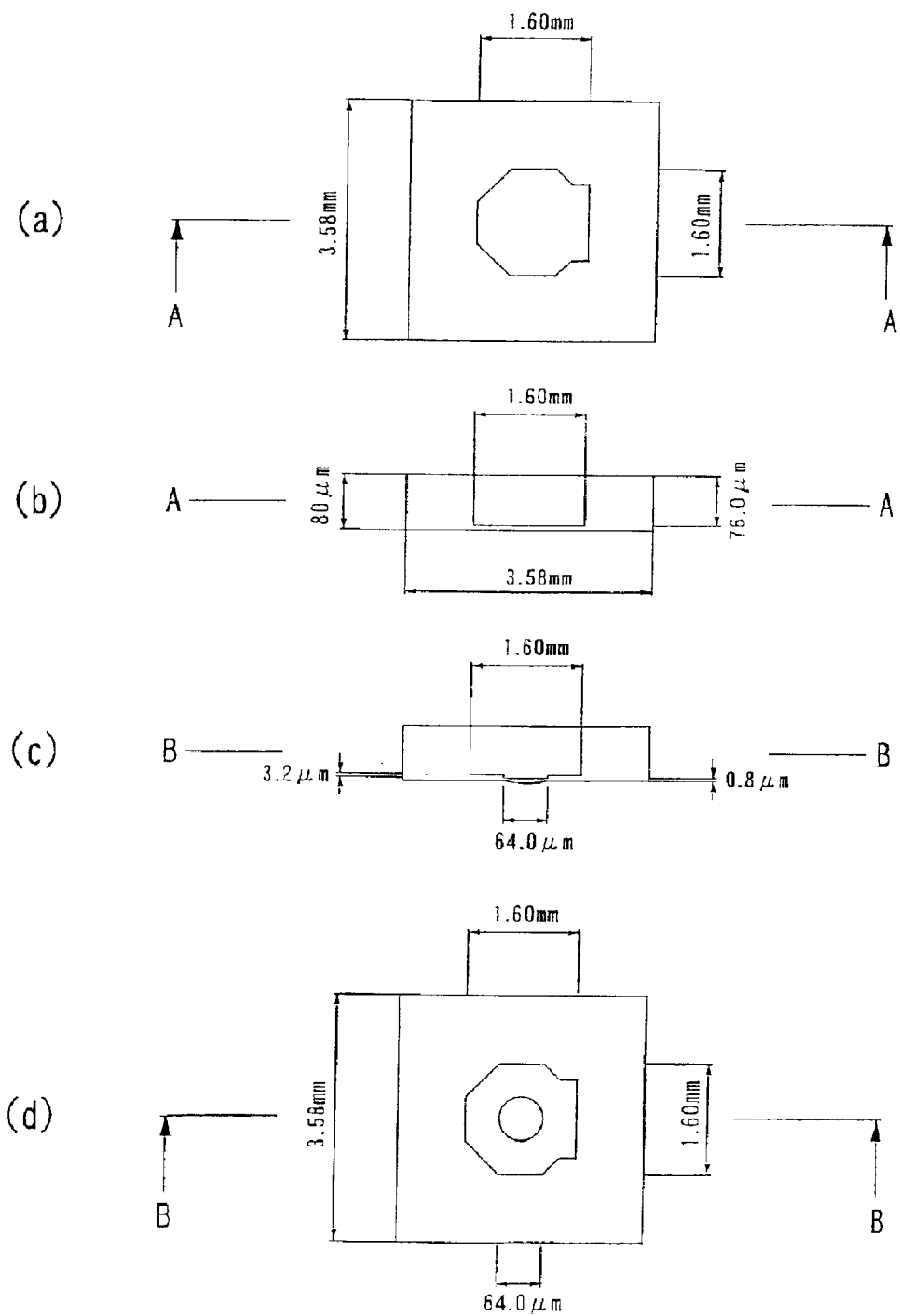
FIGS. 58 and 59 respectively illustrate upper diagrams and cross section diagrams of real quartz oscillator (resonator) samples in the present invention.

FIG. 58 shows the changing state to the convex lens shape of the first oscillation part in FIG. 58(*c*), wherein the quartz oscillator in FIG. 54(*c*) is made by pressurizing from both sides.

Figure 59:
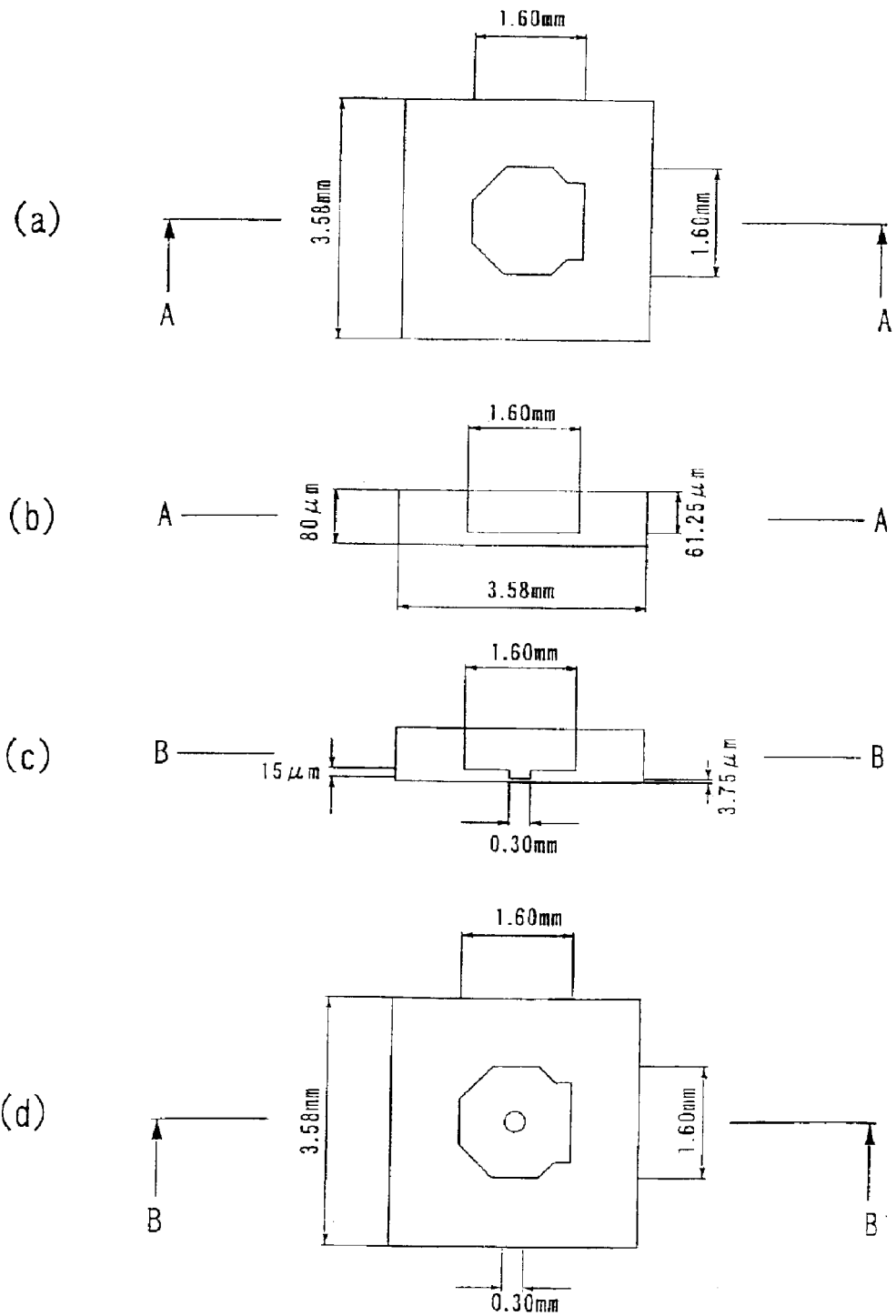
Figure 60:
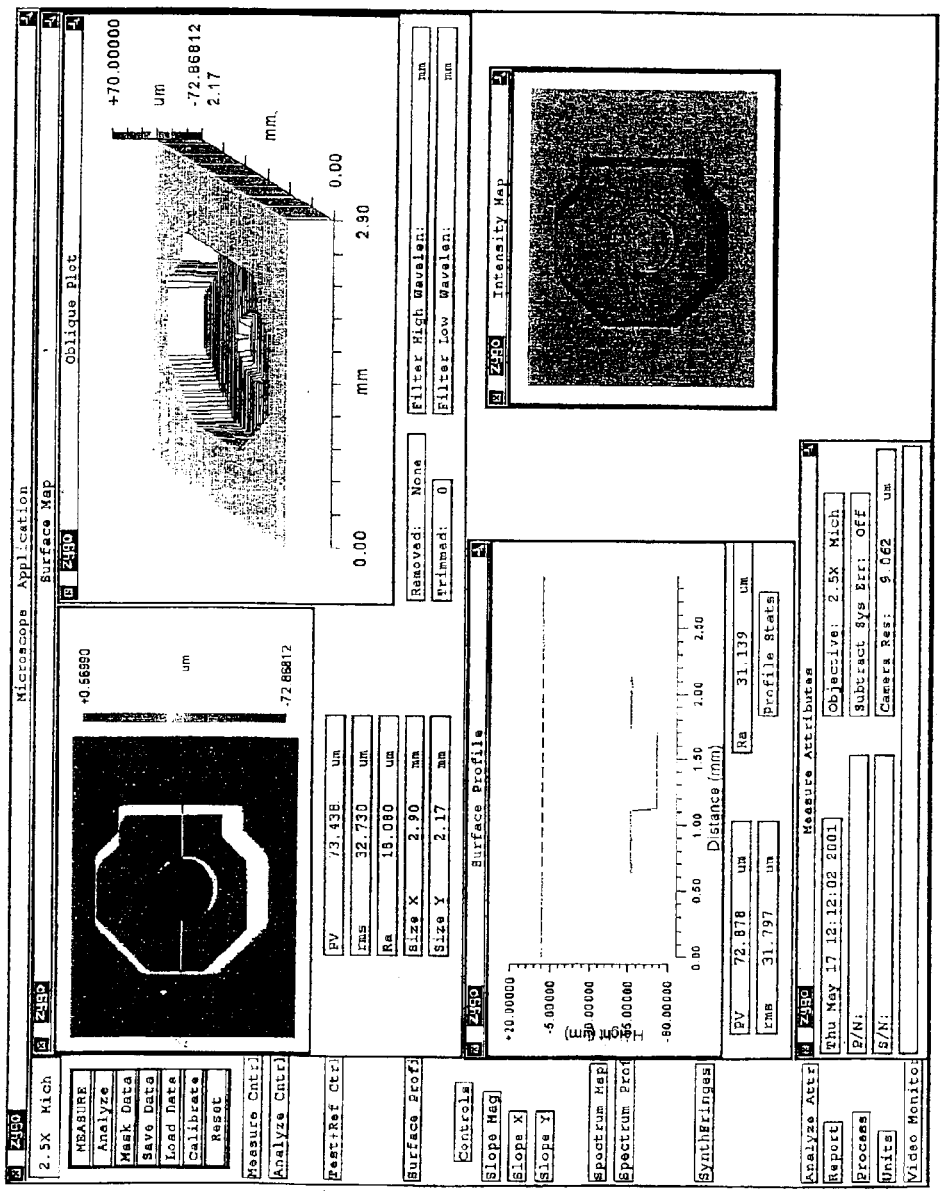
FIG. 60 illustrates a shape measurement diagram of manufactured quartz resonator sample 2 with two steps single sided concave type, which is studied by an interference microscope.
Figure 61:
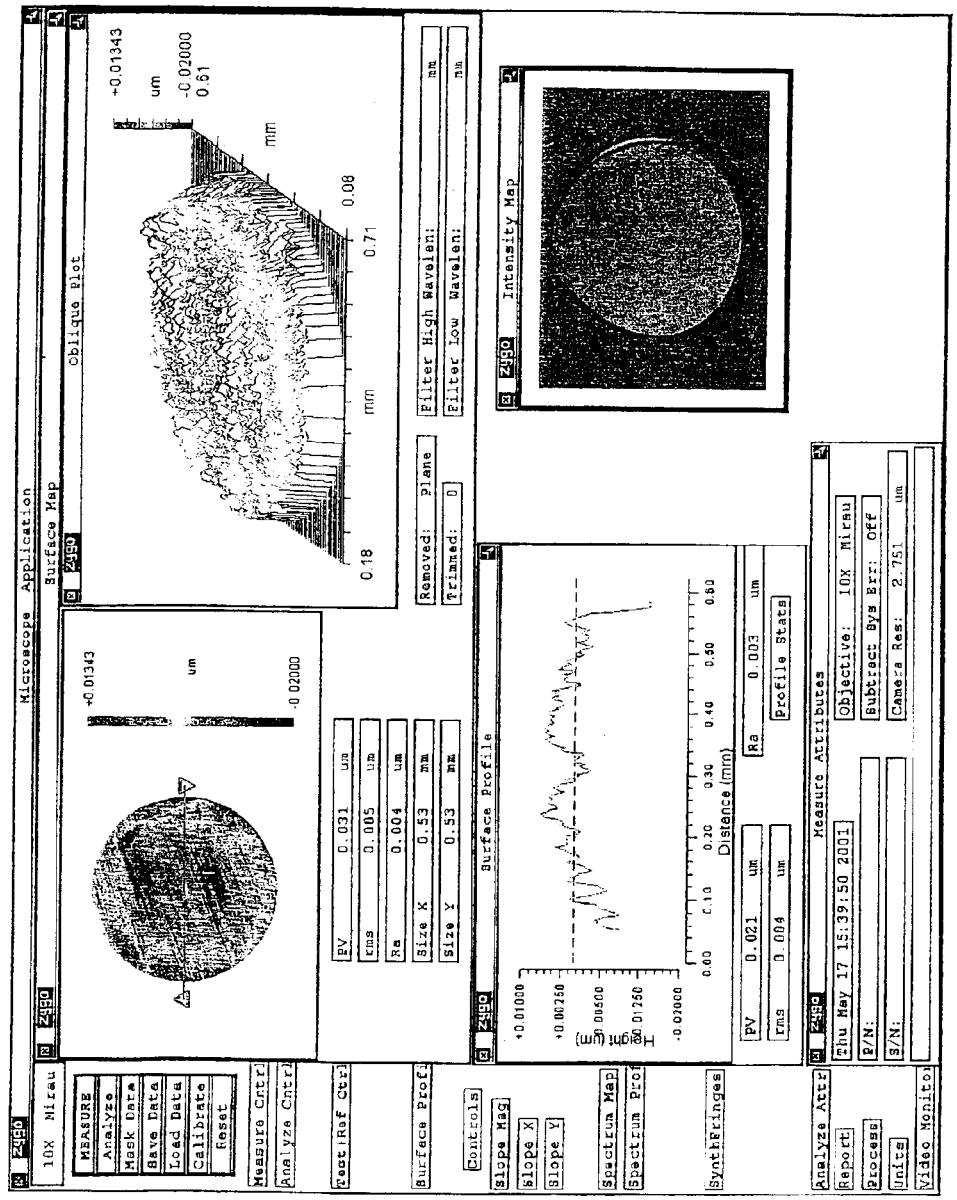
FIG. 61 illustrates a shape measurement diagram of manufactured quartz resonator sample 2 in FIG. 60 with two steps single-sided concave type, which is enlarged by an interference microscope.

FIGS. 60 and 61 illustrate the second upper surface shape example of two steps single-sided grooved type quartz oscillator, which were measured by an interference microscope, after the oscillator was made on the basis of the manufacturing diagram in FIG. 59. When the peak to valley of the surface profile is shown in FIGS. 60 and 61, the surface is manufactured to be as accurate as approximately 0.003 μm roughness similar to FIGS. 55 and 56. Also the shape accuracy is made to be almost purely circular. Furthermore, the measured data in FIG. 61 shows that the parallel accuracy is around 0.02 μm thick at the oscillation part, which is the same as in FIG. 56, however this inversely affects the better electrical performance of a quartz oscillator due to the bi-convex shape.

Figure 62:
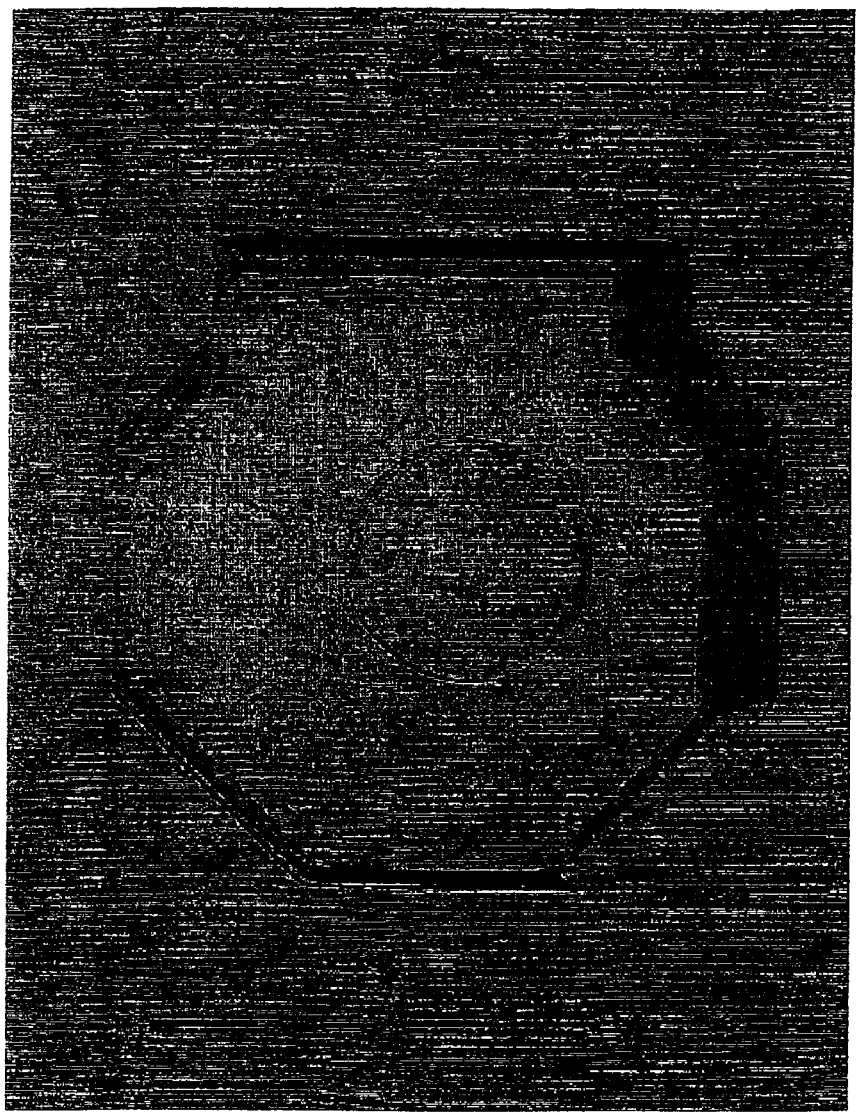
FIG. 62 illustrates a photograph (Normanski micrograph) of manufactured quartz resonator sample 2 with two steps single-sided concave type in FIGS. 60 and 61.

FIG. 62 shows the second photo sample (Normanski microgram) of the two-stepped single-sided grooved type quartz oscillator in FIGS. 60 and 61. Based on this photograph in FIG. 62, the quartz anisotropy is not observed, which is the same as the first photo sample in FIG. 57.

Figure 63:
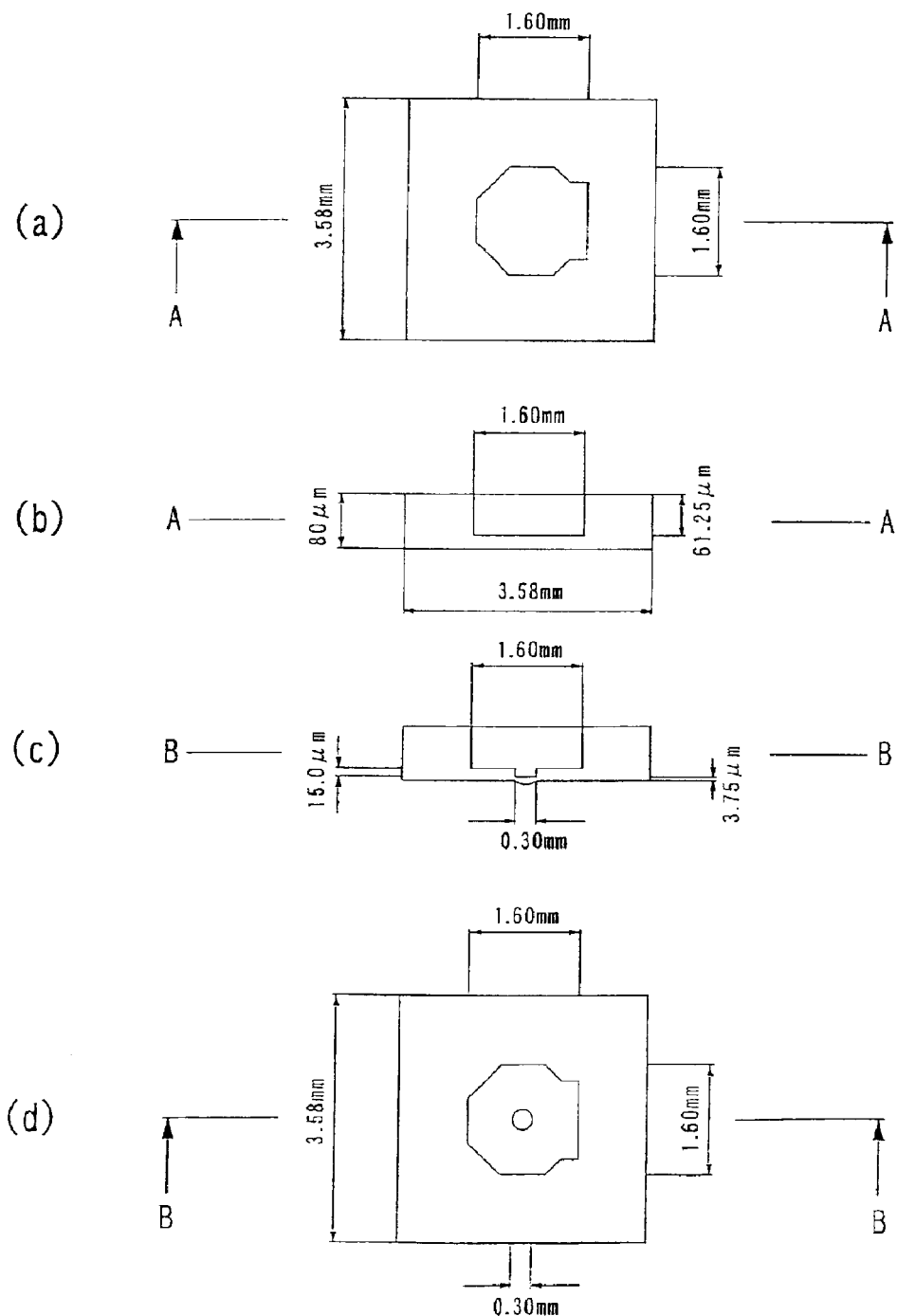
FIGS. 63 and 64 respectively illustrate upper diagrams and cross section diagrams of real quartz oscillator (resonator) samples in the present invention.

FIG. 63 shows the changing state to the convex lens shape of the first oscillation part in FIG. 63(*c*), when the quartz oscillator in FIG. 59(*c*) is made by pressurizing from both sides.

Figure 64:
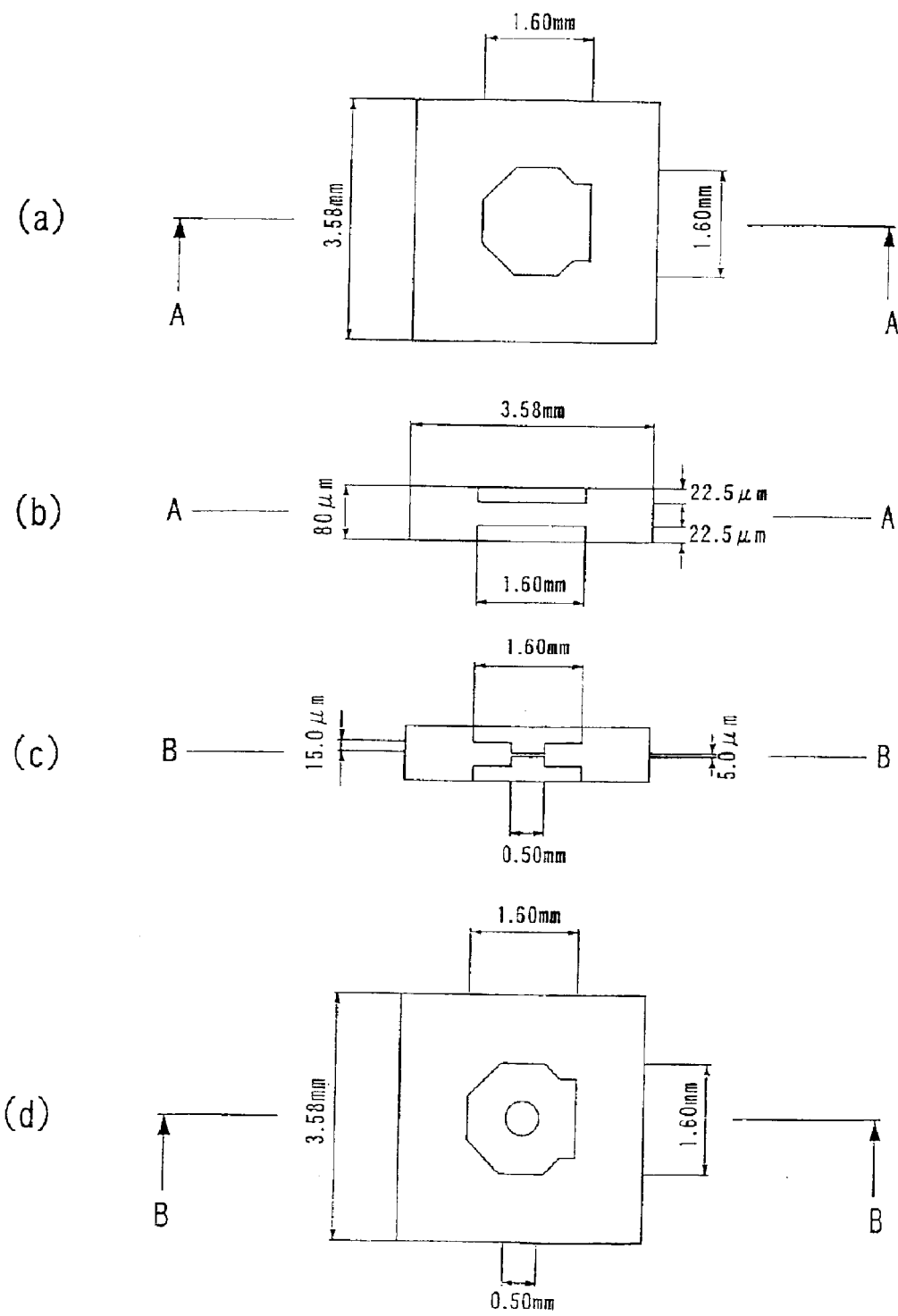
Figure 65:
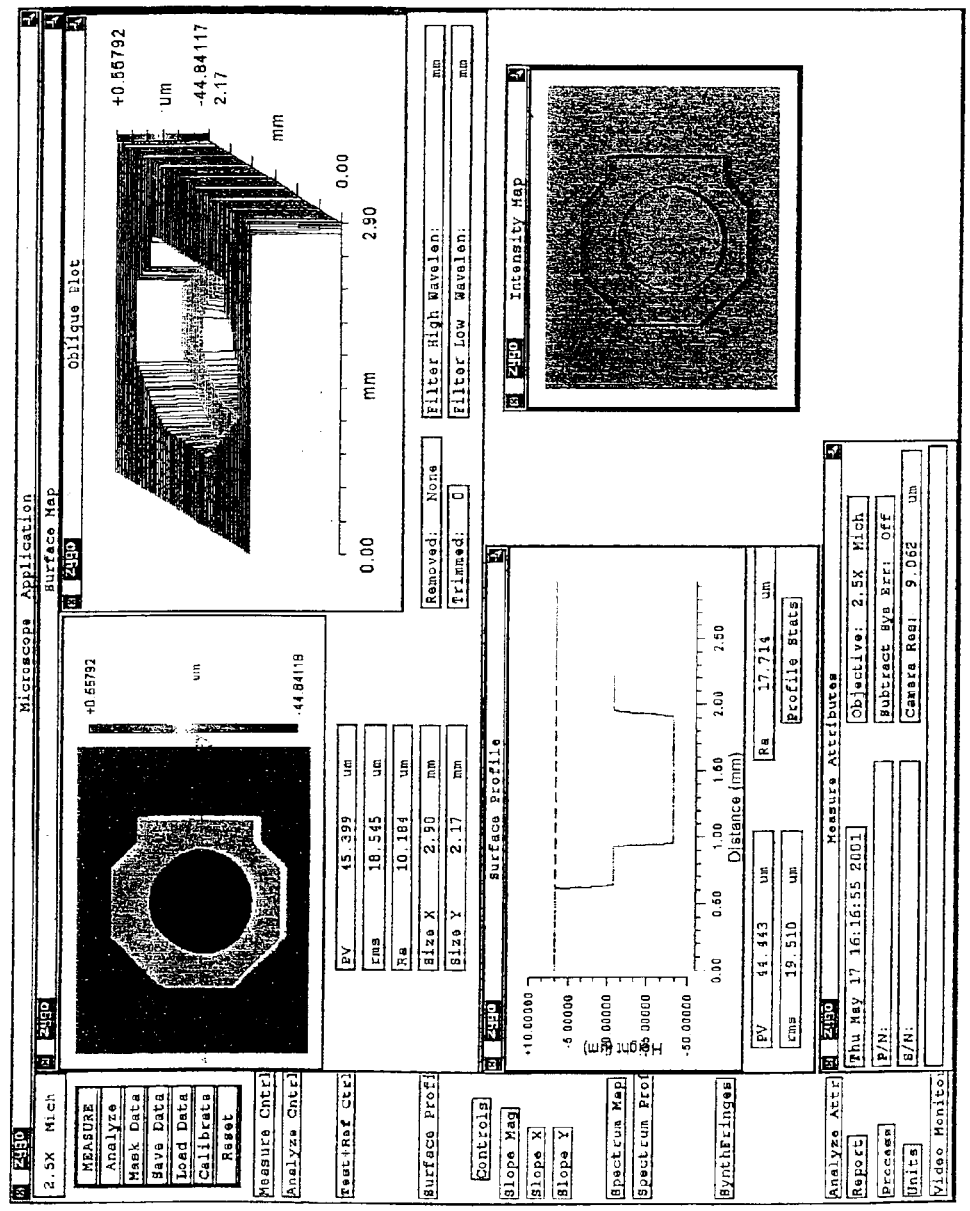
FIG. 65 illustrates a surface-shape measurement diagram of manufactured quartz oscillator sample 3 with two steps double-sided grooved type, which is studied by an interference microscope.
Figure 66:
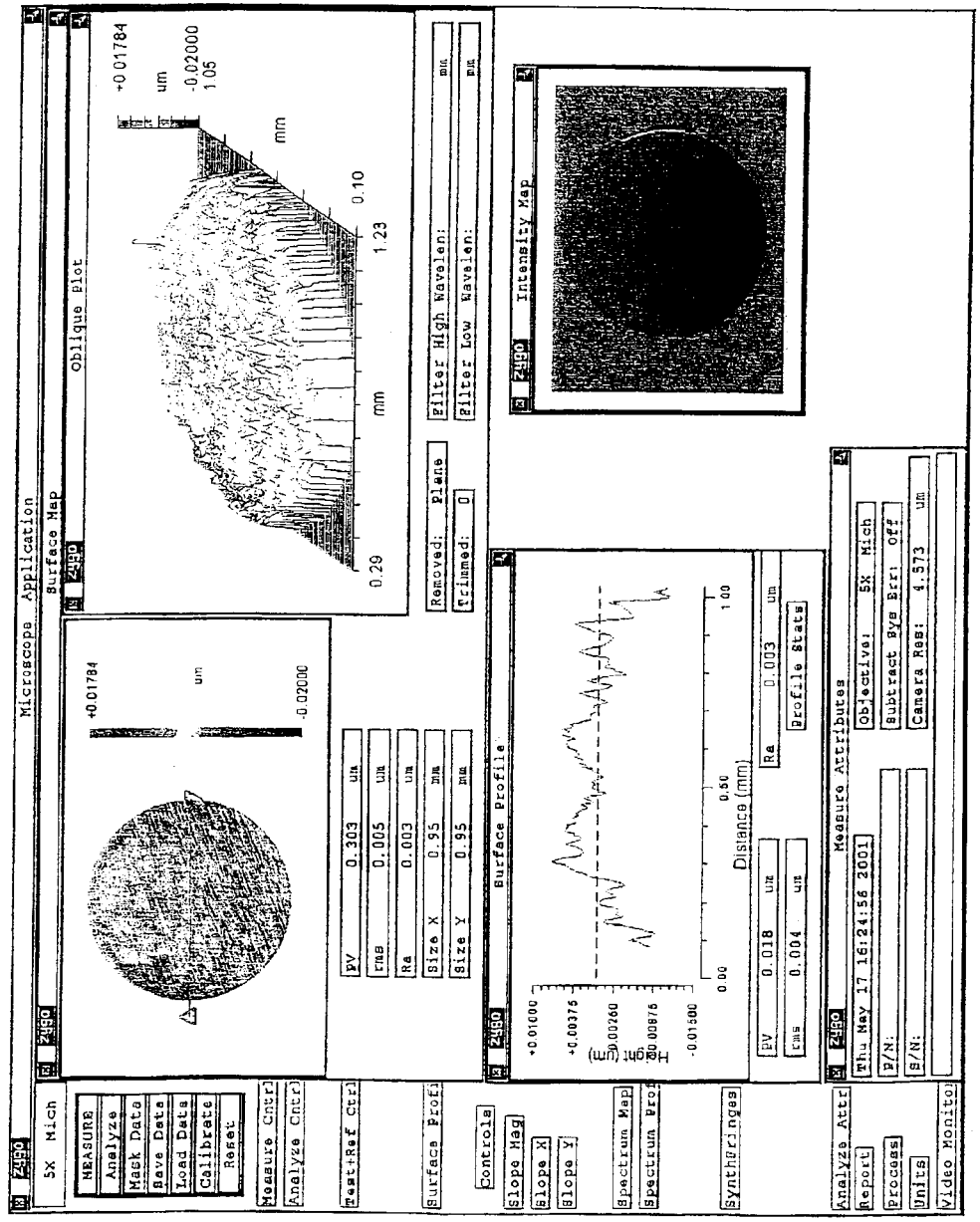
FIG. 66 illustrates a surface-shape measurement diagram of manufactured quartz oscillator sample 3 in FIG. 65 with two steps double-sided grooved type, which is enlarged by an interference microscope.

FIGS. 65 and 66 illustrate the second upper surface shape example of two steps double-sided grooved type quartz oscillator, which were measured by an interference microscope, after the oscillator was made on the basis of the manufacturing diagram in FIG. 64. When the peak to valley of the surface profile is shown in FIGS. 65 and 66, the surface is manufactured in order to be as accurate as approximately 0.003 μm roughness similar to FIGS. 55 and 56. Also the shape accuracy is made to be almost purely circular. Furthermore, the measured data in FIG. 66 shows that the parallel accuracy is around 0.02 μm thick at the oscillation part, which is the same as in FIG. 56, however this inversely affects the better electrical performance of quartz oscillator due to the bi-convex shape.

Figure 67:
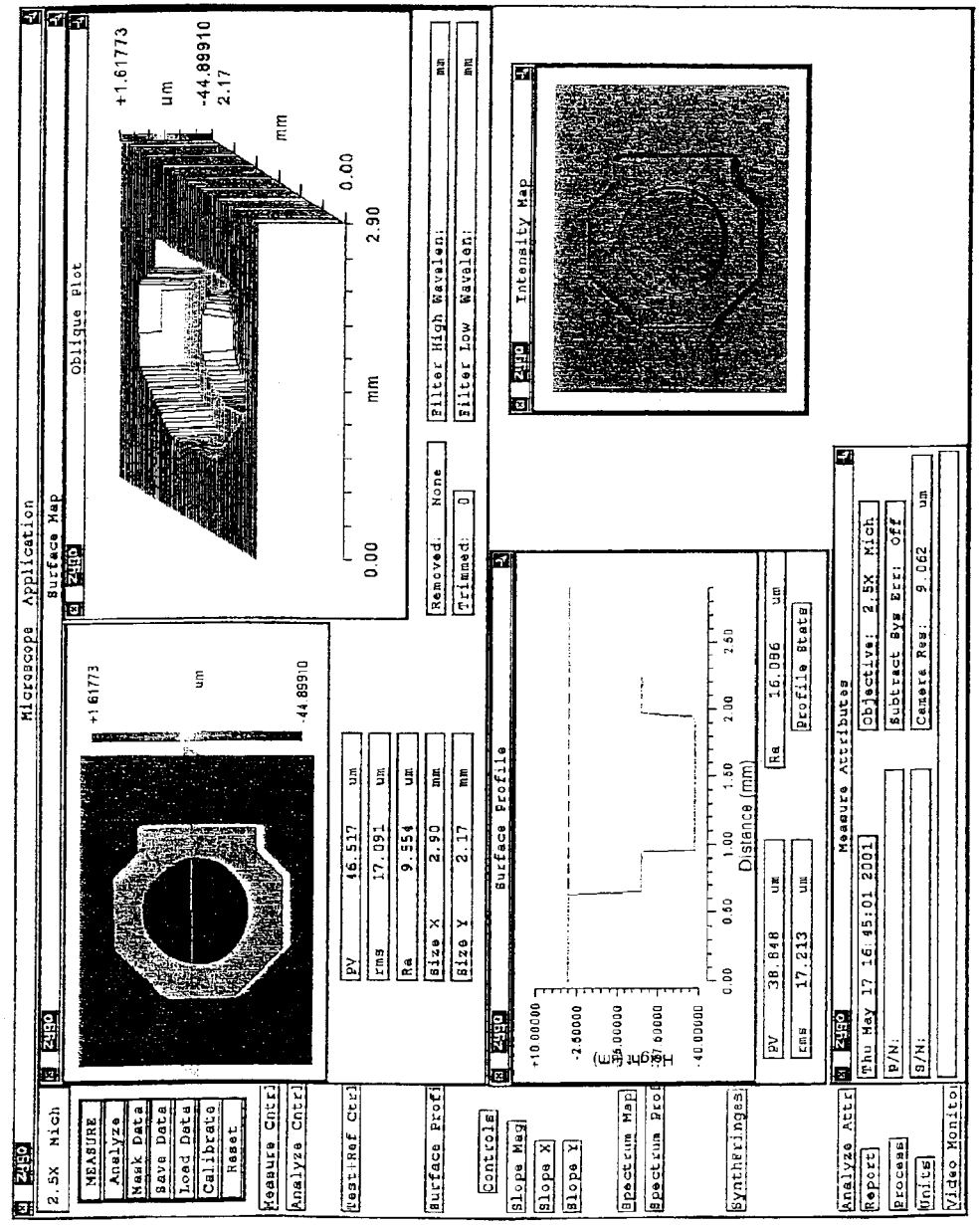
FIG. 67 illustrates a rear surface measurement diagram of manufactured quartz oscillator sample 3 in FIG. 65 with two steps double-sided grooved type, which is studied by an interference microscope.
Figure 68:
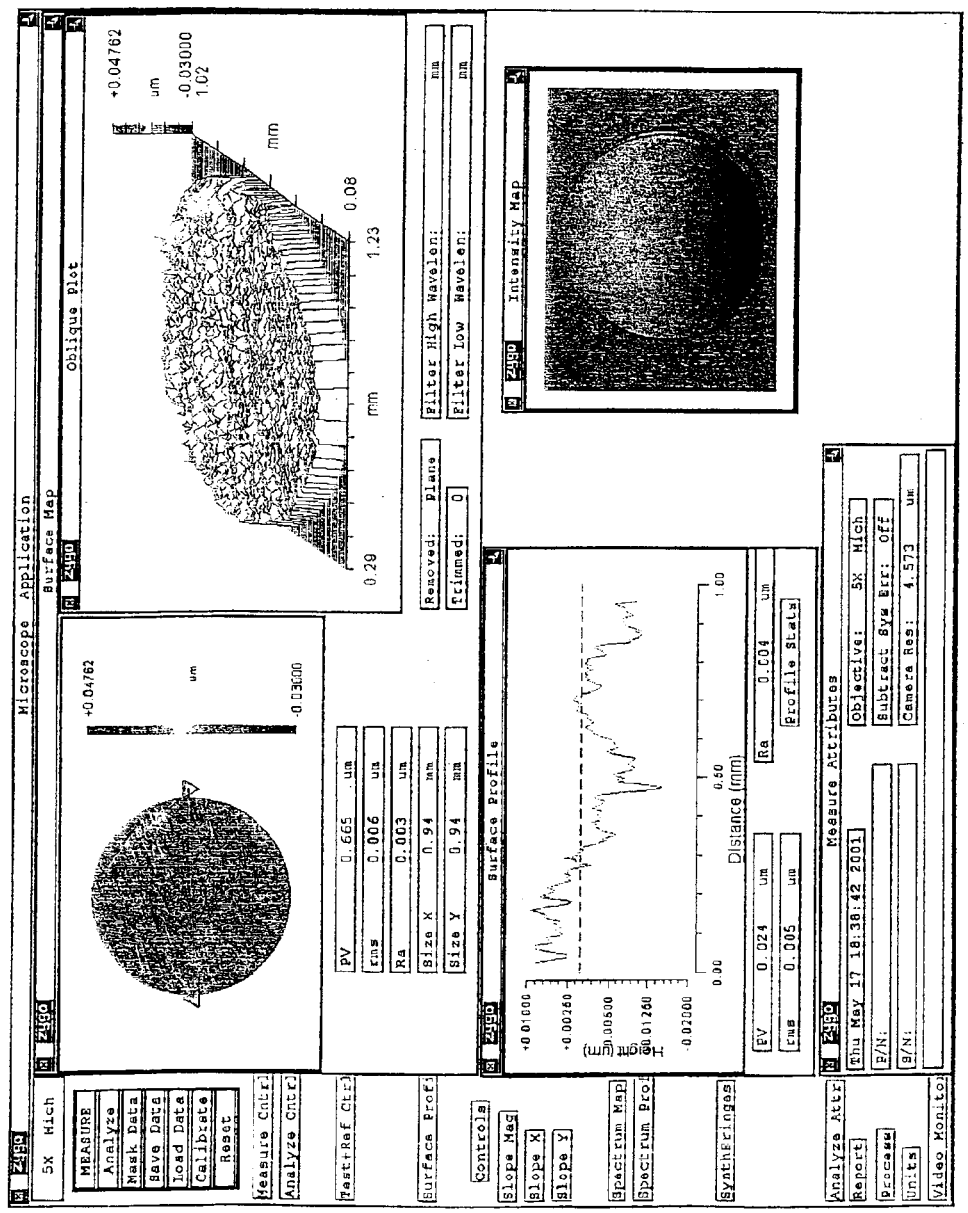
FIG. 68 illustrates a rear surface measurement diagram of manufactured quartz oscillator sample 3 in FIG. 63 with two steps double-sided grooved type, which is enlarged by an interference microscope.

FIGS. 67 and 68 illustrate the third shape example of two steps double-sided grooved type quartz oscillator, whose rear surfaces were measured by an interference microscope. When the peak to valley of surface profile is seen in FIGS. 67 and 68, the rear surface is manufactured to be as accurate as approximately 0.004 μm roughness similar to FIGS. 55 and 56. Also the shape accuracy is made to be almost purely circular. Furthermore, the measured data in FIG. 68 shows that the parallel accuracy is around 0.02 μm thick at the oscillation part, which is the same as in FIG. 66.

Figure 69:
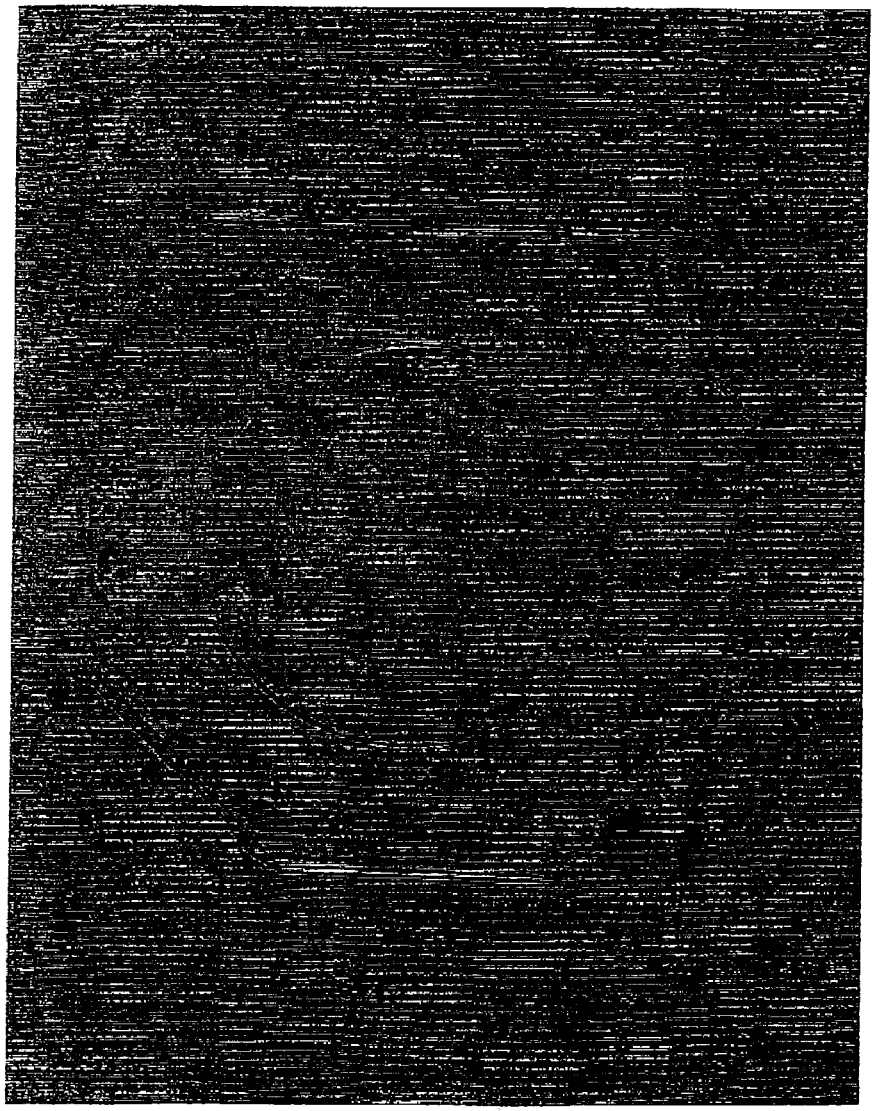
FIG. 69 illustrates a photograph (Normanski micrograph) of manufactured quartz oscillator sample 3 with two steps double-sided grooved type in FIGS. 65 and 66.

FIG. 69 shows the third photo sample (Normanski microgram) of two steps double-sided grooved type quartz oscillator in FIGS. 65 and 66. Based on the photograph in FIG. 69, the quartz anisotropy is not observed as in FIG. 57.

Figure 70:
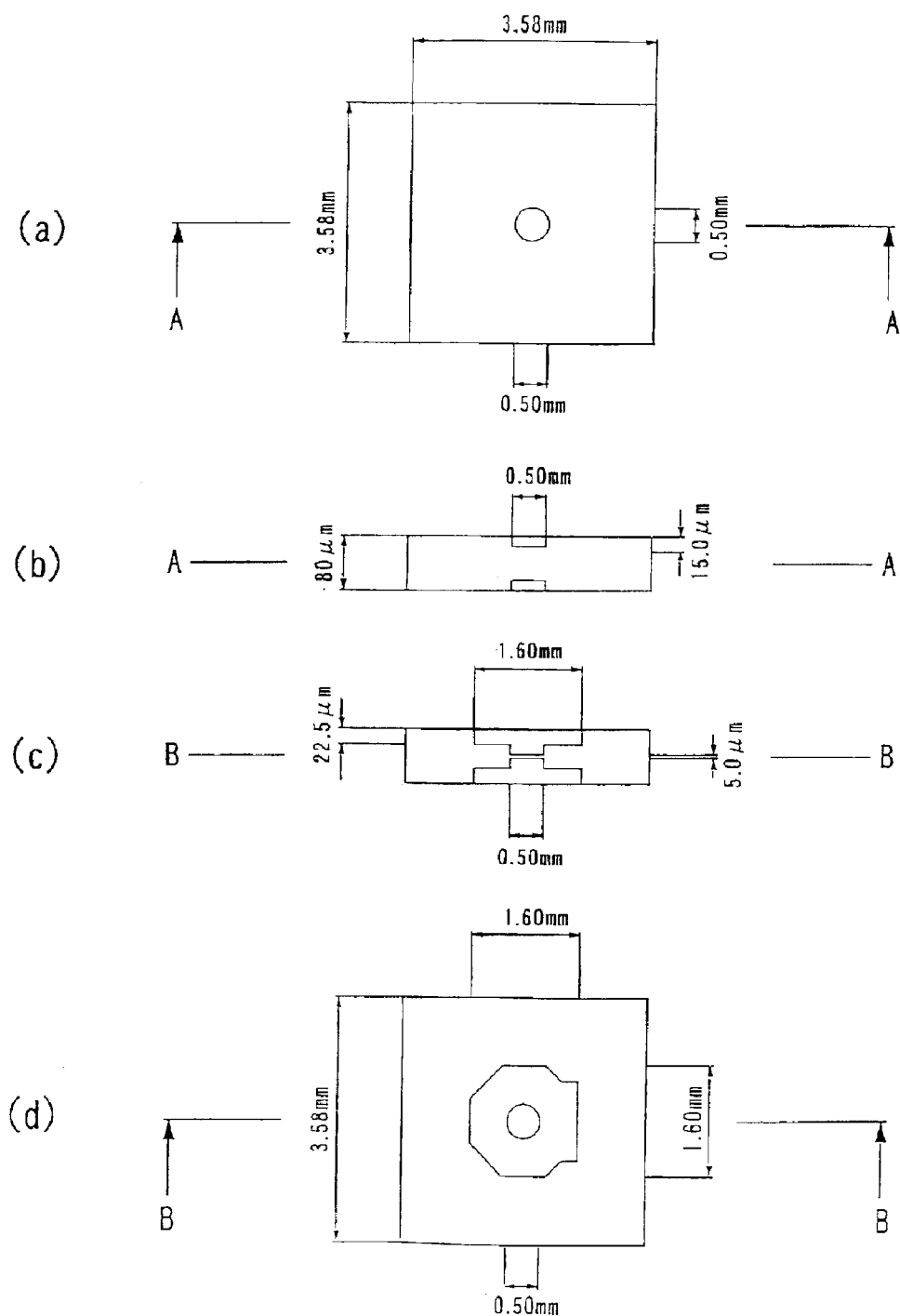
FIG. 70 illustrates upper diagrams and cross section diagrams of real quartz oscillator sample in the present invention.
Figure 71:
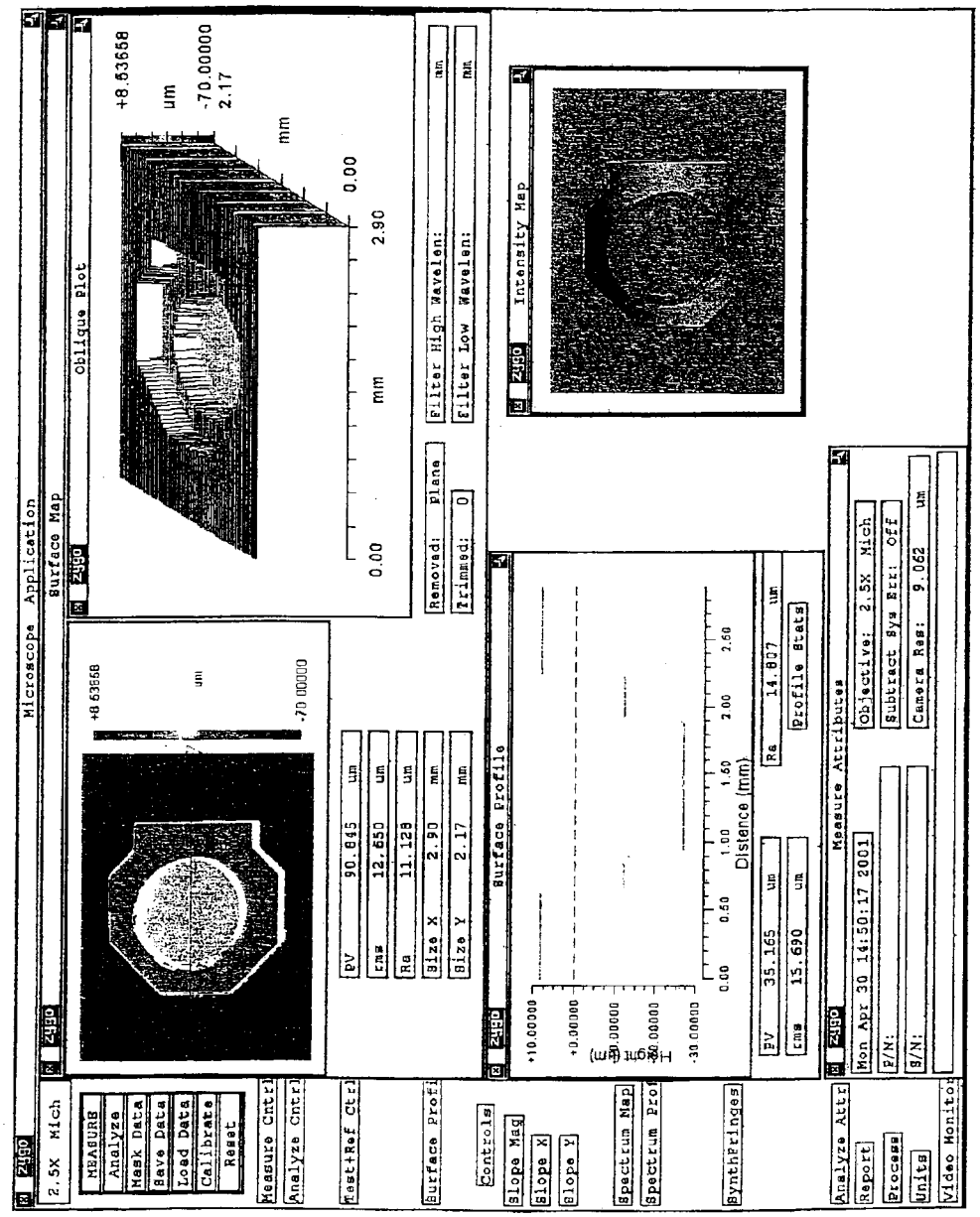
FIG. 71 illustrates a surface-shape measurement diagram of manufactured quartz oscillator sample 4 with two steps double-sided concave type, which is studied by an interference microscope.

FIG. 71 illustrates the fourth example of two steps double-sided grooved type quartz oscillator surface, which was made by the manufacturing diagram in FIG. 70 and the front surface was measured by an interference microscope. When the peak to valley of the surface profile is seen in FIG. 71, the front surface is manufactured so as not to be as accurate as approximately 1.0 μm roughness, which is quite different from FIGS. 55 and 56. Also the shape accuracy is made to be distorted and not to be circular.

Figure 72:
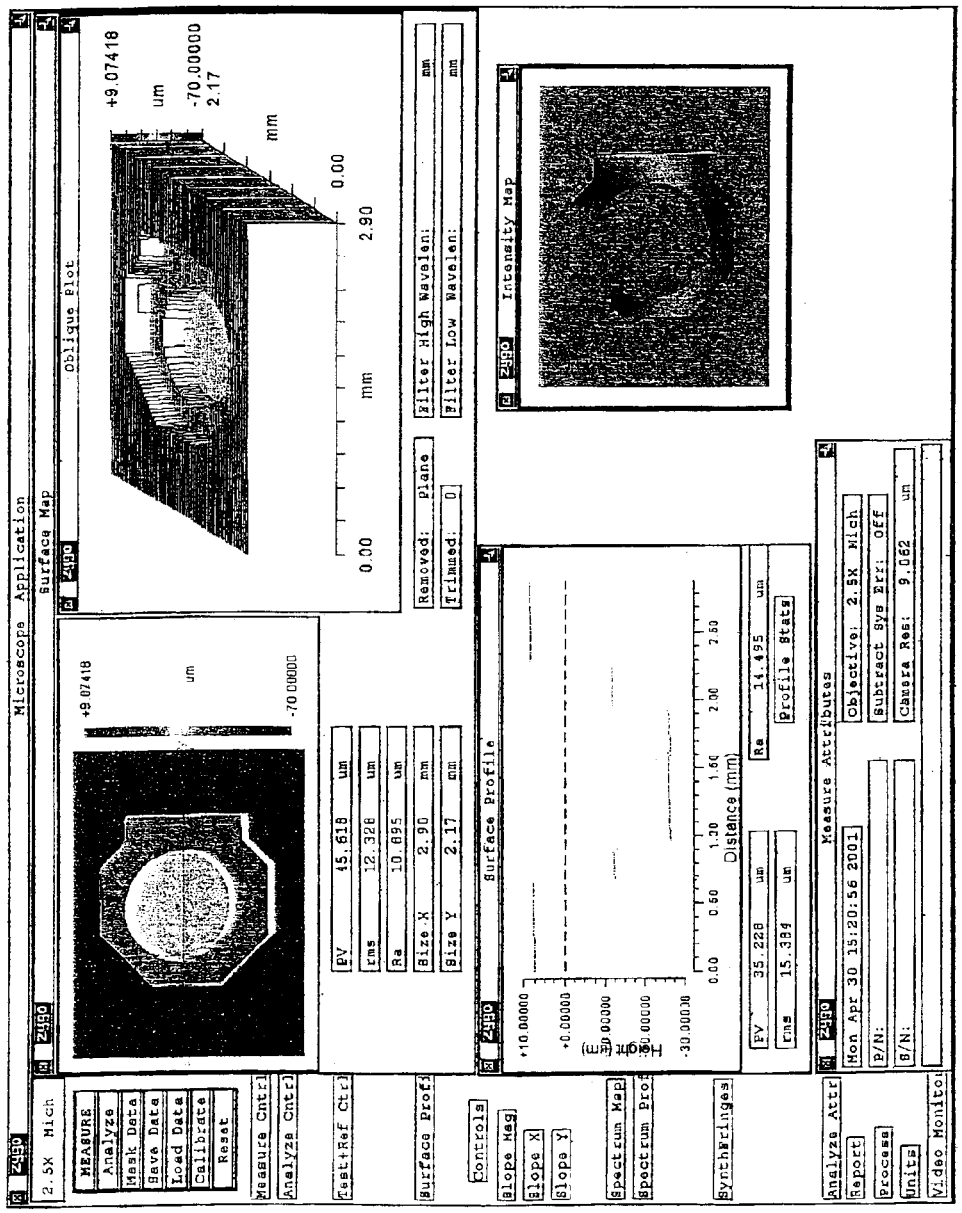
FIG. 72 illustrates a rear shape measurement diagram of manufactured quartz oscillator sample 4 in FIG. 71 with two steps double-sided grooved type, which is studied by an interference microscope.

FIG. 72 illustrates the fourth example of two steps double-sided grooved type quartz oscillator surface, which was made by the manufacturing diagram in FIG. 70 and the rear surface was measured by an interference microscope. When the peak to valley of surface profile is seen in FIG. 72, the front surface is manufactured to be worse than approximately 2.0 μm roughness, which is quite different from FIGS. 55 and 56. Also the shape accuracy is made to be distorted and nearly elliptic similar to FIG. 71.

Figure 73:
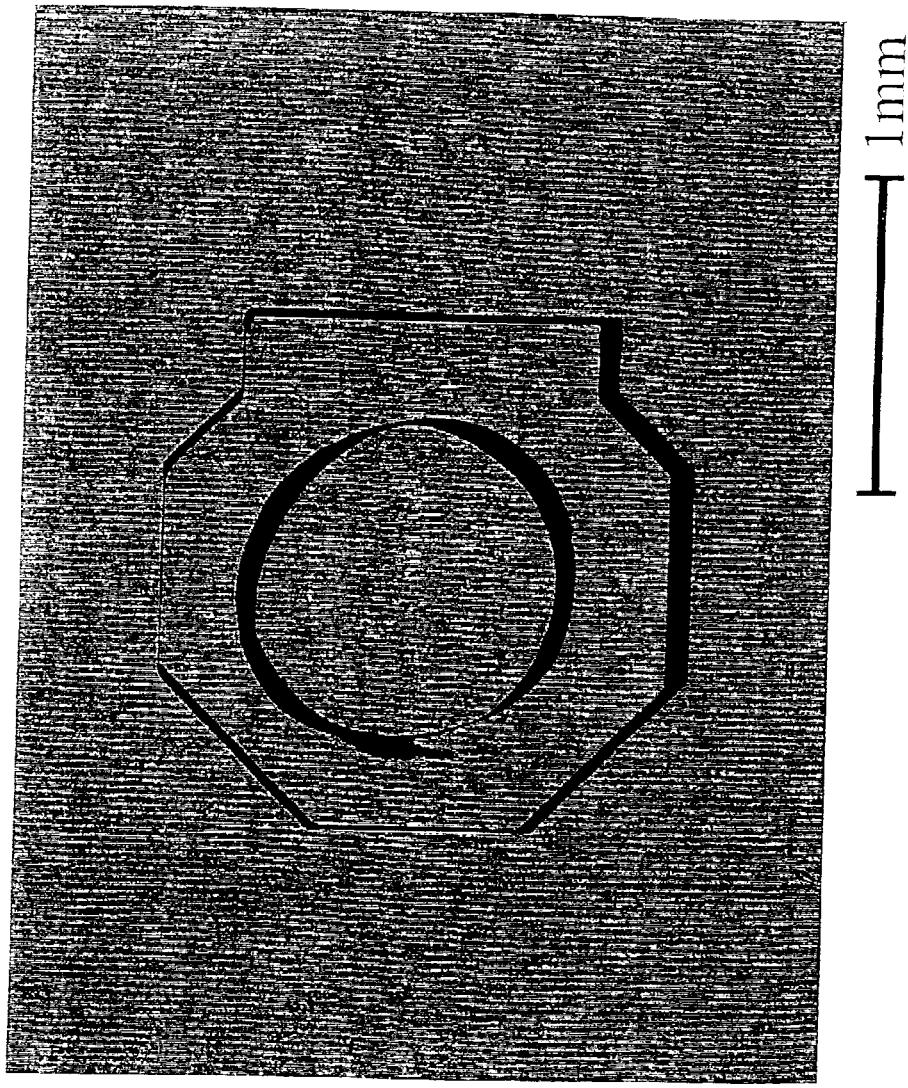
FIG. 73 illustrates a surface photograph (Normanski micrograph) of manufactured quartz oscillator sample 4 with two steps double-sided grooved type in FIG. 71.
Figure 74:
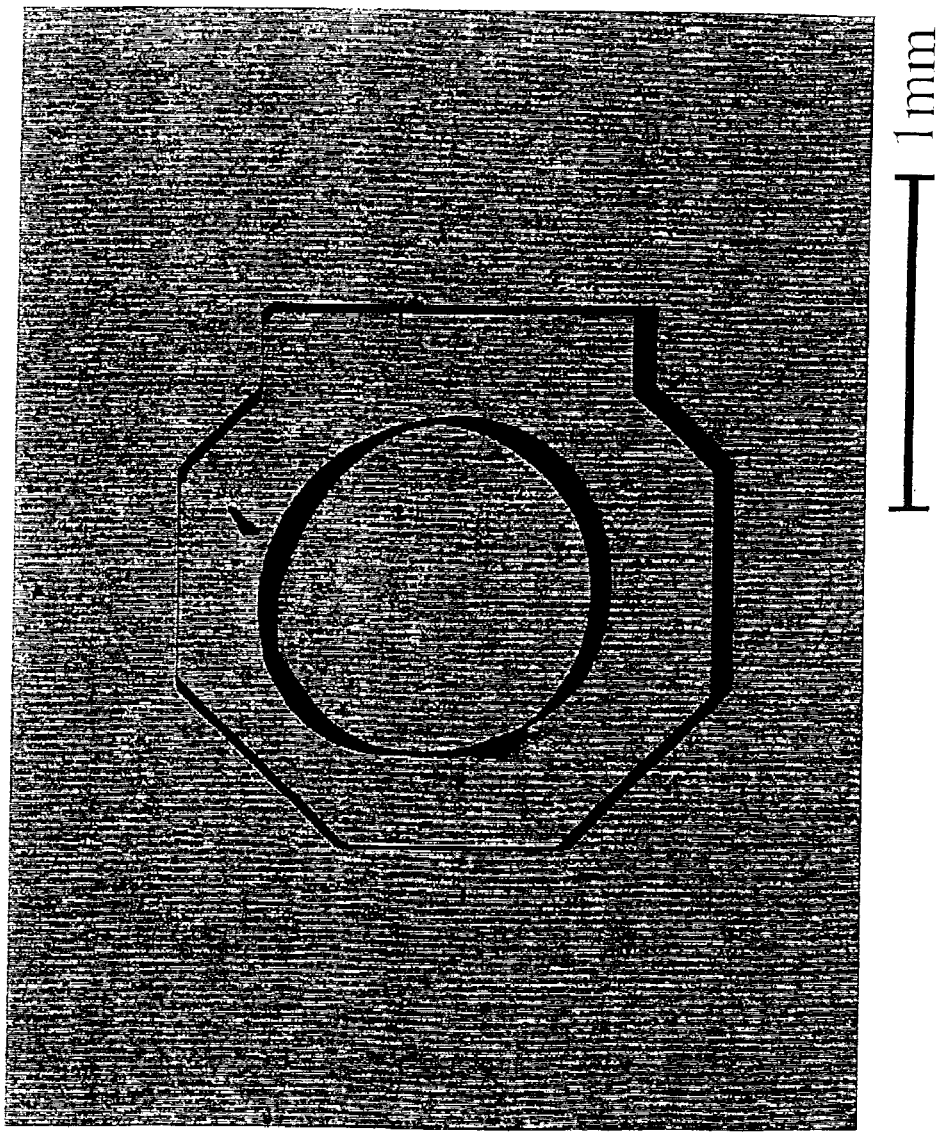
FIG. 74 illustrates a rear surface photograph (Normanski micrograph) of manufactured quartz oscillator sample 4 with two steps double-sided grooved type in FIG. 72.

FIGS. 73 and 74 show the fourth photo samples (Normanski microgram of front and rear surfaces) of two steps single-sided grooved type quartz oscillator in FIGS. 71 and 72. Based on the photographs in FIGS. 73 and 74, the front and rear surfaces are made to be distorted and nearly elliptic due to the anisotropy, and these are quite different from that in FIG. 57.

Figure 75:
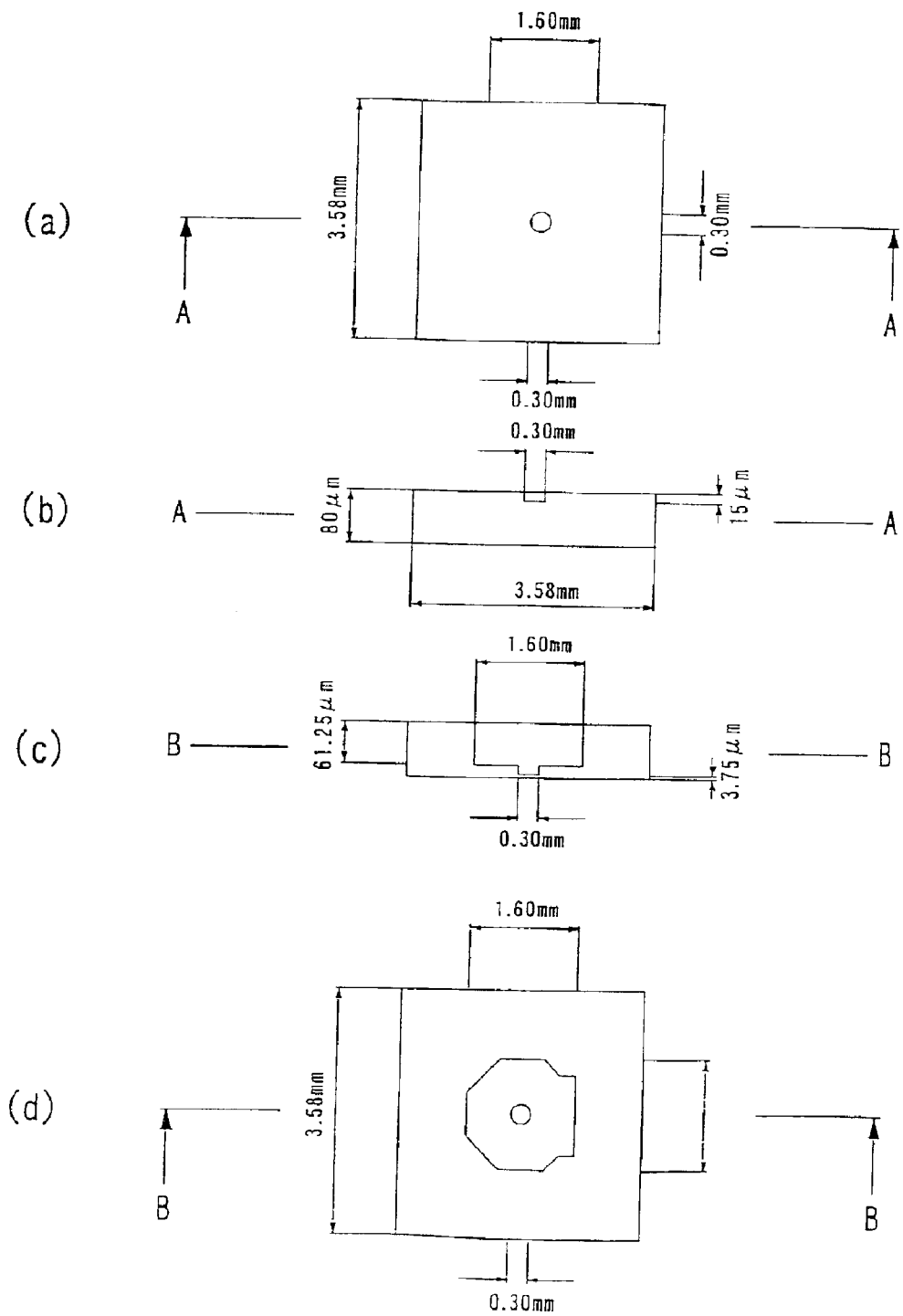
FIG. 75 illustrates upper diagrams and cross section diagrams of real quartz sample in the present invention.
Figure 76:
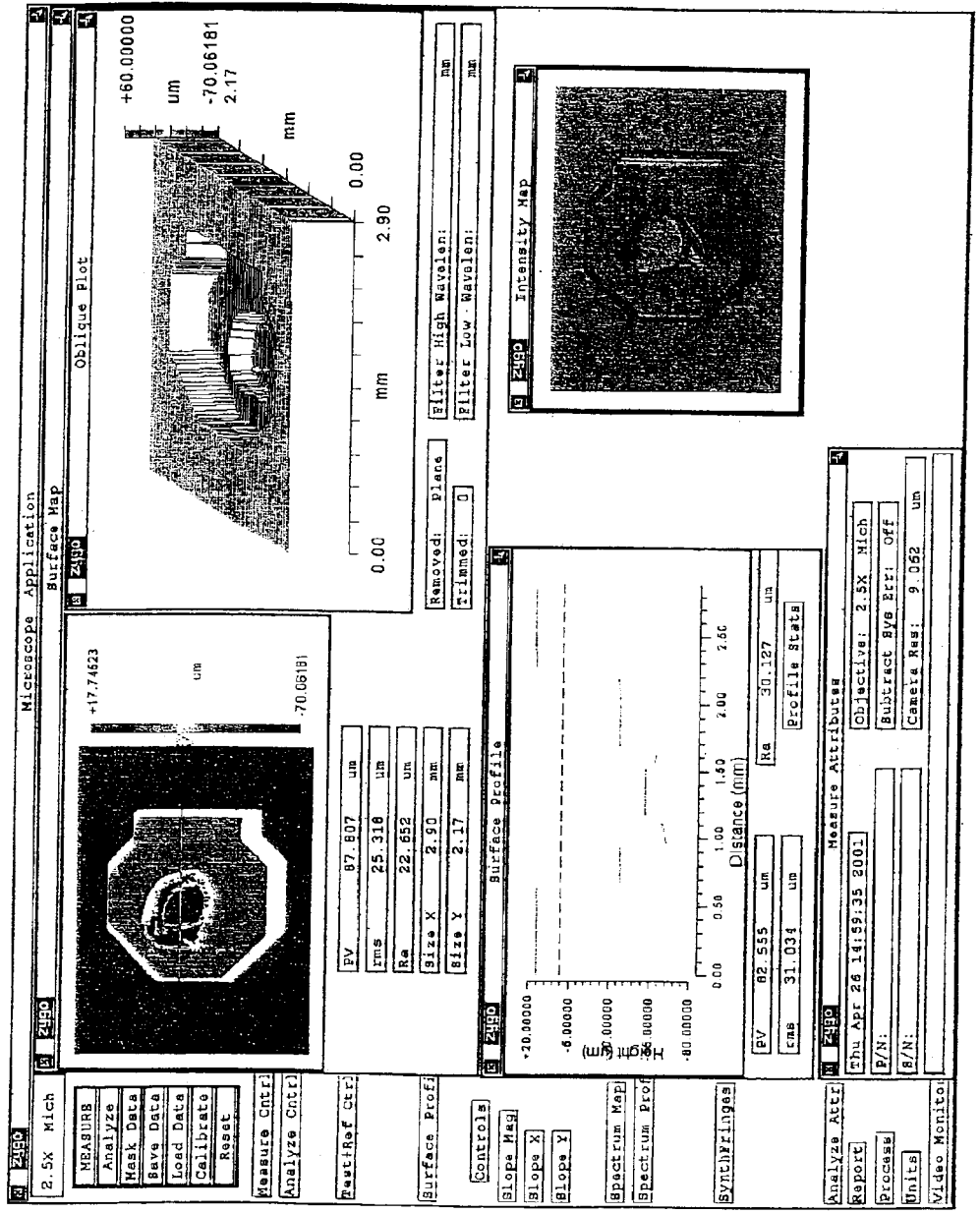
FIG. 76 illustrates a surface-shape measurement diagram of manufactured quartz oscillator sample 5 with two steps single-sided grooved type, which is studied by an interference microscope.

FIG. 76 illustrates the fifth surface example of two steps double-sided grooved type quartz oscillator, which was made by the manufacturing diagram in FIG. 75 and the rear surface was measured by an interference microscope. When the peak to valley of the surface profile is seen in FIG. 76, the surface is manufactured to be worse as unobservable, which is quite different from FIGS. 55 and 56. Also the shape accuracy is made to be much more distorted and worse elliptic than the fourth case in FIGS. 71 and 72.

Figure 77:
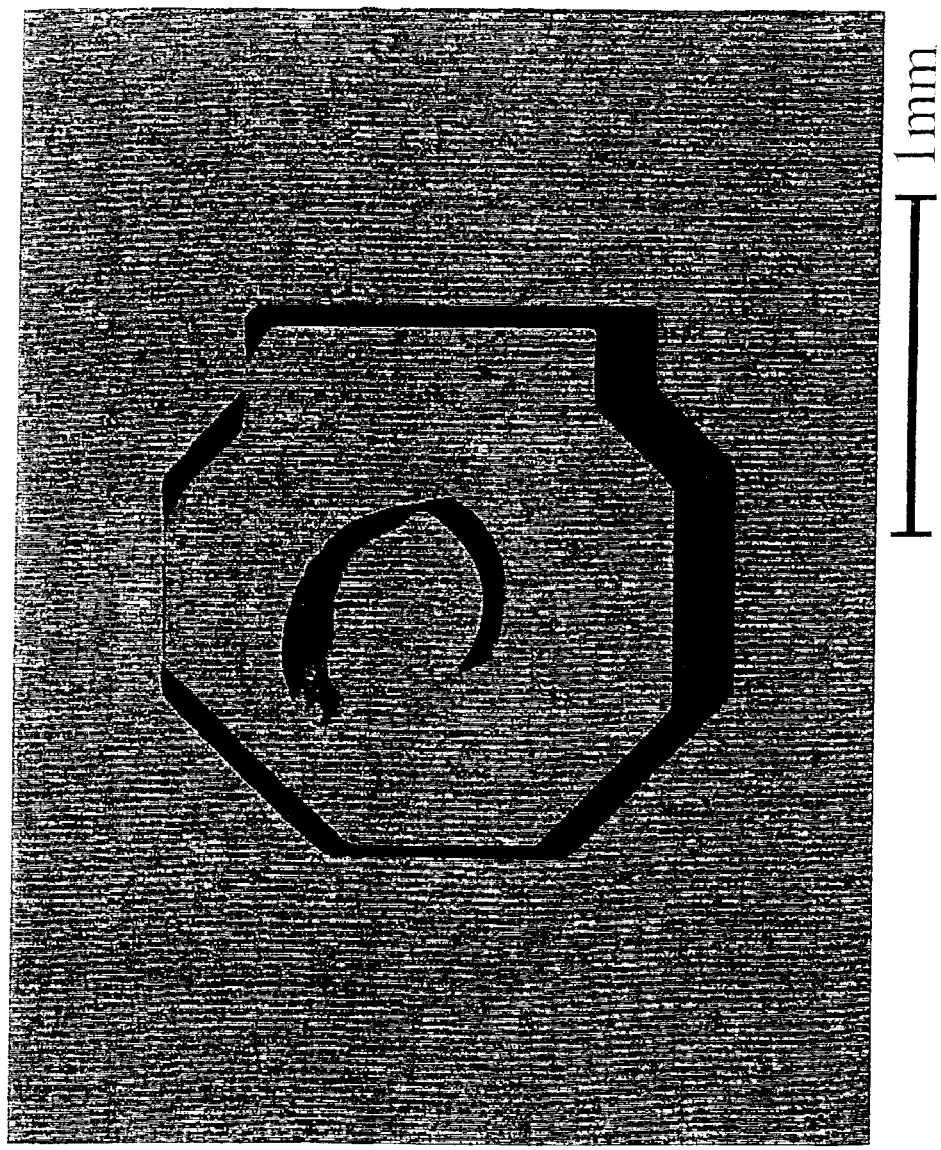
FIG. 77 illustrates a surface photograph (Normanski micrograph) of manufactured quartz oscillator sample 5 with two steps single-sided grooved type in FIG. 76.

FIG. 77 shows the fifth photo sample (Normanski microgram) of two steps single-sided grooved type quartz oscillator in FIG. 76. Based on the photograph in FIG. 77, the surface is made to be distorted and nearly elliptic due to the anisotropy, and this is quite different from that in FIG. 57.

Figure 78:
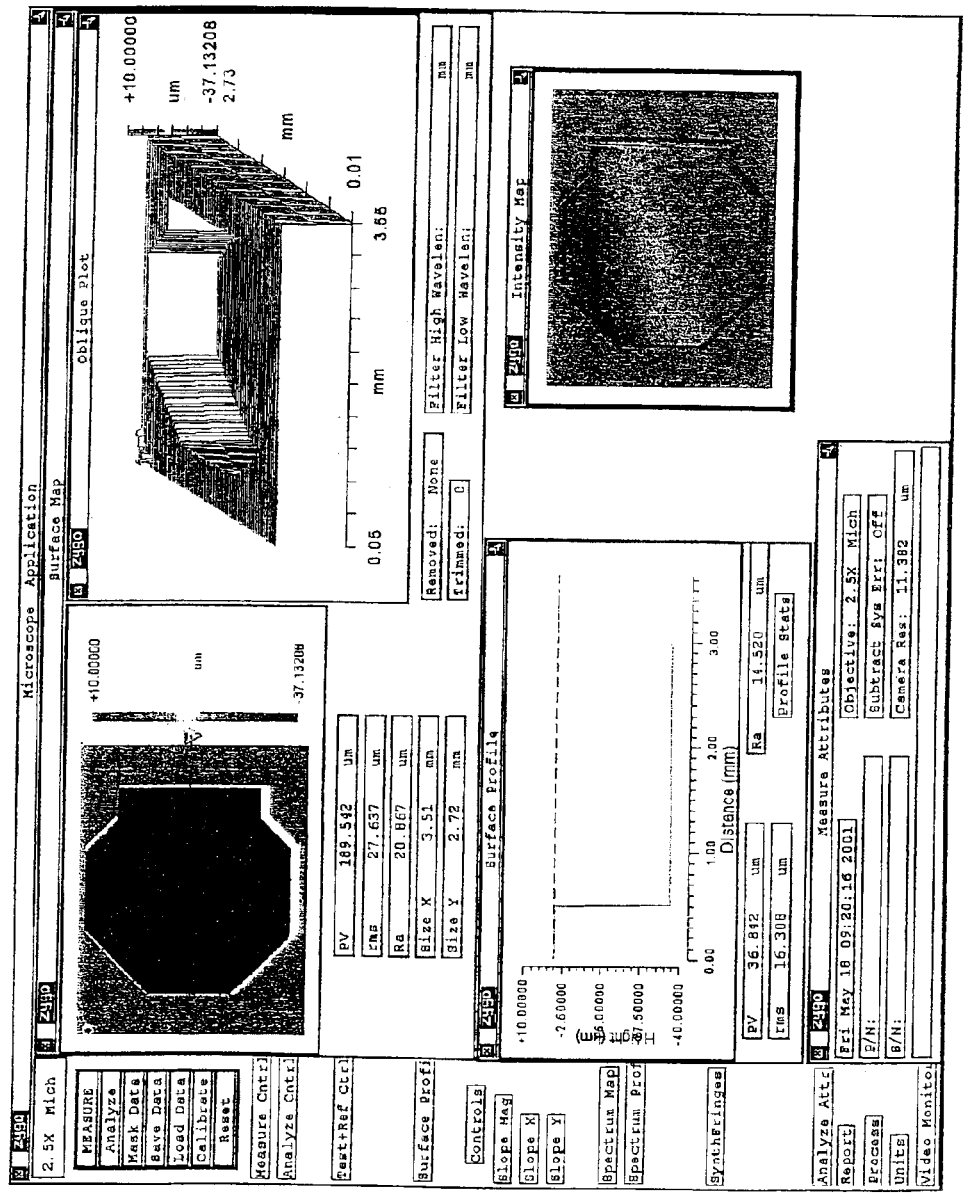
FIG. 78 illustrates a surface-shape measurement diagram of manufactured quartz oscillator sample 6 with conventional one step double-sided inverse mesa type, which is studied by interference microscope made by Hoffman in USA.
Figure 79:
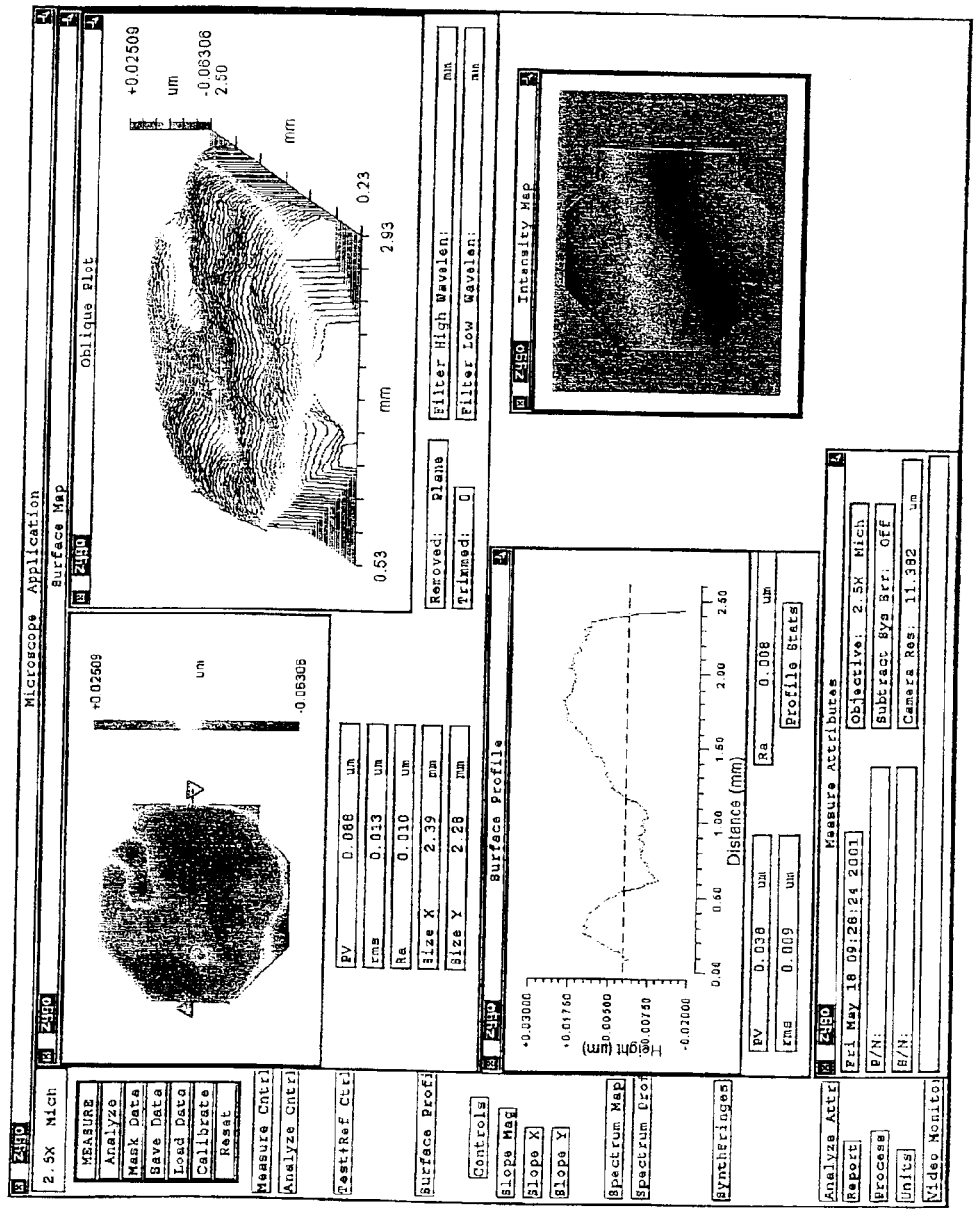
FIG. 79 illustrates a surface shape measurement diagram of manufactured quartz oscillator sample 6 in FIG. 78, which is enlarged by an interference microscope.

FIGS. 78 and 79 show the sixth shape diagram of the conventional quartz oscillator front surface in one step double-sided inverse mesa type, which is approximately 5 μm thick and made by Hoffman Inc. in the USA. The peak to valley of the shape diagram in FIGS. 78 and 79 is approximately 0.008 μm, however the surface accuracy is worse than that of the two-stepped grooved type in FIGS. 56, 61, 66, and 68. Also the large wave is observed on the surface of the oscillation part.

Figure 80:
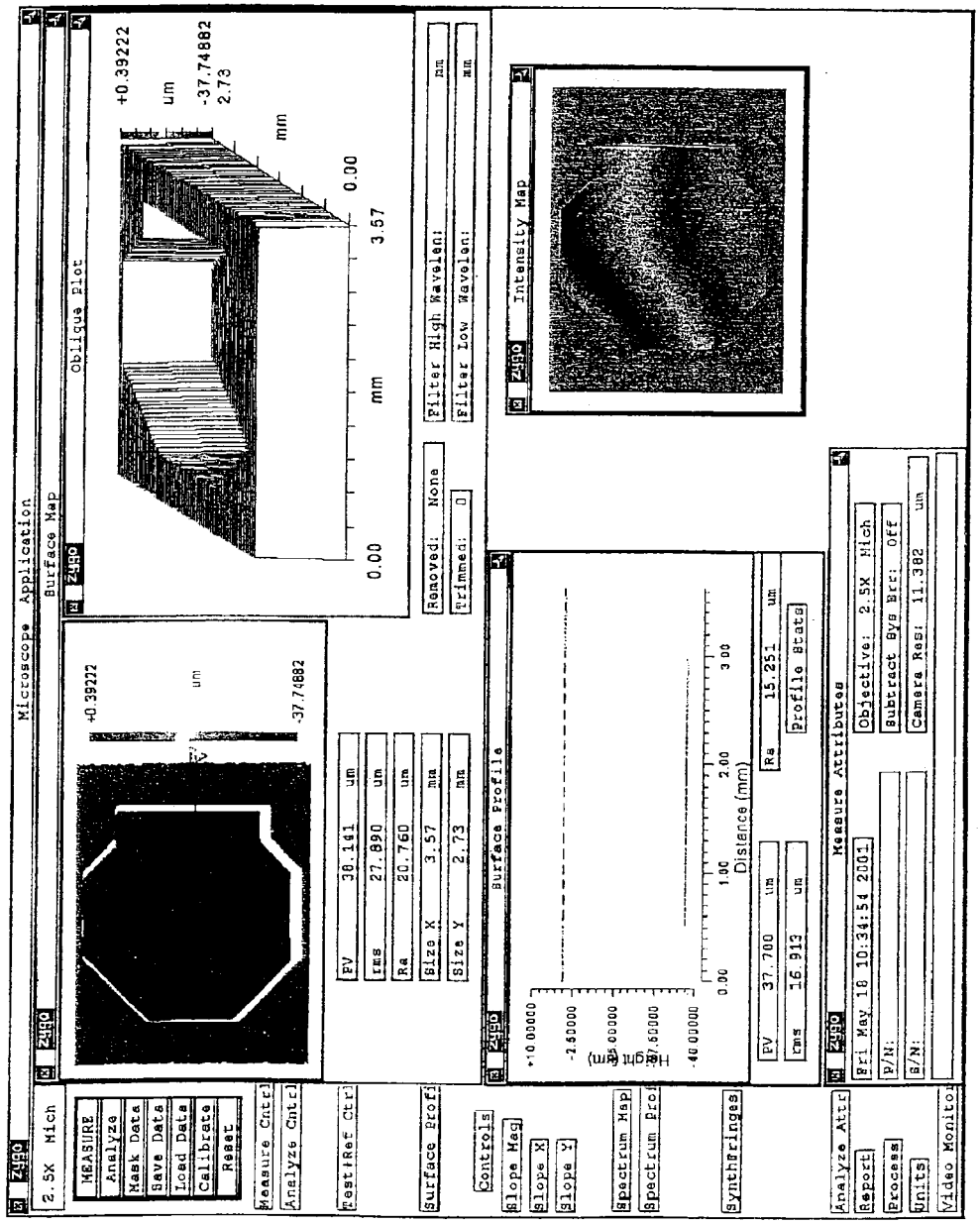
FIG. 80 illustrates a rear-surface shape measurement diagram of manufactured quartz oscillator sample 6 in FIG. 78, which is studied by an interference microscope.
Figure 81:
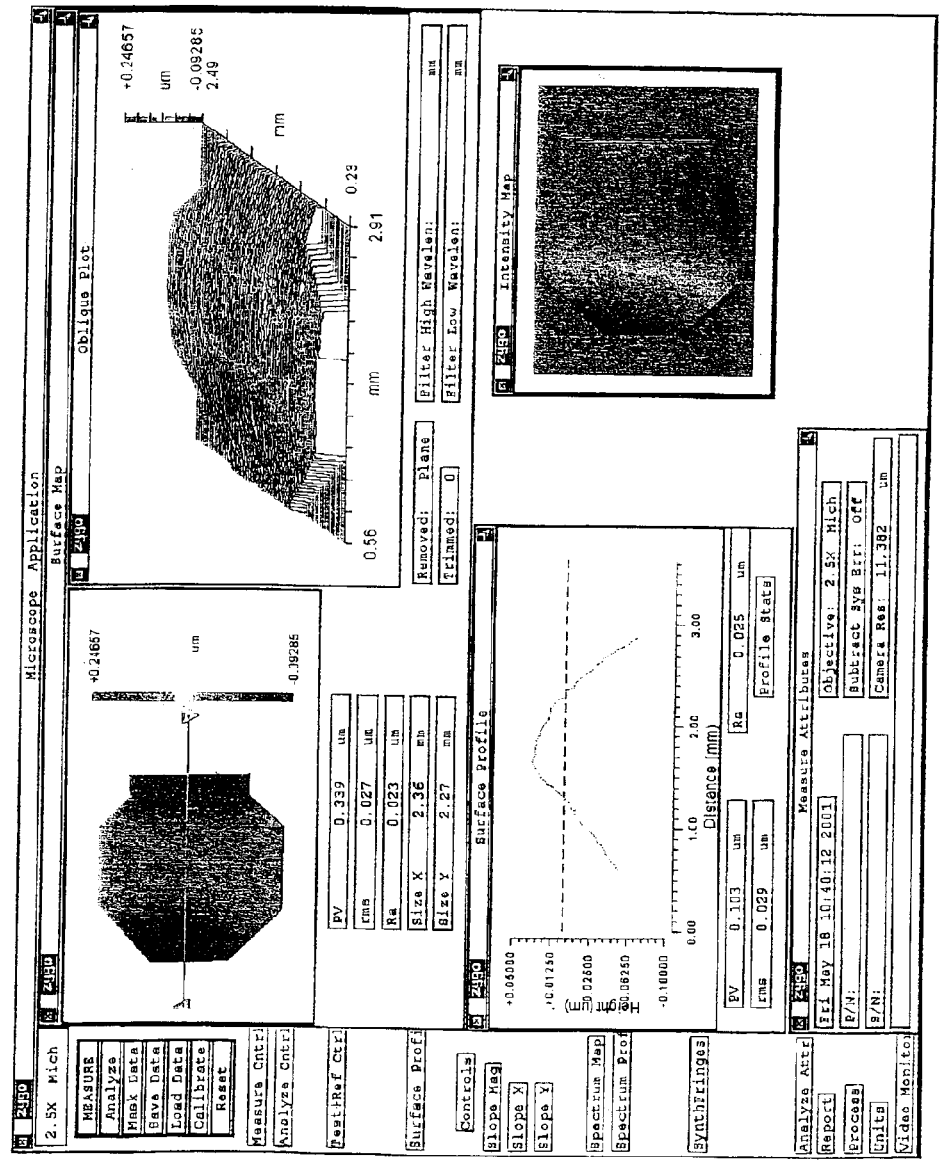
FIG. 81 illustrates a rear-surface shape measurement diagram of manufactured quartz oscillator sample 6 in FIG. 78, which is enlarged by an interference microscope.

FIGS. 80 and 81 show the sixth rear surface shape diagram of one step double-sided inverse mesa type conventional quartz oscillator, which is approximately 5 μm thick as seen in FIGS. 78 and 79. The peak to valley of the rear shape diagram is approximately 0.025 μm and worse than the front surface in FIGS. 78 and 79. Furthermore the surface accuracy is ten times worse than that of two steps concave type in FIGS. 56, 61, 66, and 68. Also the large wave is observed on the surface of the oscillation part. Therefore, the surface accuracy and parallel accuracy of the two steps grooved type are found to be better than those of one step inverse mesa type.

Figure 82:
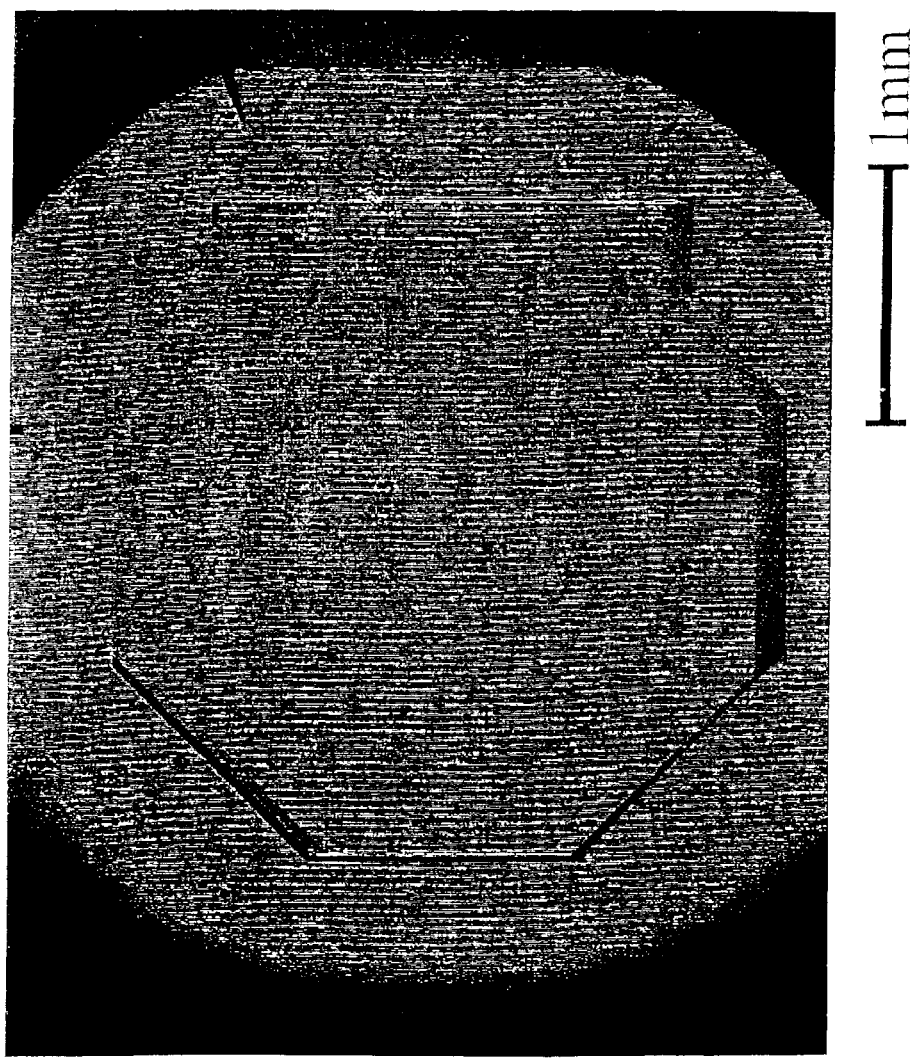
FIG. 82 illustrates a surface photograph (Normanski micrograph) of manufactured quartz oscillator sample 6 in FIG. 78.

FIG. 82 shows a surface photo (Normanski microgram) of the sixth manufactured sample in double-sided inverse mesa type seen in FIGS. 78 and 79.

Conclusions:
①  As demonstrated in the above examples, there exists no anisotropy of quartz oscillators in every case of the first manufactured sample of two steps single-sided grooved type in FIGS. 55 and 56, the second sample of two steps single-sided grooved type in FIGS. 60 and 61, and the third sample of two steps double-sided grooved type in FIGS. 65 and 66.
②  The surface accuracy and shape accuracy of the fourth quartz oscillator sample in steps double-sided grooved type in FIG. 71 and of the fifth quartz oscillator sample in steps single-sided grooved type in FIG. 76 are measured to be worse than those of the first, second, and third samples. This is found to be due to the quartz anisotropy.
③  It is found to be the reason for the quartz anisotropy of first, second, and third samples not to observed (not for the fourth and fifth samples), why the larger diameter oscillation part (the second oscillation part) of the first, second, and third samples in FIGS. 54, 59, and 64 are chemically etched at first, and the smaller first oscillation part is done secondly, and why the smaller diameter oscillation part (the first oscillation part) of the fourth and fifth samples in FIGS. 70 and 75 are chemically etched at first, and the larger second oscillation part is done secondly (these are etched relatively at the same time).
④  The first, second, and third samples are proved to be machined in ultra fine accuracy, the fourth and fifth samples are not, however the latter devices can be used as the lower grade quartz oscillator. On the contrary, the first, second, and third oscillators show more than one hundred times better accuracy compared to the fourth and fifth cases. Therefore the former three manufacturing methods should be utilized for the ultra accurate quartz oscillator as shown in FIGS. 54, 59, and 64.

Figure 83:
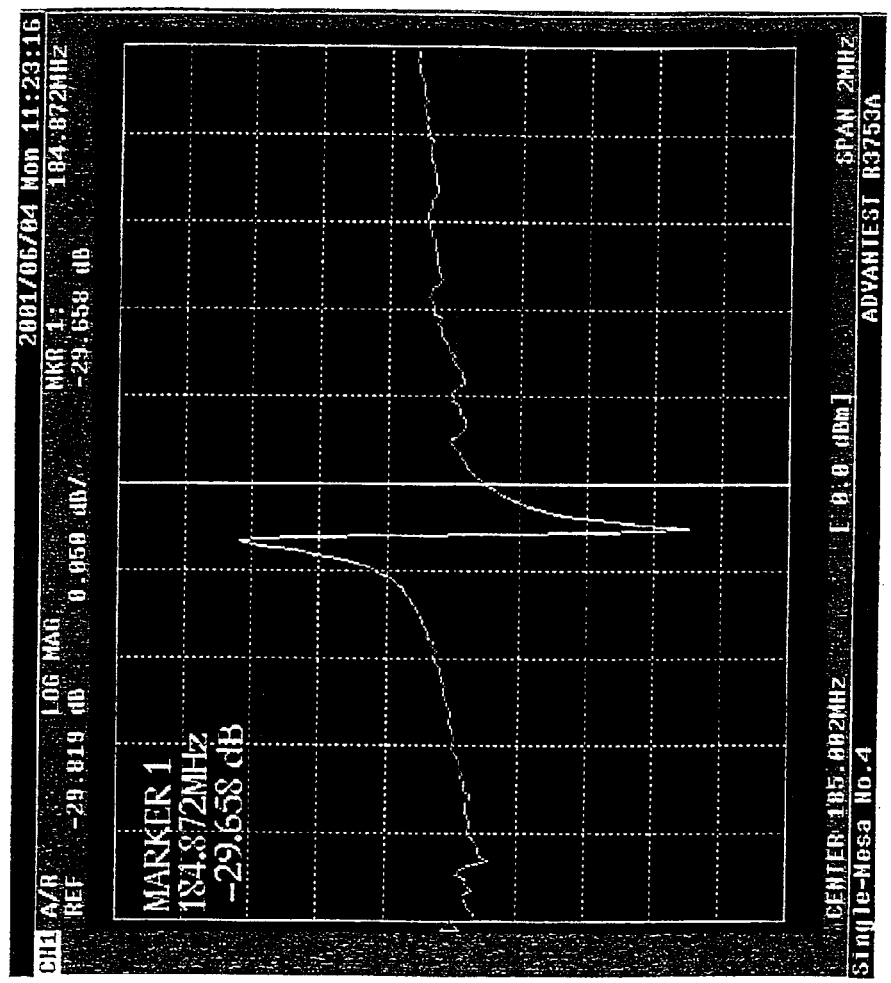
FIGS. 83 and 84 respectively illustrate characteristic oscillation diagrams of reactance-frequency for the thinnest quartz oscillator which blank is AT-cut, and the plane and longitude diagrams of single-sided grooved type quartz oscillator with two steps.
Figure 84:
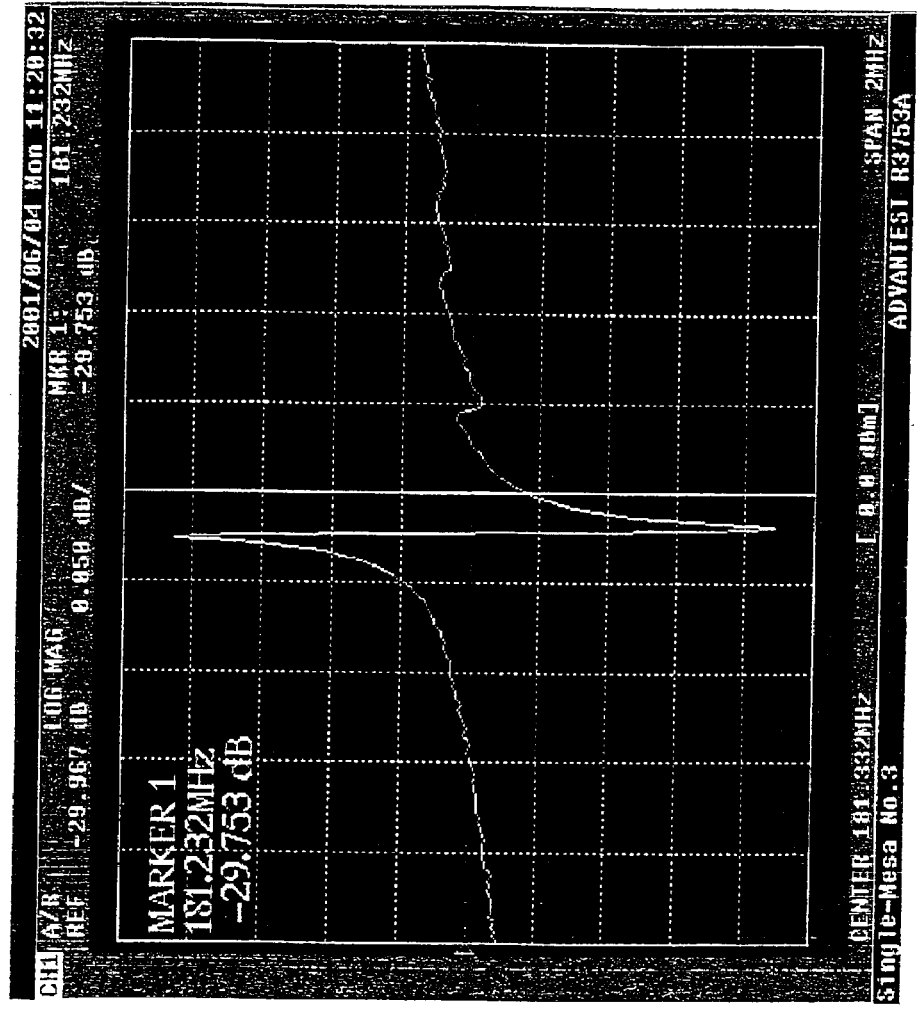
Figure 85:
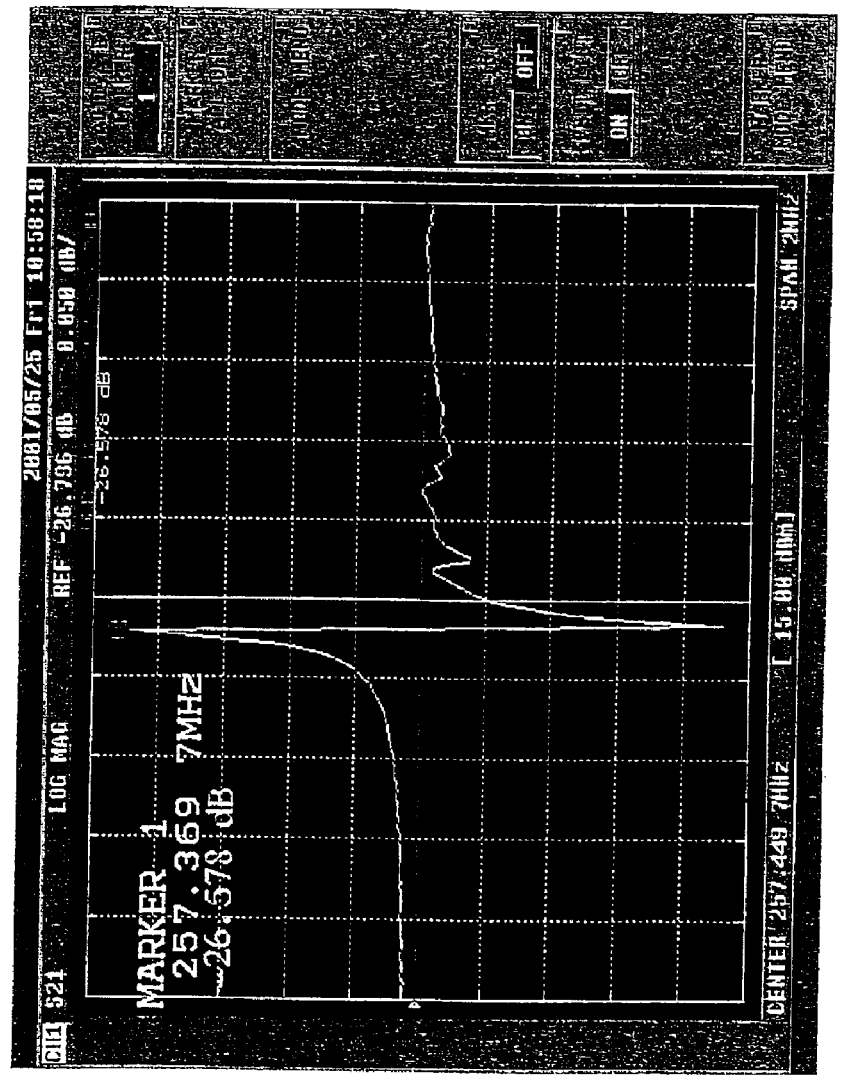
FIGS. 85 and 86 illustrates a characteristic oscillation diagram of reactance-frequency for the thin quartz resonator which blank is AT-cut, and the plane and longitude diagrams of double-sided grooved type quartz oscillator with two steps.
Figure 86:
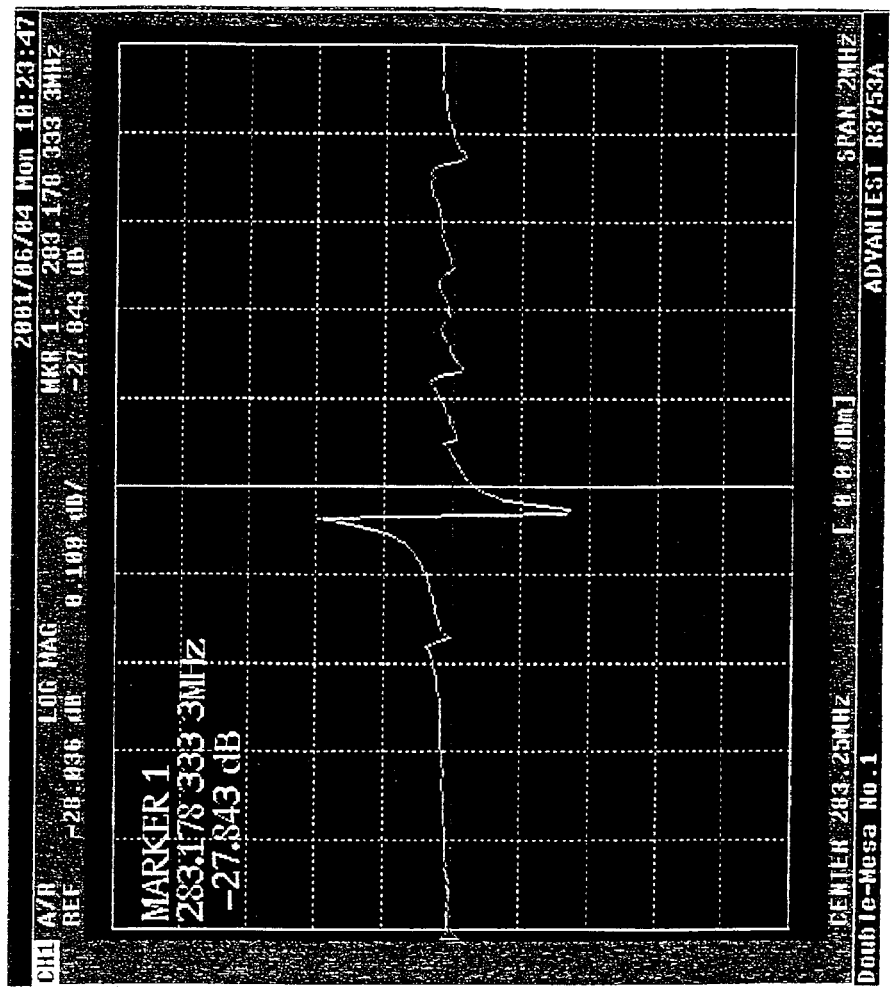

The following paragraph shows the frequency, wave shape and resonance characteristics of quartz oscillator in two steps shape.
①  FIGS. 83, 84, 85 and 86 show measured resonance characteristics of the second quartz oscillator in two steps single-sided grooved type in FIGS. 59, 64, and 70, and of the third and fourth ones in two steps double-sided grooved type.
②  Resonance characteristics in FIGS. 83, 84, 85, and 86 are measured at the first oscillation part in FIGS. 54(*c*), 64(*c*) and 70(*c*), not at the larger second grooved region (second oscillation part) in FIGS. 54(*b*), 64(*b*) and 70(*b*).
③  FIGS. 83 and 84 are measured resonance characteristics of the second quartz oscillator example, which are made based on the diagrams in FIG. 59 for two steps single-sided grooved type. When a material blank is AT-cut, it is thought to be the most excellent electrical performance in the world at present for the resonant point at 184.872 MHz in FIG. 83 and 181.232 MHz in FIG. 84 to see the resonance characteristics in FIGS. 83 and 84.
④  FIG. 85 shows measured resonance characteristics of the fourth quartz oscillator example, which is made based on the diagram in FIG. 70 for two steps double-sided grooved type. When the material blank is AT-cut, it is thought to be the most excellent electrical performance in the world at present for the resonant point at 257.369 MHz to see the resonance characteristics in FIG. 85.
⑤  FIG. 86 shows measured resonance characteristics of the third quartz oscillator example, which is made based on the diagram in FIG. 64 for two steps double-sided grooved type. It is thought to be the most excellent electrical performance in the world at present for the resonant point at 283.178 MHz to see the resonance characteristics in FIG. 86.

Figure 87:
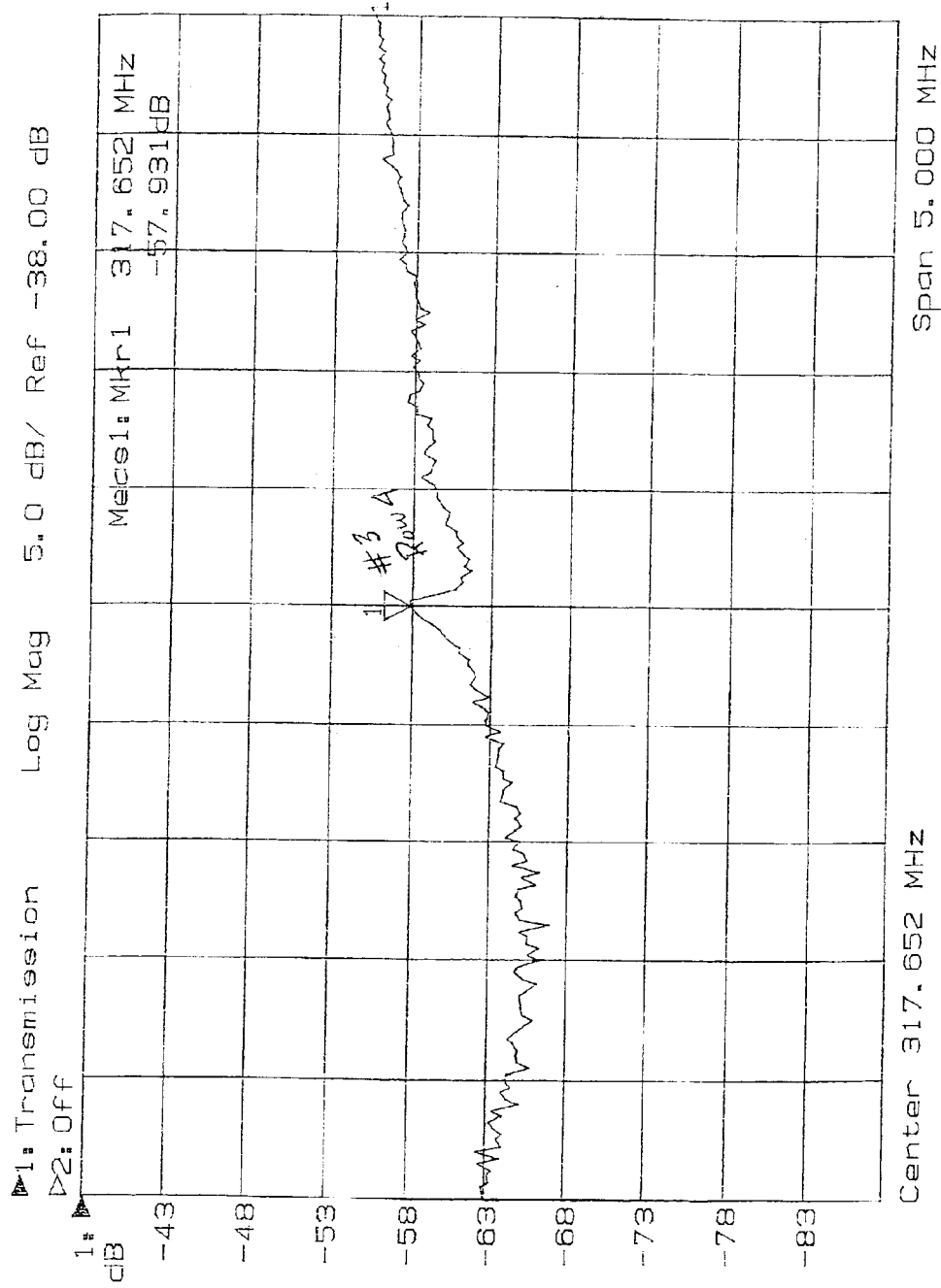
FIG. 87 illustrates a characteristic oscillation diagram of reactance-frequency of manufactured quartz oscillator with AT-cut, and conventional one step double-sided inverse mesa type, which is studied by interference microscope made by Hoffman in USA.

⑥ FIG. 87 is measured resonance characteristics of the sixth quartz oscillator example, which is made by Hoffman Inc. in USA for one step double-sided inverse mesa type and oscillation part is approximately 5 μm.

⑦ When the resonance property of one step double-sided inverse mesa type in FIG. 87 is compared both to those of two steps single-sided grooved type in FIGS. 83 and 84 and to two steps double-sided grooved type in FIGS. 85 and 86, the electrical resonance characteristics in FIGS. 83, 84, 85, and 86 is much better than that in FIG. 87, although these frequencies are slightly different.

⑧ It is thought to be due to the present two steps grooved shape for electrical resonance characteristics of two steps single-sided grooved type in FIGS. 83 and 84 and of two steps double-sided grooved type in FIGS. 85 and 86, to be much better than that of Hoffman's resonator in one step inverse mesa type in FIG. 87.

⑨ The large area of the second grooved part (second oscillation part) in two steps grooved stereo type in FIGS. 59(b), 64(b), and 70(c) is not vibrated, the first oscillation part in very small diameter is only vibrated, and the first oscillation part is demonstrated to contribute solely for the electrical resonance.

⑩ The above discovery implies that the ultra high frequency resonance over 160 GHz primary wave (approximately 0.015 μm thick), with BT-cut, for example, can be oscillated in near future, and that it can be possible for electrically ideal quartz oscillator to be made in concavo-convex lens shape rather than in two steps single-grooved plano-convex type.

Figure 88:
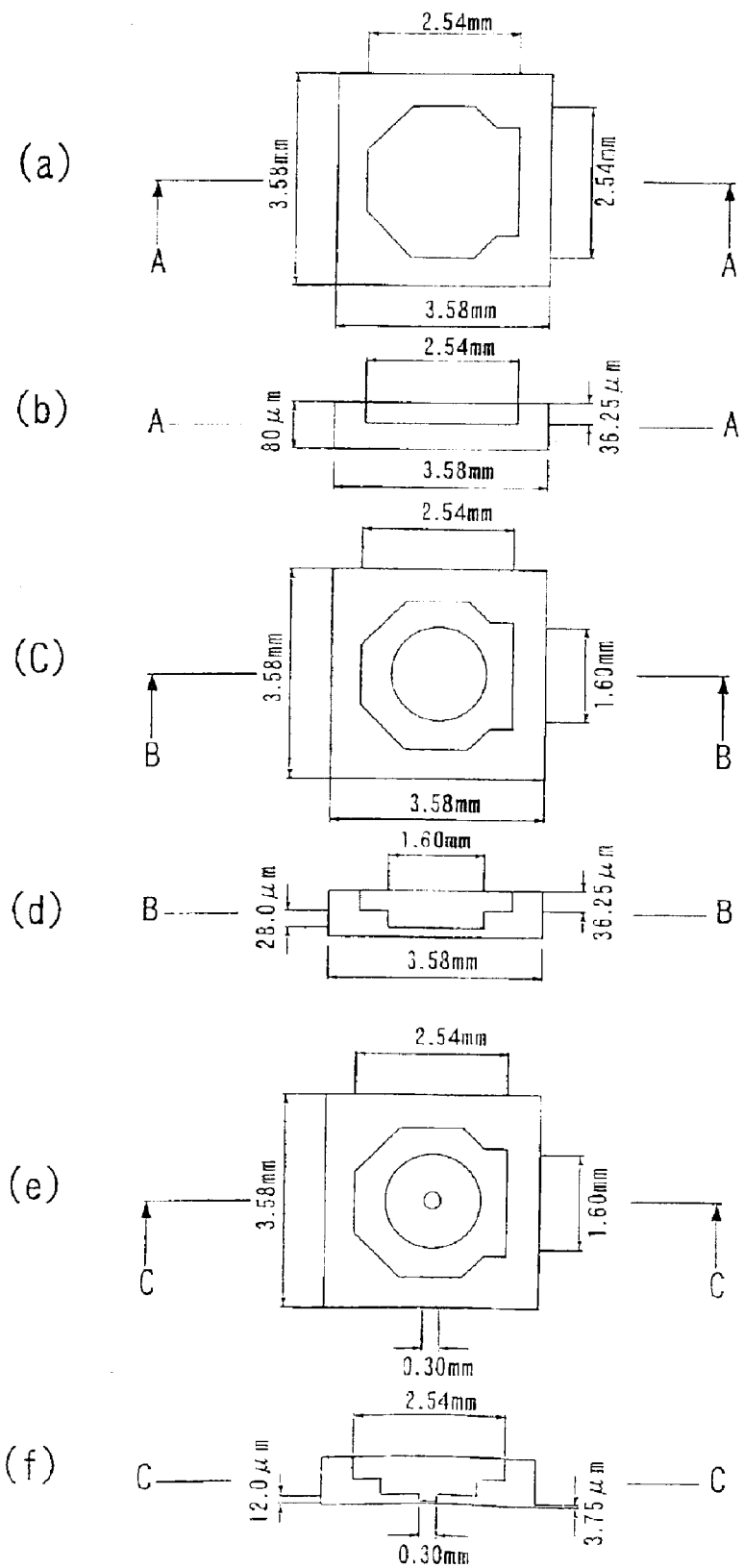
FIGS. 88 and 89 illustrate dimension diagrams of manufactured sample as three steps single-sided grooved type quartz oscillator.
Figure 89:
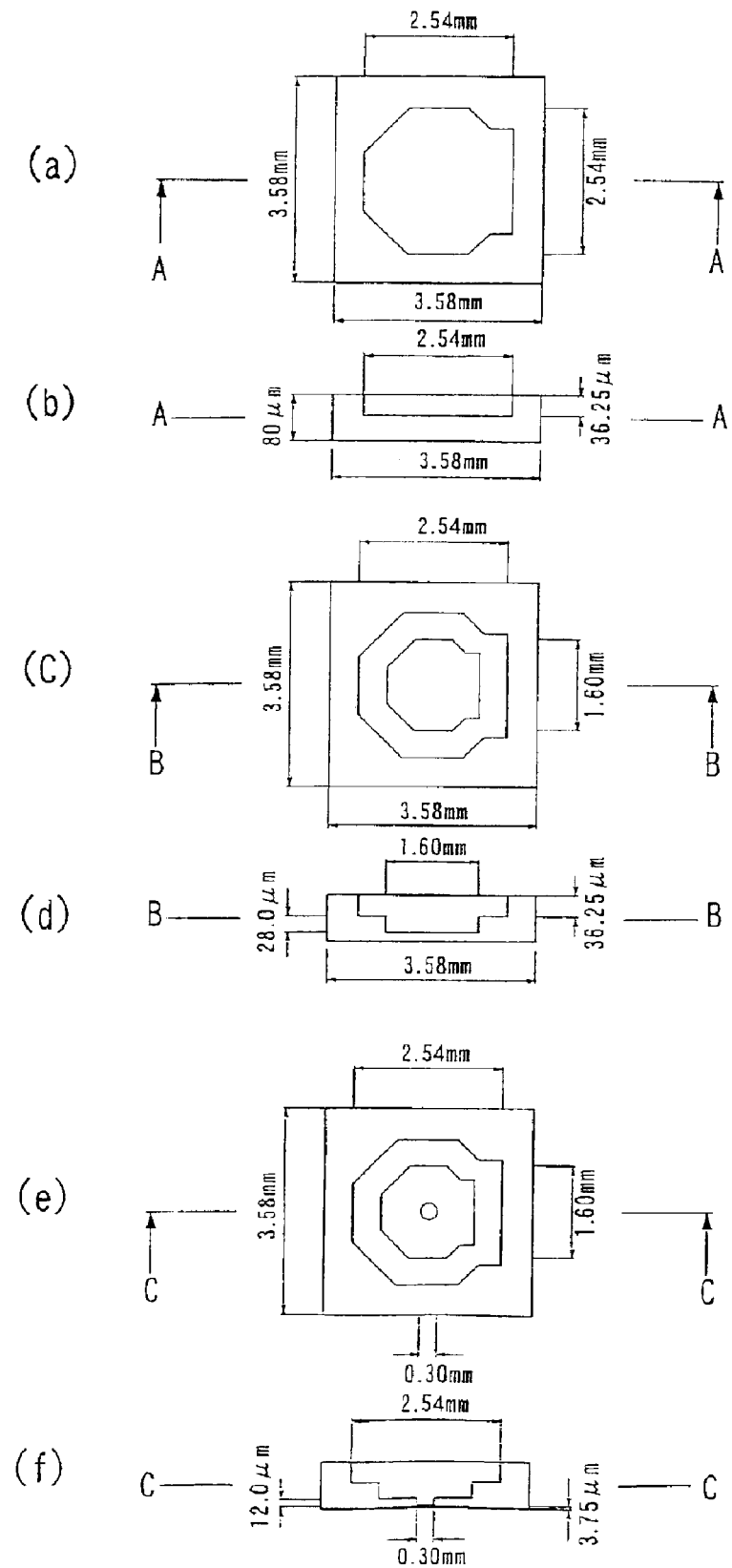

FIGS. 88 and 89 show dimensional manufacturing drawings of quartz oscillators in three steps single-sided grooved type. When these quartz oscillators in three steps single-sided grooved type are compared to those in two steps single-sided grooved type, electric characteristics of the former are found to be better than those of the latter. The reason is due to the three step stereo structure and the efficient energy utilization.

The quartz oscillator in FIG. 88 is nearly an eight-sided polygonal shape at the first oscillation part and circular at the second and third oscillation part, on the other hand, the quartz oscillator in FIG. 89 is nearly an eight-sided polygonal shape at the second oscillation part similar to the first part.

Figure 90:
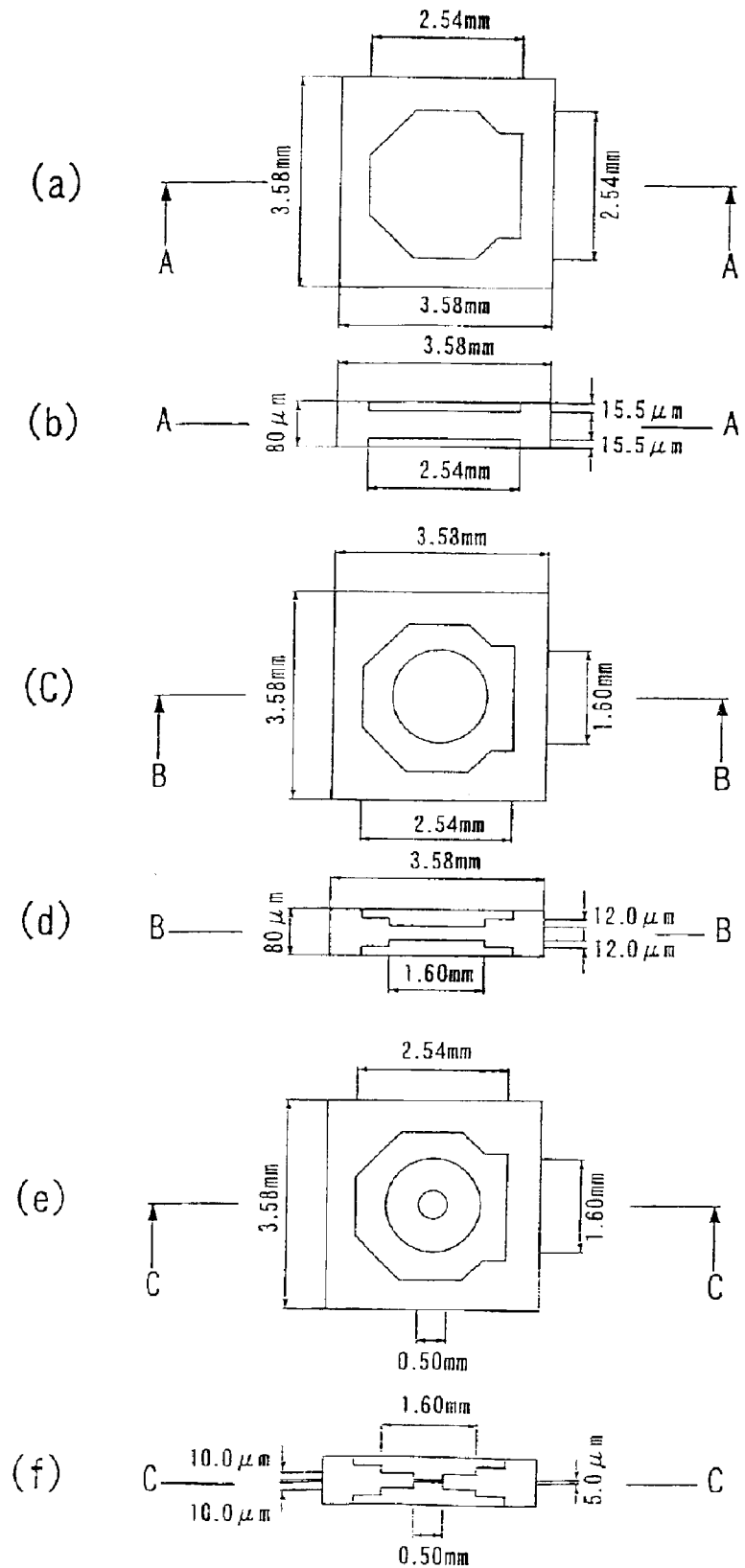
FIGS. 90 and 91 illustrate dimension diagrams of manufactured sample as three steps double-sided grooved type quartz oscillator.
Figure 91:
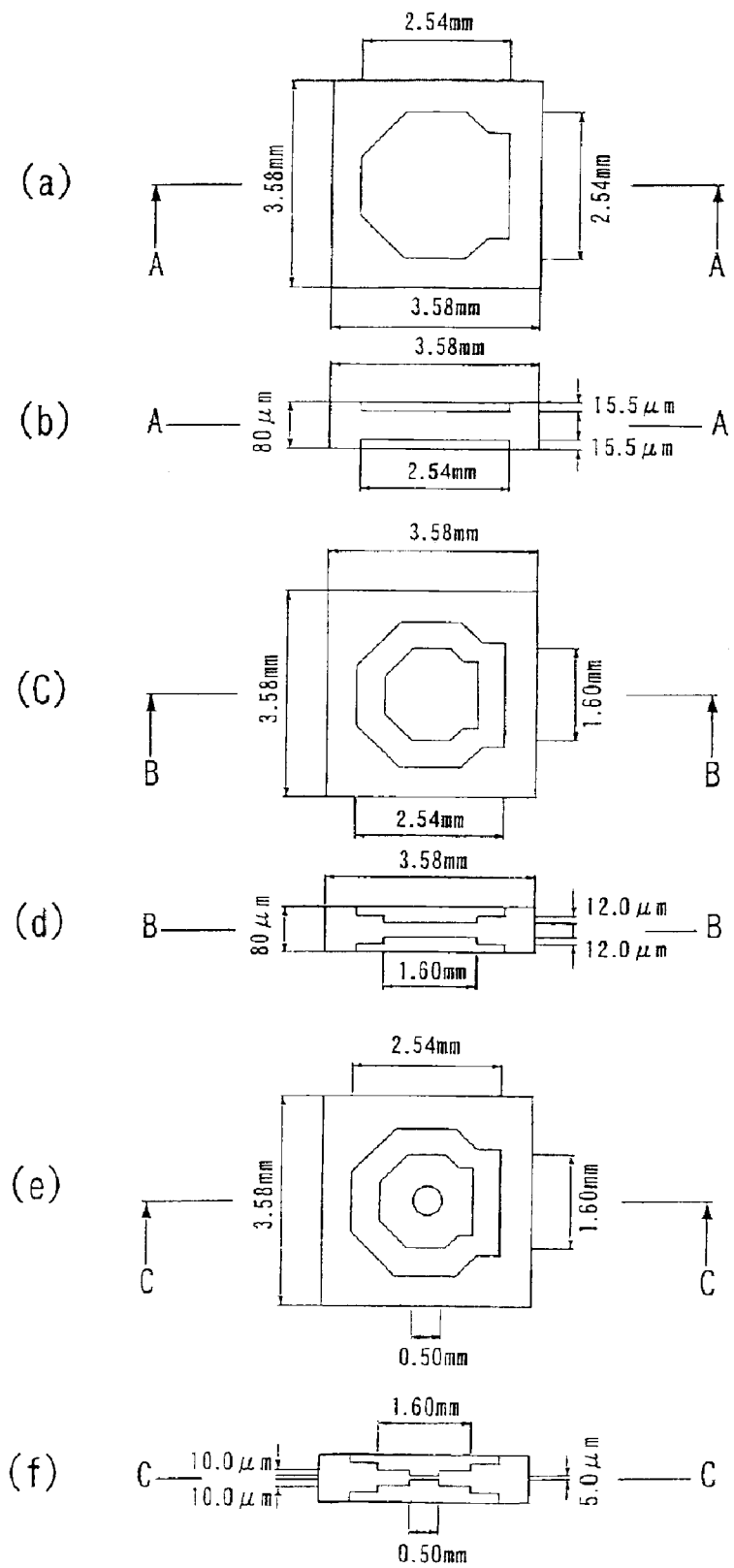

FIGS. 90 and 91 show dimensional manufacturing drawings of quartz oscillators in three steps double-sided grooved type. When these quartz oscillators in three steps double-sided grooved type are compared to those in two steps double-sided grooved type, electric characteristics of the former are found to be much better than those of the latter. The reason is due to the three step stereo structure and the efficient energy utilization.

The quartz oscillator in FIG. 90 is nearly an eight-sided polygonal shape at the first oscillation part and circular at the second and third oscillation part. On the other hand, the quartz oscillator in FIG. 91 is nearly an eight-sided polygonal shape at the second oscillation part similar to the first part.

Figure 92:
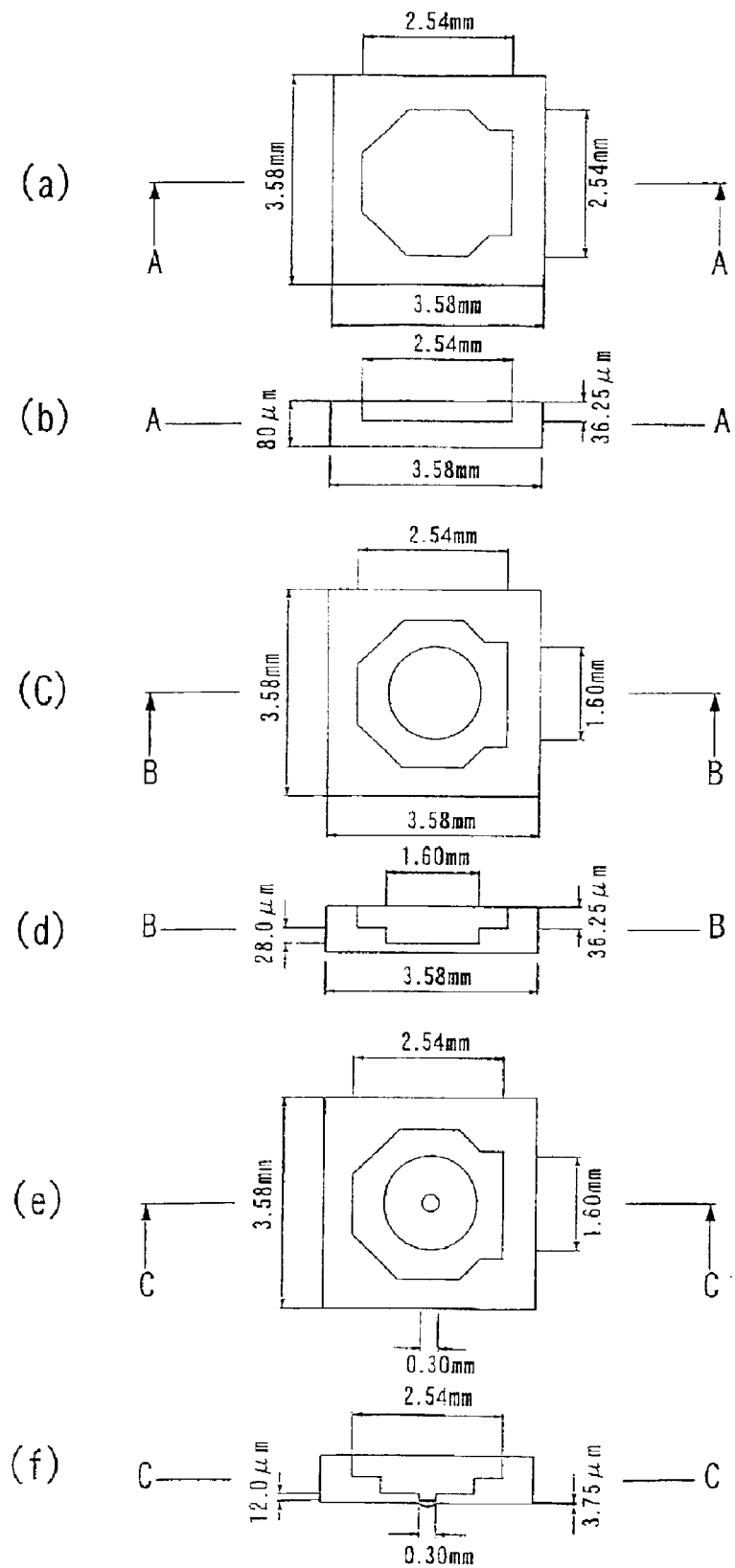
FIG. 92 illustrates a machining sample pressurized from both sides by dual face polishing machine for three steps double-sided grooved type quartz oscillator in FIG. 88(*f*).

FIG. 92 illustrates the mechanical polishing example, where quartz oscillator in the three-stepped single-sided grooved type in FIG. 88(f) is machined by pressurizing from the upper and lower tables of a dual-face polishing machine (polishing table). This polishing process can make three steps single-sided quartz oscillator, whose shape is approximately equal to concavo-convex in FIG. 92(f) rather than single-sided convex.

The reason to become nearly concavo-convex lens shape in FIG. 92(f) is that the quartz oscillator in the parallel plate type has poor electrical resonance with spurious oscillations, since the high frequency quartz resonator becomes extremely thin and the parallel accuracy allowance is very severe. On the other hand, the quartz resonator in convex lens shape shows excellent electrical performance, since the parallel accuracy allowance is not so sever as that of the parallel plate.

Figure 94:
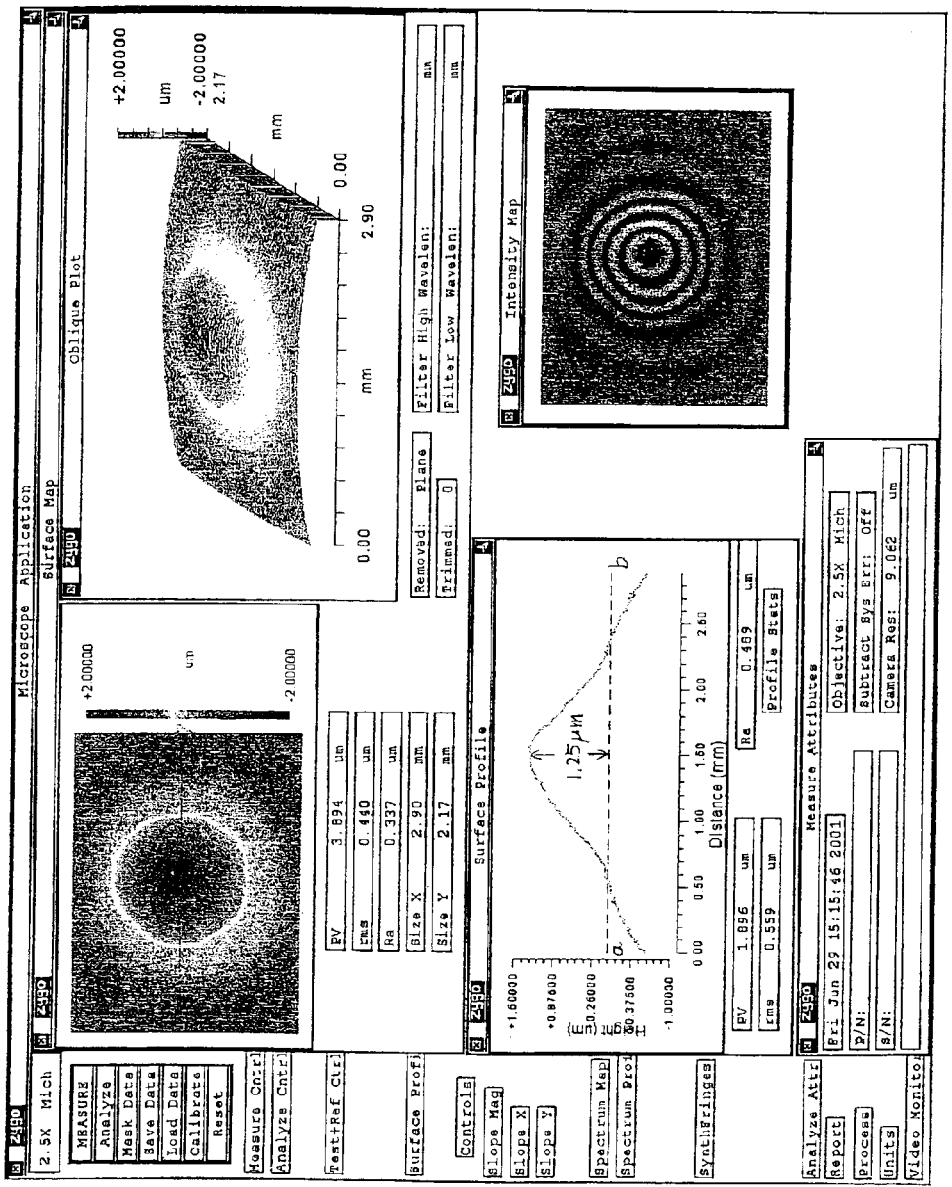
FIGS. 94 and 95 illustrate surface profile measurement diagrams of manufactured sample 2, which is pressurized from both sides by dual face polishing machine (polishing table) for two steps single-sided grooved type quartz oscillator.
Figure 95:
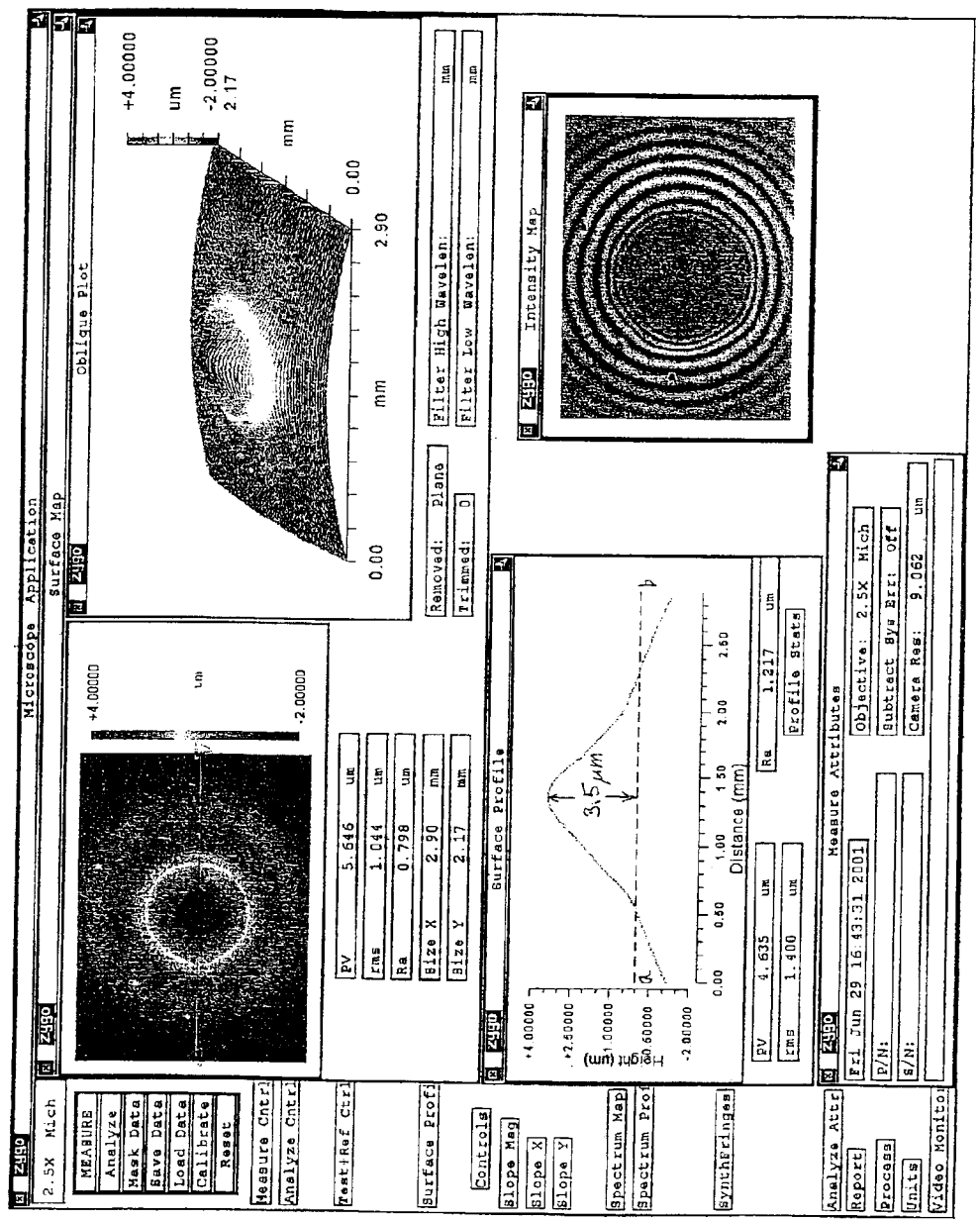

FIGS. 94 and 95 show measured surface shapes of the second quartz oscillator example in two steps single-sided grooved type, which is made by the manufacture diagram in FIG. 59 after pressurizing between upper and lower tables of a dual-face polishing machine (polishing table) as seen in FIGS. 60, 61, and 62.

The single-sided grooved type is seen as the second manufactured examples in FIGS. 59 and 60, the seventh one in FIG. 94 and the eighth in FIG. 95. However the interference stripes (Newton rings) were observed both in the seventh example in FIG. 94 and the eighth one in FIG. 95, which are machined by the polishing table. The difference between the seventh case and eighth case is that the seventh example in FIG. 94 is polished during 30 minutes, and the eighth one in FIG. 95 is polished during 60 minutes. The seventh example becomes concavo-convex in FIG. 63(c), and the shape of the originally planar surface is slightly 1.25 μm convex toward the lower direction. The eighth example also becomes concavo-convex in FIG. 63(c), and the shape of the originally planar surface is measured to be 3.5 μm convex toward the lower direction by the interference microscope.

Therefore, the protruding grade is found to be proportional to the polishing time.

The electrical property of the eighth quartz oscillator example in FIG. 95 is much better than the seventh example in FIG. 94.

Based on these results for the seventh and eighth manufacturing cases, the quartz oscillators in the two-stepped single-sided grooved type are found to become convex lens shape, which is introduced in FIGS. 1, 2, and 6 as the one step inverse mesa type.

The dotted line a–b in FIGS. 94 and 95 is the boundary layer, which divides the first oscillation part and second grooved part (second oscillation part). When the dotted line a–b is the boundary, which divides the first oscillation part and second grooved part (second oscillation part), the second part becomes slightly convex lens shape, the quartz oscillator is measured to become more clearly concavo-convex shape (one side is concave and another side is convex) with larger curvature than that of one step single-sided inverse mesa type in FIGS. 1, 2, and 6. Also two steps single-sided grooved type in FIGS. 94 and 95 becomes larger curvature type (the lower line is widened), and concavo-convex (rather than piano-convex) in more protruding convex lens shape than those of one step inverse mesa type in FIG. 6.

Therefore, three steps or more than three steps single-sided grooved type becomes larger curvature shape (the lower line is widen), and concavo-convex shape in more protruding convex lens type than those of two steps single-sided grooved type.

Figure 93:
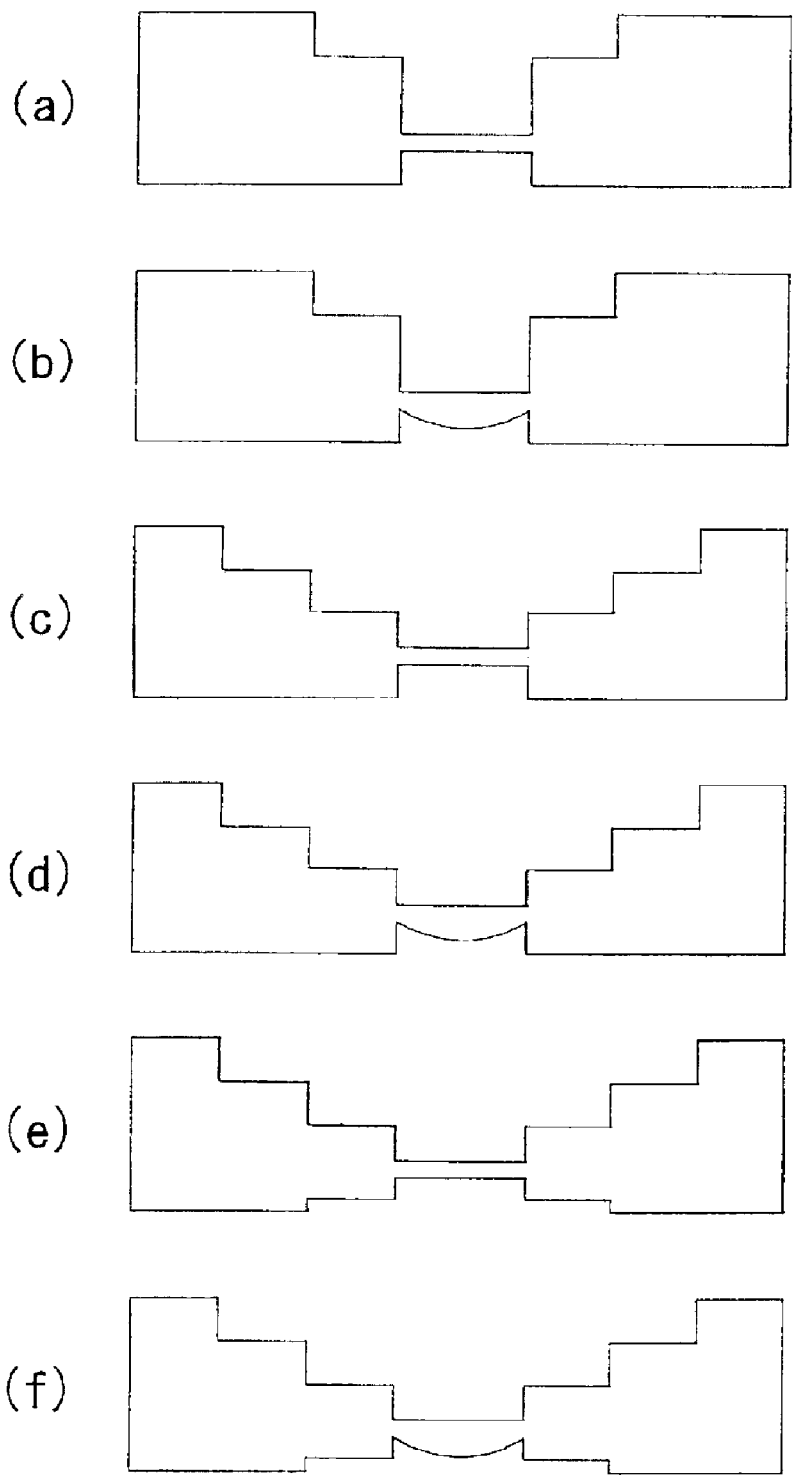
FIG. 93 shows a cross section diagram of another sample with plural steps in this invention.

FIG. 93 illustrated another shape of the above example. FIG. 93(a) and (b) show one case of a double-sided grooved device in which one side has one step and another side has two steps, FIGS. 93(*c*) and (*d*) show the case which one side has one step and another side is three steps, and FIGS. 93(*e*) and (*f*) show another case which one side is two steps and another side is three steps. When the shape in FIGS. 93(*a*), (*c*), and (*e*) are polished by pressurizing between upper and lower tables of a dual-face polishing table (polishing table), the central oscillation part becomes a convex lens shape as shown in FIGS. 93(*b*), (*d*), and (*f*).

Figure 96:
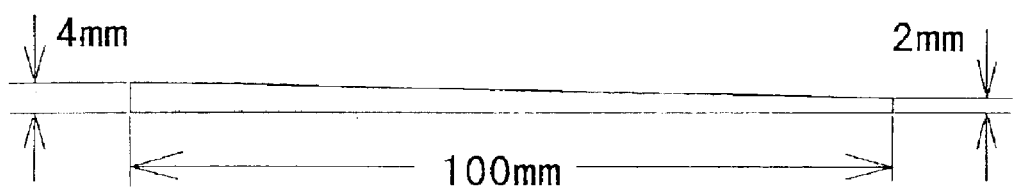
FIG. 96 is a chart to show a parallelism error of parallel plate.
Figure 96:
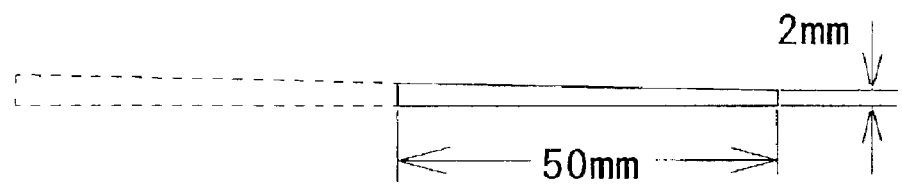
Figure 96:
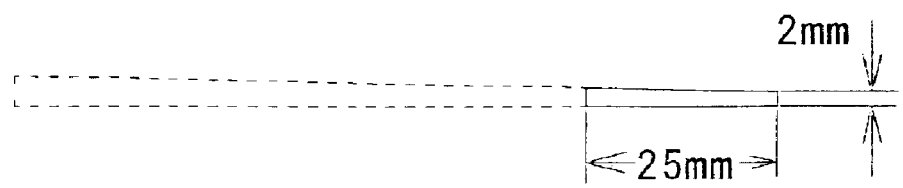

FIG. 96 is a stating diagram of the parallel accuracy for a parallel plate. FIGS. 96(*a*), (*b*), and (*c*) illustrate objects of 100 mm, 50 mm, and 25 mm with the same incline angle. The cross section height of a 100 mm object is 2 mm and 4 mm high. The cross section height of a 50 mm object is 2 mm and approximately 3 mm high. The cross section height of a 25 mm object is 2 mm and approximately 2.3 mm high. Thus, it is found even for the same inclination objects that the error between these heights is smaller as the length is shorter. This phenomena can explain the following.

It must be parallel or in convex lens shape for the quartz oscillator to perform ideal electrical characteristics. The best parallel error is ideally 0, however it is practically impossible to make the plate with zero error of parallelism. Besides, the size of wafer becomes larger in these years, and the thickness becomes thicker as the size becomes bigger. The typical wafer size is 60 mm high, 30 mm wide, and 80 $\mu$m thick at the present. As the size of wafer becomes larger, the parallel error is inversely bigger.

When a quartz blank is chemically etched, the quartz anisotropy generates. As the method for avoiding this anisotropy, this must not be chemically etched more than $\frac{1}{20}$ of the aperture (diameter). For example, if the thickness of the oscillation part is 5 $\mu$m of an 80 $\mu$m thick wafer, and the remaining 75 $\mu$m is chemically etched, the aperture (diameter) should be 1500 $\mu$m=1.5 mm, which is 20 times of 75 $\mu$m.

When the oscillation part of a quartz oscillator is 5 $\mu$m thick, the diameter of the oscillation part is enough to be 80 times of the thickness both for parallel plate and convex lens shape since the aperture (diameter) is sufficient to be 0.4 mm for the 5 $\mu$m thick oscillation part.

When the same parallel plate is used, the parallel error of 1.5 mm diameter is quite different from that of 0.4 mm diameter. In conclusion, the smaller the aperture is, the smaller the parallel error of the oscillation part is relatively, when parallel error of the wafer is same. In order to make a small aperture quartz oscillator, it is necessary to avoid the original quartz anisotropy, and it is found to be the most optimum for two or three steps single-sided grooved or double-sided grooved shape, since the minimum thickness of wafer is 80 $\mu$m.

The resonance characteristics is best in FIGS. 83, 84, 85, and 86, since the oscillation part aperture is designed to be small, and the parallel error of the parallel plate relatively becomes small first of all. The second reason is thought to be that the impressed energy is efficiently utilized in two steps grooved type. The third reason is that the surface accuracy is between 0.002 $\mu$m and 0.004 $\mu$m due to the chemical etching process, when the oscillation aperture is small and the shape is two steps grooved type as shown in FIGS. 56, 61, 66, and 68.

When quartz oscillator in FIG. 56 is measured by a photograph in FIG. 57, the oscillation aperture (diameter) is 0.12 mm, and the surface accuracy is 0.002 $\mu$m. In the case of the quartz oscillator in FIG. 61, the oscillation aperture is measured to be 0.59 mm by the photograph in FIG. 62, and the surface accuracy is 0.003 $\mu$m. In cases of quartz oscillator in FIGS. 68 and 66, the oscillation aperture is measured to be 0.95 mm by the photograph in FIG. 69, and the surface accuracy is 0.004 $\mu$m. The above events demonstrate that the smaller the oscillation aperture is, the higher the surface machining accuracy is.

Effect of Invention (1) When both ends of a cylindrical blank are made at first to be the final target as lens, single-sided convex, single-sided groove, or planar shape, the oscillation part with a predetermined thickness can be shaped in the hollow cylindrical piezoelectric element, by shaving homogeneously to be circular from the cylinder end with a dry etching process.

(2) The following effect will arise, when the planar piezoelectric blank is attached by an auxiliary mold in convex lens or convex lens shape, or when the auxiliary mold shape is pressed to the end of piezoelectric material by dry etching process after the auxiliary mold is pasted to the piezoelectric material with dry etching process. When the press forming makes the optical lens of flat and convex (or concave) shape with the outer ring-support (in frame shape) holder, and the auxiliary mold as the optical lens is attached to the planar piezoelectric material and shaved by the dry etching process, the planar piezoelectric surface is processed to be in the same lens shape with the high surface accuracy as the conventional lens, which is machined by press forming or other mechanical polishing processes. Then we can conveniently manufacture the ultra accurate quartz oscillator (quartz resonator), which is in lens shape at the central part and accompanied by the outer holder in the ring-support shape (frame shape or hollow bamboo cylinder shape).

(3) Furthermore, since the crystal axis of quartz can be easily identical to the machining axis of optical lens, the quartz oscillator becomes electrically excellent.

(4) The final surface accuracy becomes equal to the original surface accuracy at both ends of the cylinder shape. However, the intrinsic electrical characteristics of the piezoelectric element will not restore, if the ion-damaged layer due to the dry etching process is removed.

(5) If the cylinder is machined to be in the hollow cylinder shape by the mechanical process, it is difficult for the deep groove to be machined.

(6) When the piezoelectric material is formed to be in hollow cylinder shape by the dry etching process, the lens shaped oscillator is made at the central part of hollow cylinder, which hole diameter is approximately 10 mm, hole length is from 1.0 cm to 15 cm, and thickness is around 1 mm.

(7) It is actually extremely difficult for the hollow cylinder thickness to be machined only by the mechanical process, however the present invention to use the dry etching can manufacture oscillators in-ultra high performance, since this invention enables the processing to be in lens shape at the central part with the holder of extremely thin bamboo hollow cylinder and ring-support shape (bamboo type hollow cylinder shape) at the outer part.

(8) The thickness of the bamboo type hollow cylinder can be polished to be extremely thin, since the dry etching process is performed at the same time both for outer and inner surfaces of the bamboo type ring-support shape.

(9) If the ion-damaged layer is not considered during the dry etching process (RIE or CIP), the ultra thin lens shape can be manufactured after both ends are shaved in the same accuracy as the original one at the end of the cylinder.

(10) Since we can manufacture oscillators, whose walls are quite thin, hole diameter is small, hole length of bamboo hollow cylinder is long, central pressure sensor part is in the convex or concave lens shape, and it makes high performance to catch an acoustic wave.

(11) When the outer diameter of small oscillator in bamboo type hollow cylinder shape is less than ½ inch, for example, the pressure or the temperature of oil, methane gas, and so on is always measured at the same time, after this is inserted into the pipe under say 5000 m of ground to pump oil, methane etc.

(12) The diameter of a conventional pressure sensor (called quartz sensor) is as large as about ¾ inch, and this cannot always be inserted into the drilling pipe to get oil and methane.

(13) This high performance of the pressure sensor can detect oil and methane gas in extremely deep underground.

If it is two steps single-sided grooved type or double-sided grooved type (abbreviation for grooved type or grooved resonators), after the second oscillation part (second grooved part) in circular, triangular, rectangular, hexagonal, or other shapes to mark the crystal orientation of piezoelectric material is machined inside or at the central part in square or rectangular shape, the inside or the central region of the second oscillation part is again formed so as to be pure circular, quasi-circular, triangular, square, hexagonal, or other shapes. The following effects are observed.

① Since the shape of the rectangular quartz blank is machined to be pure circular, quasi-circular or other shapes, the piezoelectric device achieves more excellent electric performance.

② Since the outer shape of the quartz blank can be in the form of a rectangular shape even if the oscillation part is purely circular or quasi-circular, the quartz wafer can be automatically cut, and then mass production becomes easy.

③ Even when the oscillation part is in accurately circular or quasi-circular shape, the crystal axis direction can be conveniently recognized.

④ When the extremely small oscillation part is manufactured by the chemical etching process, the shape is formed to avoid to be affected by the surface tension and crystal anisotropy due to the chemical etching step by step.

⑤ Since the most ideal frequency of oscillation energy at the first circular vibrating part is dissipated from the outer second oscillation part (second grooved part) toward the outer periphery step by step, the quartz oscillator becomes to show the excellent ideal electrical performance.

⑥ As the oscillation part is made to be very small and the aperture ratio (d/t) is set to around 80 by forming the oscillation part to be stepwise thin, the electrically excellent quartz oscillator can be manufactured, when the primary frequency is more than 400 MHz (less than 4 $\mu$m thick for AT-cut) for the AT-cut case.

⑦ After the quartz oscillator is cut to be rectangular, the pure circular or quasi-circular first oscillation part is made, and another circular second oscillation part (second grooved part) is also made inside or at the central region of the first oscillation part to mark the crystal orientation. By this manufacturing method, after the direction marking slit is cut to find the crystal orientation as shown in FIGS. 32(*a*), 36(*a*), 40(*a*), and 44(*a*). By forming a crescent shape type in FIGS. 33(*a*), 37(*a*), 41(*a*), and 45(*b*), both the first oscillation part and the second one (second grooved part) can be formed to be pure-circular or quasi-circular, and the quartz blank is conveniently cut and massively produced from the quartz wafer to be in the rectangular outer shape.

⑧ If the oscillation part is not made to be in thin at least two steps shape by chemically etching the first oscillation part and the second one (second grooved part), the wafer is thick as 80 $\mu$m. When the frequency of oscillation part is high as 2.1 GHz at AT-cut, the oscillation part is approximately 0.8 $\mu$m, the aperture ratio is found to be around 80 to resonate the best wave. Then the diameter of the oscillation part is extremely small as 0.8 $\mu$m×80=64 $\mu$m, the homogeneous chemical etching becomes impossible due to the surface tension of liquid solution as hydrogen fluoride etc for the chemical etching or crystal anisotropy, if the oscillation parts are not chemically etched to be thin step by step.

⑨ Furthermore, when the aperture diameter is 64 $\mu$m, the chemically etched depth by hydrogen fluoride is at most 3.2 $\mu$m (for instance approximately 1/20 of the diameter). If the chemical etching is deeper than this, the quartz crystal anisotropy appears, and the flat surface accuracy becomes poor. Therefore, the ultra high frequency quartz oscillator must be manufactured by forming at least two steps shape with the chemical etching, since the aperture ratio is found to be about 80 to make electrically high-level quartz oscillator.

⑩ When the diameter of the first oscillation part becomes extremely small as 64 $\mu$m or 0.32 mm, the shape of the second oscillation part becomes triangular, rectangular, or hexagonal except pure-circular or quasi-circular. Since the shape is too small, this can be better to be pure circular or quasi circular, however this can be triangular, rectangular, hexagonal, or other shapes.

⑪ Since the electrode to oscillate only the second oscillation part is attached by photo resist chemical etching process to the front and rear surfaces of the first oscillation part, whose diameter is very small as approximately 0.32 mm and shape is pure-circular or quasi-circular, the second part does not oscillate, and the electrically ideal oscillator (resonator) is made to resonate at more high frequency without the spurious signal.

⑫ When the quartz is relatively and chemically etched by using two or three steps or the plural steps shape, the chemical etching can shave the deep groove, which must be deeper than 1/20 of the oscillation part diameter to avoid the quartz crystal anisotropy.

⑬ After the first chemical etching makes at first the pure circular or quasi circular shape, whose first oscillation part diameter is 0.32 mm and depth is 16 $\mu$m for example, the first and second oscillation parts are chemically and relatively etched step by step in order to make form the rectangular, hexagonal, or other shapes with 1.6 mm diameter at the outer part of circular shape, and the anisotropy problem can be solved.

⑭ As discussed above, since the quartz anisotropy problem is relatively solved by chemical etching process with two steps more deeply than 1/20 of the aperture diameter, it becomes possible for mass production of high frequency quartz oscillator by using over 80 $\mu$m thick and more than 1 inch×1 inch wafer plate.

After the blank is selected to be the quartz crystal unit in the chemically etched single-sided grooved type of more than two steps shape, this is etched by the reactive ion etching (RIE) and polished by dual-face polishing machine, the AT-cut quartz oscillator is successfully developed over 467 MHz fundamental frequency. This quartz oscillator processed by this method is nearly in the concavo-convex or bi-convex shape rather than plano-convex shape as the ideal convex lens type, and this shows the excellent reactance-frequency characteristics.

This machining method demonstrates that the optimum aperture ratio d/t (diameter/thickness) is 80. As the consequence, when the quartz oscillator with very high frequency is required to be manufactured, the aperture diameter d becomes small, since the diameter d is proportional to the thickness t, which is extremely thin. When the diameter becomes small, the quartz oscillator shows the anisotropy problem, the parallel accuracy cannot be maintained due to the chemical etching process, since the quartz wafer is shaved to be deeper than 1/20 of the diameter d. This problem was solved in the following methods. At first, the first chemical etching is done, after the depth of the first oscillation part is selected to be less than 1/20 of the aperture diameter d which is 80 times of the thickness t corresponding to the frequency, and next we chemically etched the second oscillation part (second grooved part), whose diameter is much larger than the first oscillation part (outer region of the first oscillation part) and is not affected by d/t (80:1 or 100:1) problem. Since the first and second oscillation part (grooved part) is chemically and respectively etched with two steps, the quartz anisotropy property is solved.

Also, even if the quartz wafer blank is thick, the aperture d of oscillation part can be very small. Therefore we can mass-produce the ultra high frequency quartz oscillator whose electric characteristic is ideal and extremely thin in the plano-convex shape. This problem was solved in the following way. At first, the first chemical etching is done, after the depth of the first oscillation part is selected to be less than 1/20 of the aperture diameter d which is 80 or 100 times of the thickness t corresponding to the frequency, and secondly we chemically etched the second oscillation part (second grooved part), whose diameter is much larger than the first oscillation part (outer region of the first oscillation part) and is not affected by d/t problem. Since the first and second oscillation part (grooved part) is chemically and respectively etched step by step, the quartz anisotropy property is finally solved. When another method from FIG. 32 to FIG. 38 is used instead of the above process, the second grooved part (second oscillation part) is chemically etched or processed by the dry etching at first, and the central first oscillation part is formed to be purely circular or quasi circular, and then this method is found to be the best way, since the quartz anisotropy problem is not observed as previously explained.

By the way, even if the quartz wafer blank is thick, the aperture d of oscillation part can be very small. Therefore we can mass-produce the electrically ideal ultra high frequency quartz oscillator, which is extremely thin in the plano-convex shape.

As shown on U.S. Pat. No. 3,694,677 on Sep. 26, 1972, Dr. Gunter K. Guttwein, Dr. Arthur D. Ballato, Dr. Theodre J. Lukaszek invented quartz oscillators of one step inverted mesa type (single-sided inverted mesa type and double-sided inverted mesa type) at US Army. This time we manufactured novel quartz oscillators of single-sided grooved type in two steps shape by using the chemical etching process or dry etching, which were found to have the following advantages over the former quartz oscillators in one step shape.

① When the aperture ratio (d/t) is chosen to be optimum, the oscillation area is made to be small as possible. Then the waved shape is prevented and becomes small on the oscillation surface, when the oscillation part is made to be thin as 5 μm. Also the surface accuracy becomes at least ten times better.

② Since the quartz anisotropy is avoided by selecting the aperture ratio to be 80:1 (d/t), the surface accuracy is improved for any quartz blank thickness.

③ The latter new two steps oscillator has the structure of the optimum aperture ratio as 80:1 (d/t) regardless of quartz plate thickness t.

④ Tough resonators against the mechanical shock and acceleration can be made, since the thick plate improves the structural and dynamic strength. Furthermore the step type quartz oscillators of two or more than two steps shape enables us to resist more strong shock.

⑤ Since the former one step quartz oscillator in single-sided inverse mesa type and double-sided inverted mesa type are apt to make pin holes, the one step resonator etched down to 5 μm cannot be mass-produced. The latter two steps one can be mass-produced down to 5 μm.

⑥ While one step inverted mesa type device needs only one chemical etching process, the two steps double-sided grooved type requires two etching processes. However the electrical property becomes improved, and the quartz oscillator device over 70 MHz will become two steps double-sided grooved type in the near future.

⑦ When the single-sided inverted mesa type or doubled sided inverted mesa type in one step shape becomes thinner than 5 μm, the aperture ratio (d/t) must be larger due to the quartz anisotropy, and then there appears the wave shape (like up and down hills) on the oscillation part. Also the surface accuracy on the oscillation part becomes worse than 0.02 μm.

⑧ In case of grooved type in two steps shape, there are few waves, and the surface accuracy is approximately 0.003 μm. And these are ten times better than those of inverted mesa type in one step shape.

⑨ In case of grooved type in two or more steps, since there are the second grooved part (second oscillation part) and third grooved part (third oscillation part), the oscillation energy impressed on the small first central oscillation part (oscillating surface with electric voltage) is efficiently and smoothly used at the second and third outer oscillation part step by step, and the resonator shows the excellent electrical performance.

⑩ In case of the single-sided grooved type in two steps shape, the device can be mass-produced to be thinner than 5 μm. After the oscillation surface of the blank is made to be thinner than 5 μm, the blank is polished by the polishing machine to impress mechanical pressure on the quartz plate both from upper and lower sides in order to confine the energy. As a consequence, ideal quartz oscillators in the concavo-convex or bi-convex lens shape, rather than the conventional piano-convex, are thought to be made to show better electric property approximately as 5.0 GHz fundamental frequency for BT-cut below 0.5 μm. Furthermore, in the near future, it will be possible for the quartz oscillator to be developed as thin as approximately 0.015 μm (primary frequency as 160 GHz for BT-cut).

The accurate name of the single-sided inverted mesa type or double-sided inverted mesa type with two steps in this invention should be called as the single-sided grooved type or double-sided grooved type (abbreviated as grooved type or grooved resonators type). The reasons of these names are as follows.

① Even when the outer shape is pure circular, the central oscillation part can be in purely circular shape, which contributes to better electrical performance.

② The oscillation energy impressed on the small first central oscillation part is efficiently and smoothly used at the second grooved part (second oscillation part) and third outer grooved part (third oscillation part) step by step.

③ The electrode can be made smoothly in step shape.

④ The quartz blank can be made to be thick, while the oscillation part is processed to be very thin.

⑤ Based on the above items, the one step inverted mesa type invented by the US Army is quite different from the grooved type in this invention. Therefore, this is named as the grooved type or grooved resonators type.

The following papers were introduced to show that the aperture ratio (d/t) should be approximately 80 in order to achieve the best electrical performance.

① 1999 IEEE International Frequency Control Symposium, pp. 425–428.
② 21st (1999) Piezoelectric Devices Conference and Exhibition, pp. 4/1–4/6.
③ 2000 IEEE/EIA International Frequency Control Symposium & Exhibition, pp 255–259.

This invention is related to the manufacturing process of a grooved type device in two or more than two steps stereo shape by using the chemical etching, and then this can apply to a wide variety of semi-conducting electronic materials such as silicone, gallium arsenate, and so forth in addition to the piezoelectric material as quartz, lithium niobium, etc.

Industrial Applicability

This invention can be used for a wide variety of fields such as communication equipment, instrumentation, general computer, office automation information technology, home appliance microcomputer, and so forth.

I claim:

1. A quartz oscillator comprising:
   a piezoelectric blank having a first side, a second side, and a concave shaped grooved portion on the first side, said grooved portion being defined by at least two step portions at a central part of the first side,
   said grooved portion having a thickness that decreases in a direction toward the center of said piezoelectric blank such that the thinnest central part of said grooved portion comprises an oscillation part, and
   a convex lens shaped surface formed on the second side of said piezoelectric blank at a position corresponding to said oscillation part.

2. The quartz oscillator according to claim 1, wherein a planar surface is formed on the first side of said piezoelectric blank at a position that is opposite relative to the convex lens shaped surface, which is formed on the second side of said piezoelectric blank.

3. The quartz oscillator according to claim 2, wherein a convex lens shaped surface is formed on the first side of said piezoelectric blank at a position that is opposite the convex lens shaped surface formed on the second side of said piezoelectric blank.

4. A quartz oscillator comprising:
   a concave groove portion formed in a central portion of a first side of a piezoelectric blank, the concave grooved portion being defined by at least three step portions such that the thickness of said piezoelectric blank progressively decreases in a direction toward a center of said piezoelectric blank, wherein the central part of said concave groove portion comprises an oscillation part, and
   a convex lens shaped surface formed on a second side of said piezoelectric blank at a position corresponding to said oscillation part.

5. The quartz oscillator according to claim 4, wherein a planar surface is formed on the first side of said piezoelectric blank at a position that corresponds to said convex lens shaped surface formed on the second side of said piezoelectric blank.

6. The quartz oscillator according to claim 4, wherein a convex lens shaped surface is formed on the first side of said piezoelectric blank at a position that is opposite relative to the convex lens shaped surface formed on the second side of said piezoelectric blank.

* * * * *